(12) United States Patent
Yun et al.

(10) Patent No.: US 10,872,901 B2
(45) Date of Patent: Dec. 22, 2020

(54) INTEGRATED CIRCUIT DEVICE AND METHOD OF MANUFACTURING THE SAME

(71) Applicant: SAMSUNG ELECTRONICS CO., LTD., Suwon-si (KR)

(72) Inventors: Jang-gn Yun, Hwaseong-si (KR); Jae-duk Lee, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 44 days.

(21) Appl. No.: 16/288,449

(22) Filed: Feb. 28, 2019

(65) Prior Publication Data

US 2020/0091176 A1 Mar. 19, 2020

(30) Foreign Application Priority Data

Sep. 14, 2018 (KR) ........................ 10-2018-0110457

(51) Int. Cl.
| | |
|---|---|
| *H01L 29/792* | (2006.01) |
| *H01L 27/11582* | (2017.01) |
| *H01L 29/66* | (2006.01) |
| *H01L 27/11565* | (2017.01) |
| *H01L 21/768* | (2006.01) |
| *H01L 21/02* | (2006.01) |
| *H01L 21/28* | (2006.01) |

(52) U.S. Cl.
CPC .... *H01L 27/11582* (2013.01); *H01L 21/0217* (2013.01); *H01L 21/02164* (2013.01); *H01L 21/7682* (2013.01); *H01L 21/76877* (2013.01); *H01L 27/11565* (2013.01); *H01L 29/40117* (2019.08); *H01L 29/66666* (2013.01); *H01L 29/66833* (2013.01); *H01L 29/7926* (2013.01)

(58) Field of Classification Search
CPC ......... H01L 27/11524; H01L 27/11529; H01L 27/11582; H01L 27/11565; H01L 29/40117; H01L 29/66666; H01L 29/66833; H01L 29/7926; H01L 21/02164; H01L 21/0217; H01L 21/7682; H01L 21/76877

See application file for complete search history.

(56) References Cited

U.S. PATENT DOCUMENTS

| | | | |
|---|---|---|---|
| 8,643,084 B2 | 2/2014 | Shin et al. | |
| 8,928,061 B2 | 1/2015 | Chien et al. | |
| 8,928,063 B2 | 1/2015 | Kim et al. | |
| 8,952,443 B2 | 2/2015 | Chang et al. | |

(Continued)

FOREIGN PATENT DOCUMENTS

| | | |
|---|---|---|
| KR | 10-2013-0072911 A | 7/2013 |
| KR | 10-2014-0134178 A | 11/2014 |

*Primary Examiner* — Calvin Y Choi
(74) *Attorney, Agent, or Firm* — Sughrue Mion, PLLC

(57) ABSTRACT

An integrated circuit device includes word line structures, insulating structures, a channel hole, and charge trap patterns. The word line structures and the insulating structures are interleaved with each other and extend in a horizontal direction parallel to a main surface of a substrate, and overlap one another in a vertical direction. The channel hole passes through the word line structures and the insulating structures in the vertical direction. The charge trap patterns are located in the channel hole, and are spaced apart from one another in the vertical direction with a local insulating region therebetween.

20 Claims, 49 Drawing Sheets

(56) References Cited

U.S. PATENT DOCUMENTS

| | | |
|---|---|---|
| 9,236,396 B1 | 1/2016 | Koka et al. |
| 9,257,573 B2 | 2/2016 | Choi et al. |
| 9,362,303 B2 | 6/2016 | Lee et al. |
| 9,576,975 B2 | 2/2017 | Zhang et al. |
| 9,711,530 B1 | 7/2017 | Ikawa et al. |
| 9,917,096 B2 | 3/2018 | Kamigaichi |
| 2014/0332873 A1 | 11/2014 | Yoo |
| 2016/0155750 A1 | 6/2016 | Yasuda |
| 2016/0260733 A1* | 9/2016 | Lue .................. H01L 29/66742 |
| 2017/0018563 A1 | 1/2017 | Nishida |
| 2017/0098659 A1 | 4/2017 | Yoshimizu et al. |
| 2018/0040627 A1 | 2/2018 | Kanakamedala et al. |

\* cited by examiner

INTEGRATED CIRCUIT DEVICE AND METHOD OF MANUFACTURING THE SAME

CROSS-REFERENCE TO RELATED APPLICATION

This application claims priority from Korean Patent Application No. 10-2018-0110457, filed on Sep. 14, 2018, in the Korean Intellectual Property Office, the disclosure of which is incorporated by reference herein in its entirety.

BACKGROUND

1. Field

Apparatuses, methods, and articles of manufacture consistent with the present disclosure relate to an integrated circuit device and a method of manufacturing the same, and more particularly, to an integrated circuit device including a vertical nonvolatile memory device and a method of manufacturing the integrated circuit device.

2. Description of Related Art

As storage capacities and integration degrees of integrated circuit devices have increased, there have been proposed vertical memory devices in which a plurality of memory cells are vertically stacked on a substrate to increase a memory capacity. When a vertical cell stack density in a vertical memory device increases, an interval between cells that are vertically adjacent to each other may decrease and thus the reliability of an integrated circuit device may be reduced due to cell interference caused by charge diffusion between the adjacent cells.

SUMMARY

It is an aspect to provide an integrated circuit device having a structure that may improve reliability by suppressing cell interference due to charge diffusion between adjacent cells even when an interval between vertically adjacent cells in a highly scaled vertical memory device is relatively small.

It is another aspect to provide a method of manufacturing an integrated circuit device for easily and efficiently forming a structure that may suppress cell interference due to charge diffusion between adjacent cells even when an interval between vertically adjacent cells is relatively small in a highly scaled vertical memory device.

According to an aspect of an embodiment, there is provided an integrated circuit device including a plurality of word line structures, extending in a horizontal direction parallel to a main surface of a substrate, and overlapping one another in a vertical direction perpendicular to the main surface of the substrate; a plurality of insulating structures located between the plurality of word line structures and extending in the horizontal direction; a channel film extending in the vertical direction in a channel hole that passes through the plurality of word line structures and the plurality of insulating structures; and a plurality of charge trap patterns located in the channel hole between the plurality of word line structures and the channel film, and spaced apart from one another in the vertical direction with a local insulating region therebetween.

According to another aspect of an embodiment, there is provided an integrated circuit device including a channel film extending in a vertical direction perpendicular to a main surface of a substrate; a plurality of word line structures located around the channel film, extending in a horizontal direction parallel to the main surface of the substrate, and overlapping one another in the vertical direction; a plurality of insulating structures located around the channel film, the plurality of insulating structures being between the plurality of word line structures; a plurality of charge trap patterns nonlinearly extending in the vertical direction between the channel film and the plurality of word line structures, spaced apart from one another in the vertical direction with a local insulating region therebetween; and a plurality of blocking dielectric patterns located between the plurality of word line structures and the plurality of charge trap patterns, and spaced apart from one another in the vertical direction with the local insulating region therebetween.

According to another aspect of an embodiment, there is provided an integrated circuit device including a channel film extending in a vertical direction perpendicular to a main surface of a substrate; a plurality of word line structures located around the channel film, extending in a horizontal direction parallel to the main surface of the substrate, and overlapping one another in the vertical direction; a plurality of insulating structures located around the channel film and each comprising an air-gap located between the plurality of word line structures; a plurality of charge trap patterns located between the plurality of word line structures and the channel film and spaced apart from one another in the vertical direction with the air-gap therebetween; and a plurality of blocking dielectric patterns located between the plurality of word line structures and the plurality of charge trap patterns, and spaced apart from one another in the vertical direction with the air-gap therebetween, wherein the channel film comprises a plurality of first curved portions facing the air-gap.

According to another aspect of an embodiment, there is provided a method including forming, on a substrate, a structure in which a plurality of first films and a plurality of second films are alternately stacked one by one; forming a plurality of channel holes passing through the structure; forming a charge trap film in the plurality of channel holes; forming, on the charge trap film in the plurality of channel holes, a channel film comprising a plurality of curved portions facing the plurality of first films; forming a word line cut region passing through the structure to linearly extend in a direction parallel to a main surface of the substrate; forming a plurality of first spaces by removing at least portions of the plurality of first films exposed through the word line cut region; and dividing the charge trap film into a plurality of charge trap patterns by etching the charge trap film through the plurality of first spaces.

According to another aspect of an embodiment, there is provided an integrated circuit device comprising a plurality of word line structures and a plurality of insulating structures interleaved with each other and extending in a horizontal direction parallel to a main surface of a substrate, and overlapping one another in a vertical direction; a channel hole that passes through the plurality of word line structures and the plurality of insulating structures in the vertical direction; and a plurality of charge trap patterns located in the channel hole, and spaced apart from one another in the vertical direction with a local insulating region therebetween.

BRIEF DESCRIPTION OF THE DRAWINGS

Embodiments will be more clearly understood from the following detailed description taken in conjunction with the accompanying drawings in which.

DETAILED DESCRIPTION

Figure 1:
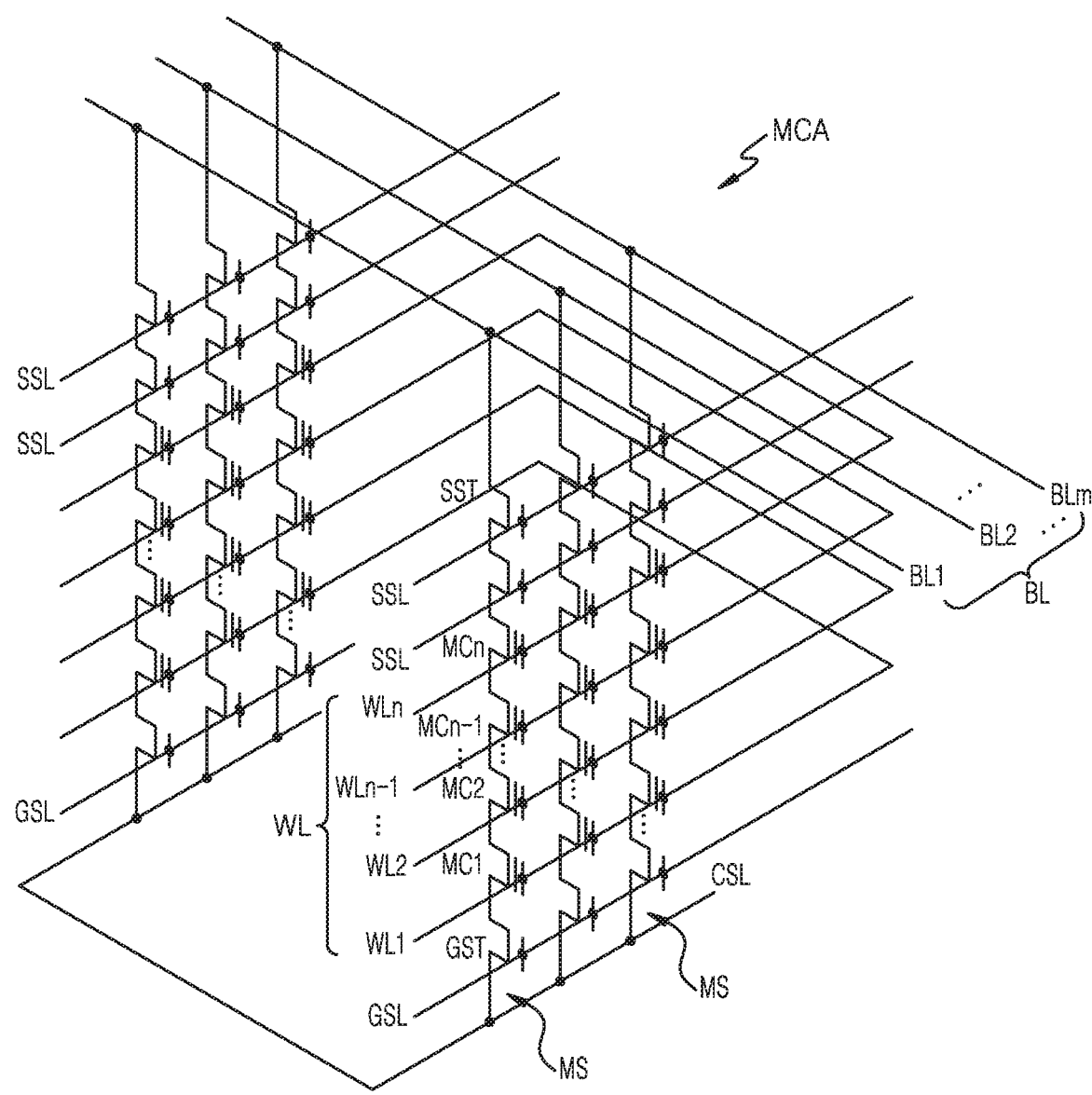
FIG. 1 is an equivalent circuit diagram of a memory cell array of an integrated circuit device according to embodiments.

The inventive concept will now be described more fully with reference to the accompanying drawings, in which embodiments are shown. In the drawings, the same elements are denoted by the same reference numerals, and a repeated explanation thereof will not be given.

FIG. 1 is an equivalent circuit diagram of a memory cell array MCA of an integrated circuit device according to embodiments. FIG. 1 shows an equivalent circuit diagram of a vertical NAND flash memory device having a vertical channel structure.

Referring to FIG. 1, the memory cell array MCA may include a plurality of memory cell strings MS. The memory cell array MCA may include a plurality of bit lines BL including BL1, BL2, ..., and BLm, a plurality of word lines WL including WL1, WL2, ..., WLn−1, and WLn, at least one string selection line SSL, at least one ground selection line GSL, and a common source line CSL. The plurality of memory cell strings MS may be formed between the plurality of bit lines BL including BL1, BL2, ..., and BLm and the common source line CSL.

Each of the plurality of memory cell strings MS may include a string selection transistor SST, a ground selection transistor GST, and a plurality of memory cell transistors MC1, MC2, ..., MCn−1, and MCn. A drain region of the string selection transistor SST may be connected to each of the bit lines BL including BL1, BL2, ..., and BLm, and a source region of the ground selection transistor GST may be connected to the common source line CSL. Source regions of the plurality of ground selection transistors GST are commonly connected to the common source line CSL.

The string selection transistor SST may be connected to the string selection line SSL, and the ground selection transistor GST may be connected to the ground selection line GSL. The plurality of memory cell transistors MC1, MC2, ..., MCn−1, and MCn may be respectively connected to the plurality of word lines WL including WL1, WL2, ..., WLn−1, and WLn.

Figure 2:
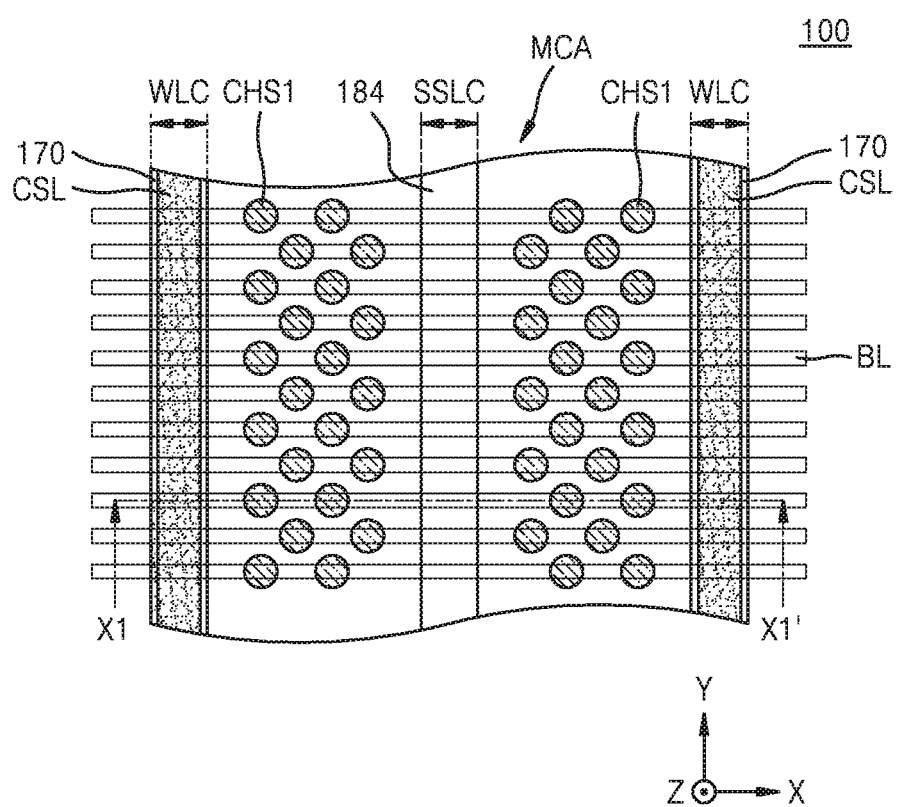
FIG. 2 is a plan view illustrating main elements of an integrated circuit device according to embodiments.
Figure 3:
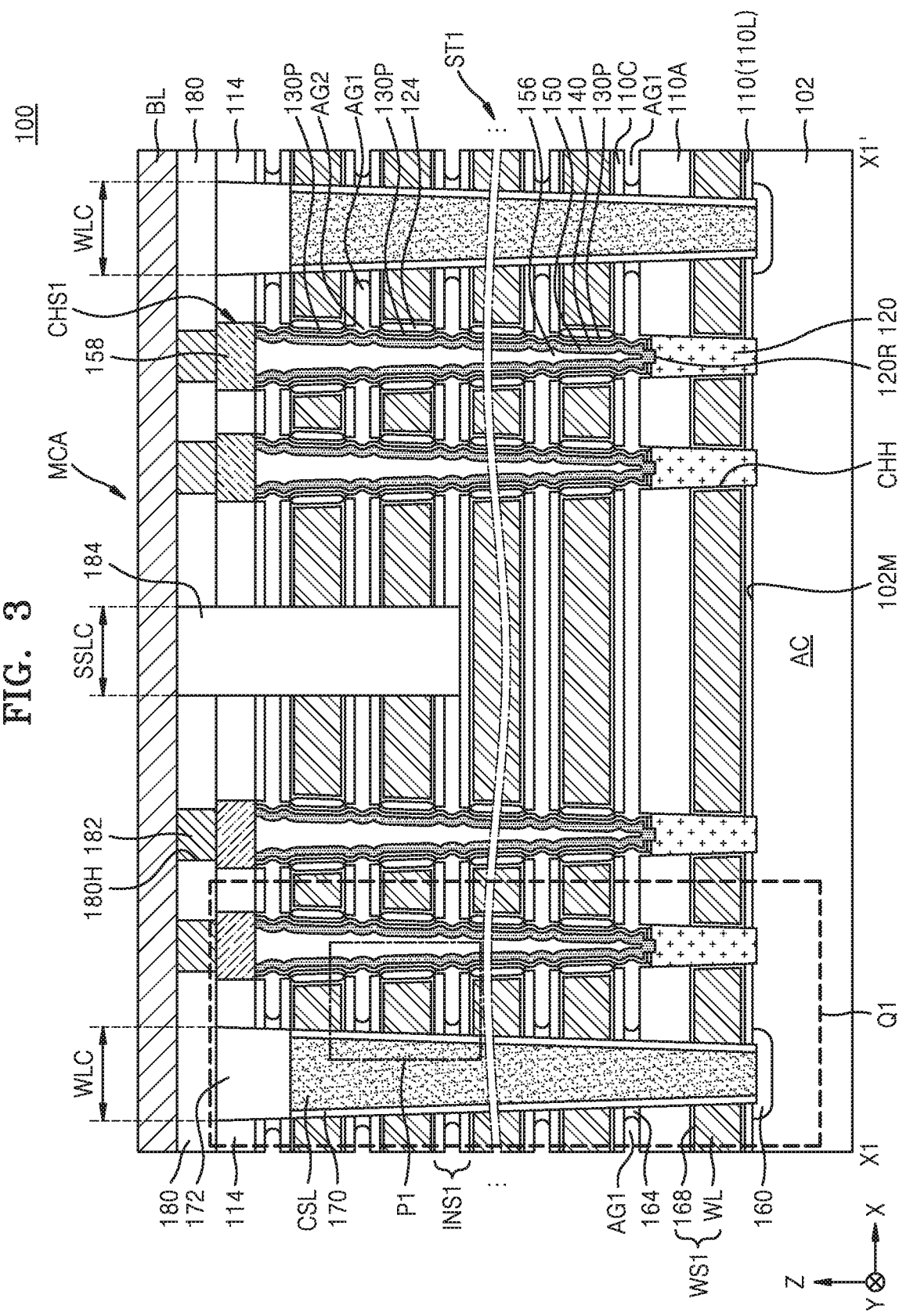
FIG. 3 is a cross-sectional view taken along line X1-X1' of FIG. 2.

FIG. 2 is a plan view illustrating elements of an integrated circuit device according to embodiments. FIG. 3 is an enlarged cross-sectional view taken along line X1-X1' of FIG. 2.

Referring to FIGS. 2 and 3, an integrated circuit device 100 includes a substrate 102 having an active region AC. The memory cell array MCA may be formed on the active region AC of the substrate 102. The memory cell array MCA may have a circuit configuration as described with reference to FIG. 1.

The substrate 102 may have a main surface 102M extending in an X-direction and a Y-direction. In some embodiments, the substrate 102 may include silicon (Si), germanium (Ge), or SiGe. In other embodiments, the substrate 102 may be a silicon-on-insulator (SOI) substrate or a germanium-on-insulator (GeOI) substrate.

Referring to FIGS. 1 through 3, the plurality of memory cell transistors MC1, MC2, ..., MCn−1, and MCn constituting the memory cell string MS in the memory cell array MCA may be connected in series in a vertical direction (e.g., a Z-direction) perpendicular to the main surface 102M of the substrate 102. A plurality of channel structures CHS1 needed to constitute the string selection transistor SST, the ground selection transistor GST, and the plurality of memory cell transistors MC1, MC2, ..., MCn−1, and MCn may extend in the vertical direction (e.g., the Z-direction) perpendicular to the main surface 102M of the substrate 102. The plurality of channel structures CHS1 may be spaced apart from one another with a predetermined interval therebetween in the X-direction and the Y-direction.

Each of the plurality of channel structures CHS1 may include a semiconductor pattern 120 contacting the substrate 102 and partially filling a channel hole CHH, a channel film 150 contacting the semiconductor pattern 120 and extending in the vertical direction (e.g., the Z-direction) in the channel hole CHH, a buried insulating film 156 filling an inner space of the channel film 150, and a drain region 158 contacting the channel film 150 and filling an upper entrance portion of the channel hole CHH. In some embodiments, the channel film 150 may have a cylindrical shape having the inner space, and the inner space of the channel film 150 may be filled with the buried insulating film 156. The channel film 150 may be formed of polysilicon doped with impurities or polysilicon not doped with impurities. The buried insulating film 156 may be formed of silicon oxide, silicon nitride, silicon oxynitride, or a combination thereof. The buried insulating film 156 may be omitted in some embodiments, and in this case, the channel film 150 may have a pillar structure having no inner space. The drain region 158 may be formed of a polysilicon film doped with impurities. The plurality of drain regions 158 included in the plurality of channel structures CHS1 may be insulated from one another by an insulating pattern 114. The insulating pattern 114 may be formed of an oxide film, a nitride film, or a combination thereof.

A plurality of word line structures WS1 may extend along an X-Y plane in a horizontal direction parallel to the main surface 102M of the substrate 102, and may be spaced apart from one another in the vertical direction (e.g., the Z-direction) perpendicular to the main surface 102M of the substrate 102 to overlap one another.

Widths of the plurality of word line structures WS1 in a first horizontal direction (e.g., the X-direction) may be defined by a plurality of word line cut regions WLC. The plurality of word line structures WS1 may be repeatedly located to be spaced apart from one another with a predetermined interval by the plurality of word line cut regions WLC.

A plurality of common source regions 160 may extend in a second horizontal direction (e.g., the Y-direction) on the substrate 102. In some embodiments, the plurality of common source regions 160 may be impurity regions heavily doped with n-type impurities. The plurality of common source regions 160 may function as source regions that supply current to vertical memory cells.

A part of each of the plurality of word line cut regions WLC may be filled with the common source line CSL. The common source lines CSL may extend in the second horizontal direction (e.g., the Y-direction) on the plurality of common source regions 160. An insulating spacer 170 covering a side wall of the common source line CSL may be formed in the word line cut region WLC. The insulating spacer 170 may electrically insulate the common source line CSL from the plurality of word lines WL including WL1, WL2, . . . , WLn−1, and WLn. The common source line CSL and the insulating spacer 170 may be covered by a capping insulating film 172. The common source line CSL may be formed of a metal such as tungsten, copper, or aluminum, a conductive metal nitride such as titanium nitride or tantalum nitride, a transition metal such as titanium or tantalum, or a combination thereof. Each of the insulating spacer 170 and the capping insulating film 172 may be formed of a silicon oxide film, a silicon nitride film, a silicon oxynitride film, or a combination thereof. In some embodiments, a metal silicide film (not shown) for reducing contact resistance may be located between the common source region 160 and the common source line CSL. For example, the metal silicide film may be formed of cobalt silicide, tungsten silicide, or nickel silicide.

The plurality of word line structures WS1 between two adjacent word line cut regions WLC may include the ground selection line GSL, the plurality of word lines WL including WL1, WL2, . . . , WLn−1, and WLn, and the string selection line SSL as described with reference to FIG. 1. The number of the plurality of word line structures WS1 stacked on the substrate 102 in the Z-direction may be selected in various ways and the number of the plurality of word line structures WS1 is not particularly limited. The word line structure WS1 closest to the substrate 102 from among the plurality of word line structures WS1 may constitute the ground selection line GSL. Two word line structures WS1 that are uppermost word line structures from among the plurality of word line structures WS1 may constitute the string selection line SSL. The string selection line SSL may include portions separated from each other by a string selection line cut region SSLC. The string selection line cut region SSLC may be filled with an insulating film 184. The insulating film 184 may be formed of an oxide film, a nitride film, an air-gap, or a combination thereof. The term "air-gap" used herein denotes a space including air or other gases that may exist during a manufacturing process.

Each of the plurality of word line structures WS1 may include the word line WL extending in the horizontal direction parallel to the main surface of the substrate 102 and a dielectric thin film 168 covering a surface of the word line WL. The dielectric thin film 168 may cover a bottom surface and a top surface of the word line WL and a side wall of the word line WL facing the channel film 150.

The word line WL may include a metal such as tungsten, nickel, cobalt, or tantalum, a metal silicide such as tungsten silicide, nickel silicide, cobalt silicide, or tantalum silicide, polysilicon doped with impurities, or a combination thereof. The dielectric thin film 168 may be formed of a high-k dielectric film having a dielectric constant higher than that of silicon oxide. The high k-dielectric film may be formed of a metal oxide such as hafnium oxide, aluminum oxide, zirconium oxide, or tantalum oxide.

An insulating structure INS1 may be located between the plurality of word line structures WS1 and may extend in the horizontal direction parallel to the main surface of the substrate 102. The insulating structure INS1 may include a first air-gap portion AG1, a first insulating film 110A and a third insulating film 110C for defining a height of the first air-gap portion AG1, and an insulating plug 164. Each of the first insulating film 110A and the third insulating film 110C may contact the word line structure WS1. The insulating plug 164 may be located between the first air-gap portion AG1 and the word line cut region WLC, and may define a width of a portion of the word line cut region WLC in the horizontal direction (e.g., the X-direction). Each of the first insulating film 110A, the third insulating film 110C, and the insulating plug 164 may be formed of a silicon oxide film.

The plurality of word line structures WS1 and the plurality of insulating structures INS1 may constitute a stack structure ST1.

Figure 4:
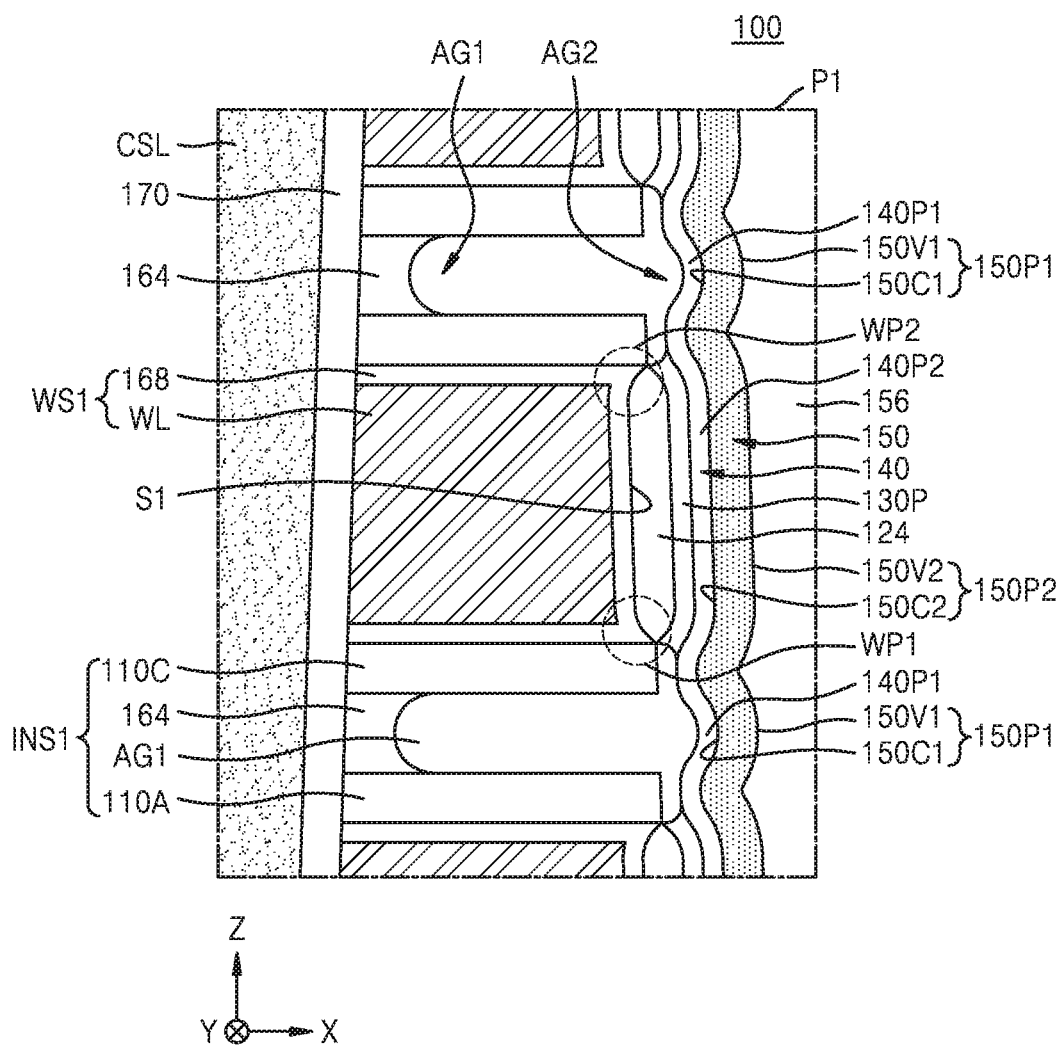
FIG. 4 is an enlarged cross-sectional view illustrating a portion P1 indicated by a dashed line in FIG. 3.

FIG. 4 is an enlarged cross-sectional view illustrating a portion P1 indicated by a dashed line in FIG. 3.

Referring to FIGS. 3 and 4, each of the plurality of word line structures WS1 may include a bottom protrusion WP1 and a top protrusion WP2 locally protruding toward the channel film 150. Each of the plurality of word line structures WS1 may include a nonlinear side wall S1 nonlinearly extending between the bottom protrusion WP1 and the top protrusion WP2 and facing the channel film 150.

A plurality of blocking dielectric patterns 124, a plurality of charge trap patterns 130P, and a tunneling dielectric film 140 may be located between the plurality of word line structures WS1 and the channel film 150 in the channel hole CHH.

The plurality of blocking dielectric patterns 124 are located between the word line structures WS1 and the plurality of charge trap patterns 130P. A width of each of the plurality of blocking dielectric patterns 124 in the horizontal direction (e.g., the X-direction) at both end portions in the vertical direction (e.g., the Z-direction) may be less than a width in the horizontal direction (e.g., the X-direction) at a central portion of each of the plurality of blocking dielectric patterns 124, as shown in FIG. 4. In other words, the blocking dielectric pattern 124 is tapered at both the top and bottom ends as shown in FIG. 4. Each of the plurality of blocking dielectric patterns 124 may contact a nonlinear side wall S1 of the channel film 150, and may have a nonlinear surface conforming to the contour of the nonlinear side wall S1 of the channel film 150. The bottom protrusion WP1 and the top protrusion WP2 of each of the plurality of word line structures WS1 may contact the both end portions of each of the plurality of blocking dielectric patterns 124 in the vertical direction (e.g., the Z-direction). The dielectric thin film 168 of the word line structure WS1 may be located between the blocking dielectric pattern 124 and the word line WL. Each of the plurality of blocking dielectric patterns 124 may be formed of a silicon oxide film or a silicon oxynitride film.

Each of the plurality of charge trap patterns 130P may be located between the blocking dielectric pattern 124 and the tunneling dielectric film 140 in the channel hole CHH. Two adjacent charge trap patterns 130P of the plurality of charge trap patterns 130P may be spaced apart from each other in the vertical direction (e.g., the Z-direction) with a local insulating region including a second air-gap portion AG2 therebetween. The second air-gap portion AG2 may be located in the channel hole CHH, and may communicate with the first air-gap portion AG1 that is a part of the insulating structure INS1. Each of the plurality of charge trap patterns 130P may contact a nonlinear side wall of the blocking dielectric pattern 124 and may contact the both end portions of the blocking dielectric pattern 124 in the vertical direction (e.g., the Z-direction), and thus the plurality of charge trap patterns 130P may nonlinearly extend in the vertical direction (e.g., the Z-direction). Each of the plurality of charge trap patterns 130P may be formed of a silicon nitride film.

The tunneling dielectric film 140 may extend in the vertical direction (e.g., the Z-direction) along an outer circumferential surface of the channel film 150 in the channel hole CHH. The tunneling dielectric film 140 may be formed of a silicon oxide film.

The tunneling dielectric film 140 and the channel film 150 may nonlinearly extend in the vertical direction (e.g., the Z-direction). Portions of the tunneling dielectric film 140 and the channel film 150 facing the plurality of insulating structures INS1 may convexly protrude away from the plurality of insulating structures INS1. The channel film 150 may include a plurality of first curved portions 150P1 facing the plurality of insulating structures INS1. Each of the plurality of first curved portions 150P1 may include a first concave outer circumferential portion 150C1 facing the first air-gap portion AG1 and a first convex inner circumferential portion 150V1 protruding toward the center of the channel hole CHH. Like the channel film 150, the tunneling dielectric film 140 may include a plurality of first curved portions 140P1 facing the plurality of insulating structures INS1. Each of the first curved portions 140P1 facing the insulating structures INS1 may include a concave outer circumferential portion exposed to the second air-gap portion AG2 and a convex inner circumferential portion contacting the first curved portion 150P1 of the channel film 150.

Also, portions of each of the plurality of charge trap patterns 130P, the tunneling dielectric film 140, and the channel film 150 facing the plurality of word line structures WS1 may convexly protrude away from the plurality of word line structures WS1. The channel film 150 may include a plurality of second curved portions 150P2 facing the plurality of word line structures WS1 with the plurality of charge trap patterns 130P and the tunneling dielectric film 140 therebetween. Each of the plurality of second curved portions 150P2 may include a second concave outer circumferential portion 150C2 facing the word line structure WS1 and a second convex inner circumferential portion 150V2 protruding toward the center of the channel hole CHH. In the vertical direction (e.g., the Z-direction), a first length of the first curved portion 150P1 of the channel film 150 may be less than a second length of the second curved portion 150P2 of the channel film 150. Like the channel film 150, the tunneling dielectric film 140 may include a plurality of second curved portions 140P2 facing the word line structures WS1. Each of the second curved portions 140P2 of the insulating structure INS1 may include a concave outer circumferential portion contacting the charge trap pattern 130P and a convex inner circumferential portion contacting the second curved portion 150P2 of the channel film 150.

In the memory cell array MCA, the plurality of bit lines BL may extend on the plurality of channel structures CHS1 in the first horizontal direction (e.g., the X-direction) as shown in FIG. 3. A plurality of bit line contact pads 182 may be located between the plurality of channel structures CHS1 and the plurality of bit lines BL. The drain region 158 of each of the plurality of channel structures CHS1 may be connected to one corresponding bit line BL of the plurality of bit lines BL through the bit line contact pads 182. The plurality of bit line contact pads 182 may be insulated from one another by an insulating film 180. The insulating film 180 may be formed of an oxide film, a nitride film, or a combination thereof.

Since the plurality of charge trap patterns 130P of the integrated circuit device 100 are located in the channel hole CHH as shown in FIGS. 2 through 4, when compared to a case where the plurality of charge trap patterns 130P are located outside the channel hole CHH, the integrated circuit device 100 may be easily highly scaled in the horizontal direction (e.g., the X-direction) and the vertical direction (e.g., the Z-direction). Also, two adjacent charge trap patterns 130P of the plurality of charge trap patterns 130P are spaced apart from each other in the vertical direction (e.g., the Z-direction) in one channel hole CHH with the local insulating region including the second air-gap portion AG2 therebetween. Accordingly, there may be provided a structure for improving reliability by suppressing cell interference due to charge diffusion between adjacent cells even when an interval between vertically adjacent cells is relatively small in a vertical memory device.

Figure 5:
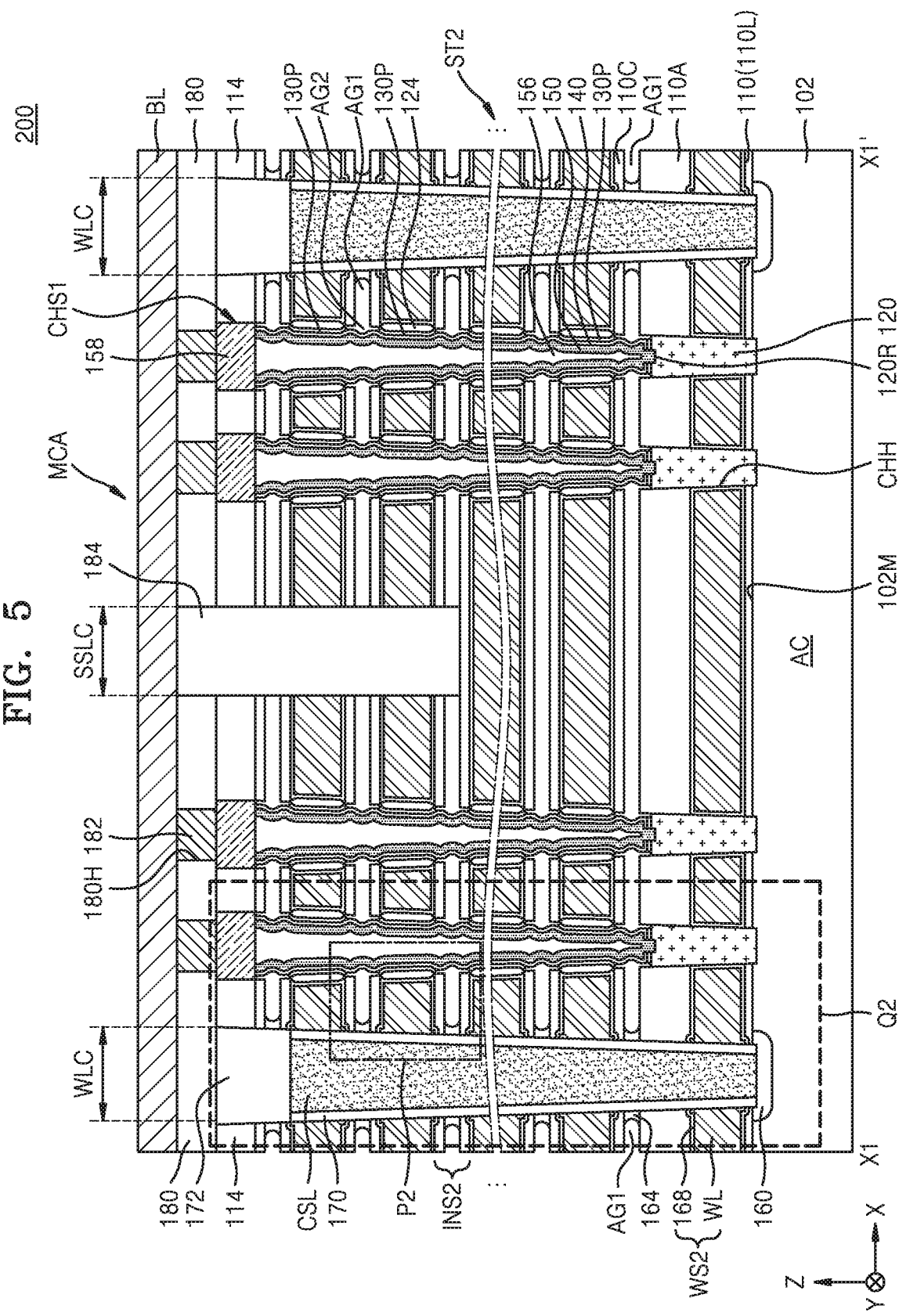
FIG. 5 is a cross-sectional view of an integrated circuit device according to other embodiments.
Figure 6:
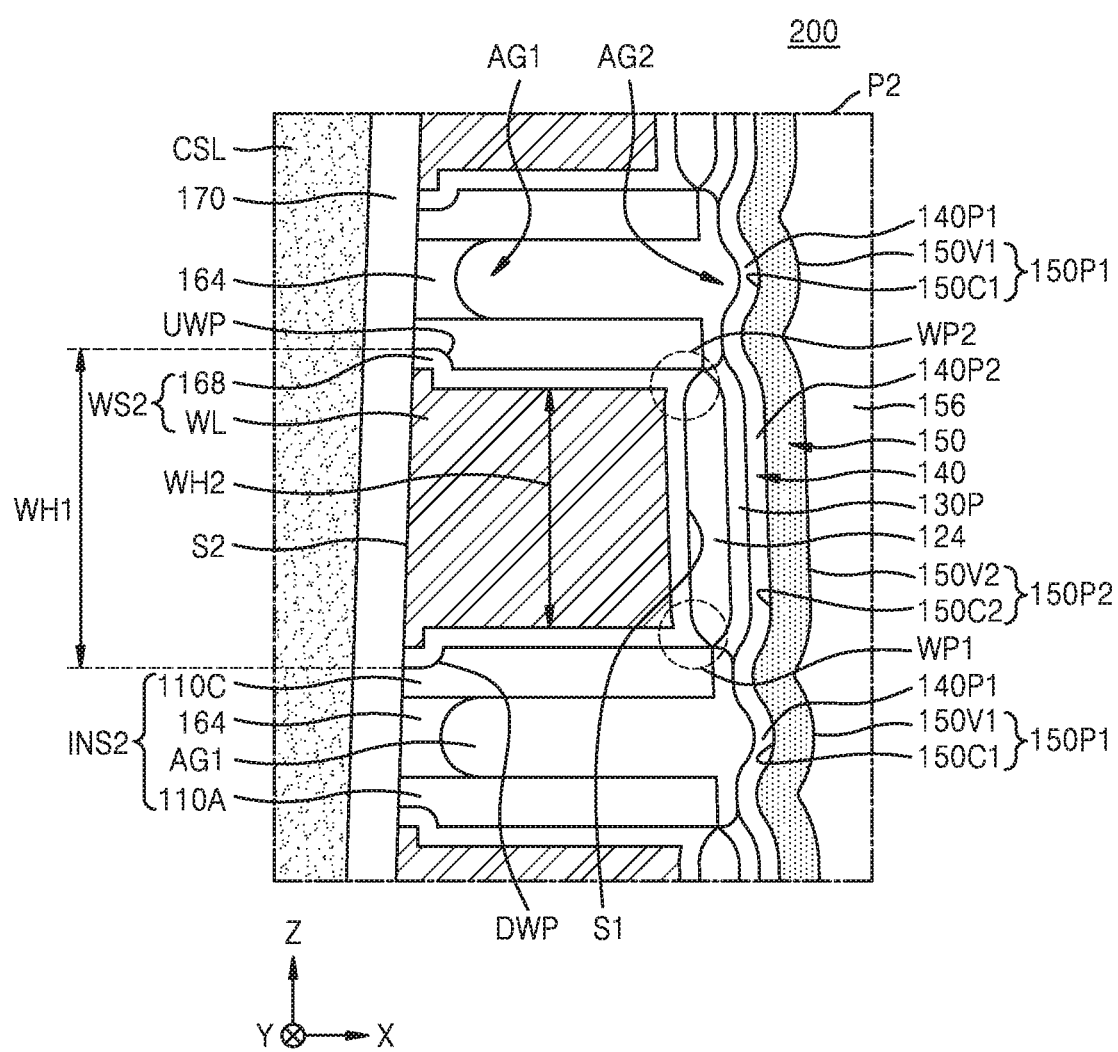
FIG. 6 is an enlarged cross-sectional view illustrating a portion P2 indicated by a dashed line in FIG. 5.

FIG. 5 is a cross-sectional view of an integrated circuit device according to other embodiments. FIG. 6 is an enlarged cross-sectional view illustrating a portion P2 indicated by a dashed line in FIG. 5. FIG. 5 illustrates elements, taken along line X1-X1' of FIG. 2.

Referring to FIGS. 5 and 6, an integrated circuit device 200 has substantially the same structure as that of the integrated circuit device 100 of FIGS. 1 through 4. However, the integrated circuit device 200 includes a plurality of word line structures WS2, instead of the plurality of word line structures WS1. Each of the plurality of word line structures WS2 has a bottom surface having a downward protrusion DWP protruding toward the substrate 102 from an end portion facing the common source line CSL and a top surface having an upward protrusion UWP protruding away from the substrate 102. Accordingly, in each of the plurality of word line structures WS2, a height WH1 of a side wall S2 facing the word line cut region WLC may be greater than a height WH2 of the side wall S1 facing the channel film 150.

An insulating structure INS2 including the first air-gap portion AG1, the first insulating film 110A and the third insulating film 110C for defining a height of the first air-gap portion AG1, and the insulating plug 164 may be located between the plurality of word line structures WLS2. The first insulating film 110A may contact the top surface of the word line structure WS2 having the upward protrusion UWP, and the third insulating film 110C may contact the bottom surface of the word line structure WS2 having the downward protrusion DWP. A height of a side wall of a portion of the insulating structure INS2 facing the common source line CSL may be less than a height of a side wall of a portion of the insulating structure INS2 closer to the channel film 150. A detailed structure of the word line structure WS2 is substantially the same as that of the word line structure WS1 of FIGS. 3 and 4.

The plurality of word line structures WS2 and the plurality of insulating structures INS2 may constitute a stack structure ST2.

The integrated circuit device 200 of FIGS. 5 and 6 may be easily highly scaled in the horizontal direction and the vertical direction, and may provide a structure for improving reliability by suppressing cell interference due to charge diffusion between adjacent cells even when an interval between vertically adjacent cells is relatively small in a vertical memory device.

Figure 7:
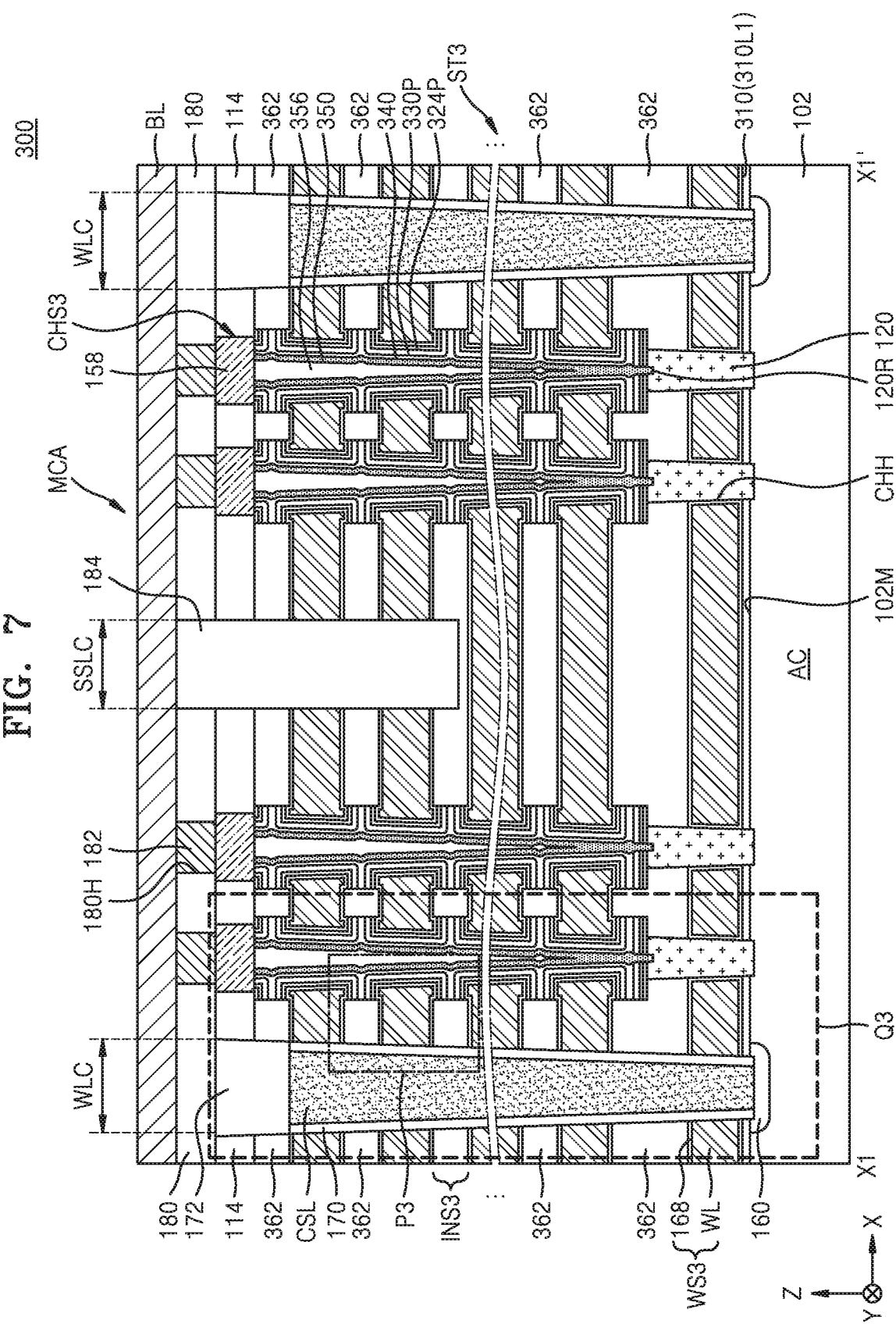
FIG. 7 is a cross-sectional view of an integrated circuit device according to other embodiments.
Figure 8:
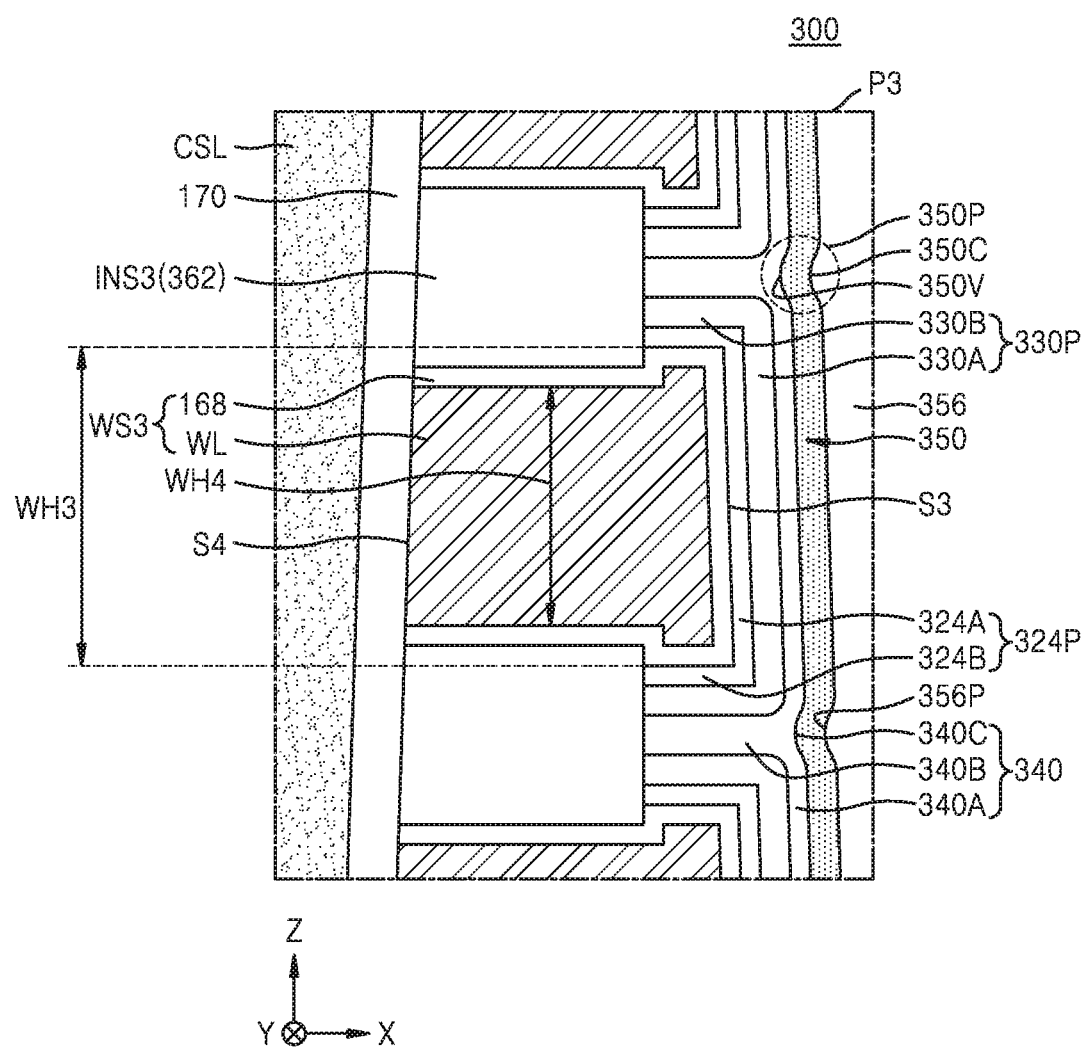
FIG. 8 is an enlarged cross-sectional view illustrating a portion P3 indicated by a dashed line in FIG. 7.

FIG. 7 is a cross-sectional view of an integrated circuit device according to other embodiments. FIG. 8 is an enlarged cross-sectional view illustrating a portion P3 indicated by a dashed line in FIG. 7. FIG. 7 illustrates elements, taken along line X1-X1' of FIG. 2.

Referring to FIGS. 7 and 8, an integrated circuit device 300 has substantially the same configuration as that of the integrated circuit device 100 of FIGS. 1 through 4. However, the integrated circuit device 300 includes a plurality of word line structures WS3 instead of the plurality of word line structures WS1, includes an insulating structure INS3 instead of the insulating structure INS1, and includes a plurality of channel structures CHS3 instead of the plurality of channel structures CHS1.

The insulating structure INS3 may include an inter-gate insulating pattern 362. The inter-gate insulating pattern 362 may be formed of a silicon oxide film, an air-gap, or a combination thereof.

Each of the plurality of channel structures CHS3 may include the semiconductor pattern 120, a channel film 350 contacting the semiconductor pattern 120 and extending in the vertical direction (e.g., the Z-direction) in the channel hole CM, a buried insulating film 356 filling an inner space of the channel film 350, and the drain region 158 contacting the channel film 350 and filling an upper entrance portion of the channel hole CHH. Detailed structures of the channel film 350 and the buried insulating film 356 are substantially similar to those of the channel film 150 and the buried insulating film 156, respectively, of FIGS. 3 and 4. The channel film 350 may nonlinearly extend in the vertical direction (e.g., the Z-direction). However, the channel film 350 includes a plurality of curved portions 350P each located at the same level as a level at which the inter-gate insulating pattern 362 of the insulating structure INS3 is located. The term "level" denotes a height in the vertical direction (e.g., the Z-direction) from the substrate 102. Each of the plurality of curved portions 350P may include a convex outer circumferential portion 350V facing the insulating structure INS3 and a concave inner circumferential portion 350C extending toward the center of the channel hole CHH. An outer surface of the buried insulating film 356 may include a protrusion 356P facing the concave inner circumferential portion 350C of the channel film 350.

The plurality of word line structures WS3 may have structures substantially similar to those of the plurality of word line structures WS1 of FIGS. 3 and 4. Each of the plurality of word line structures WS3 may include the word line WL and the dielectric thin film 168. However, in each of the plurality of word line structures WS3, a height WH3 of a side wall S3 facing the channel film 350 may be greater than a height WH4 of a side wall S4 facing the word line cut region WLC.

A plurality of blocking dielectric patterns 324P, a plurality of charge trap patterns 330P, and a tunneling dielectric film 340 may be located between the plurality of word line structures WS3 and the channel film 350 in the channel hole CHH.

Each of the plurality of charge trap patterns 330P may include a first portion 330A extending parallel to the channel film 350, and a second portion 330B integrally connected to the first portion 330A, curved from the first portion 330A, and horizontally extending away from the channel film 350. The plurality of charge trap patterns 330P may each have a "[" or "]" (i.e., a bracket-shaped) cross-sectional shape and may have an annular ring shape surrounding the channel film 350. In some embodiments, a length of the second portion 330B of each of the plurality of charge trap patterns 330P in the X-direction may decrease away from the substrate 102. In other embodiments, a length of the second portion 330B of each of the plurality of charge trap patterns 330P in the X-direction may increase away from the substrate 102. In other embodiments, a length of the second portion 330B of each of the plurality of charge trap patterns 330P in the X-direction may be constant irrespective of a distance from the substrate 102. Each of the plurality of charge trap patterns 330P may be formed of a silicon nitride film.

Each of the plurality of blocking dielectric patterns 324P may be located between the word line structure WS3 and the charge trap pattern 330P. Each of the plurality of blocking dielectric patterns 324P may include a first portion 324A extending parallel to the channel film 350, and a second portion 324B integrally connected to the first portion 324A, curved from the first portion 324A, and horizontally extending away from the channel film 350. The plurality of blocking dielectric patterns 324P may each have a "[" or "]" (i.e., a bracket-shaped) cross-sectional shape and may have an annular ring shape surrounding the channel film 350, like the plurality of charge trap patterns 330P. In some embodiments, a length of the second portion 324B of each of the plurality of blocking dielectric patterns 324P in the X-direction may decrease away from the substrate 102. In other embodiments, a length of the second portion 324B of each of the plurality of blocking dielectric patterns 324P in the X-direction may increase away from the substrate 102. In other embodiments, a length of the second portion 330B of each of the plurality of blocking dielectric patterns 324P in the X-direction may be constant irrespective of a distance from the substrate 102. Each of the plurality of blocking dielectric patterns 324P may be formed of a silicon oxide film or a silicon oxynitride film.

The tunneling dielectric film 340 may extend along an outer circumferential surface of the channel film 350 in the channel hole CHH, and may nonlinearly extend in the vertical direction (e.g., the Z-direction). The tunneling dielectric film 340 may include a first portion 340A extending parallel to the channel film 350, a plurality of second portions 340B protruding in the X-direction from the first portion 340A and extending to a space between two adjacent word line structures WS3, and a concave inner wall 340C contacting each of the plurality of convex outer circumferential portions 350V of the channel film 350. Each of the plurality of second portions 340B of the tunneling dielectric film 340 may fill a space between two adjacent charge trap patterns 330P of the plurality of charge trap patterns 330P. In some embodiments, a length of each of the plurality of second portions 340B of the tunneling dielectric film 340 in the X-direction may decrease away from the substrate 102. In other embodiments, a length of each of the plurality of second portions 340B of the tunneling dielectric film 340 in the X-direction may increase away from the substrate 102. In other embodiments, a length of each of the plurality of second portions 340B of the tunneling dielectric film 340 in the X-direction may be constant irrespective of a distance from the substrate 102. The tunneling dielectric film 340 may be formed of a silicon oxide film.

In the integrated circuit device 300, the insulating structure INS3 including the inter-gate insulating pattern 362, a part of a blocking dielectric film 324, a part of the charge trap pattern 330P, and a part of the tunneling dielectric film 340 may be located between the plurality of word line structures WS3. The plurality of word line structures WS3 and the plurality of insulating structures INS3 may constitute a stack structure ST3.

Since the plurality of charge trap patterns 330P of the integrated circuit device 300 of FIGS. 7 and 8 are located in the channel hole CHH, the integrated circuit device 300 may be easily highly scaled. Also, two adjacent charge trap patterns 330P of the plurality of charge trap patterns 330P are spaced apart from each other in the vertical direction (e.g., the Z-direction) in one channel hole CHH with a local insulating region therebetween. Accordingly, there may be provided a structure for improving reliability by suppressing cell interference due to charge diffusion between adjacent cells even when an interval between vertically adjacent cells is relatively small in a vertical memory device.

Figure 9:
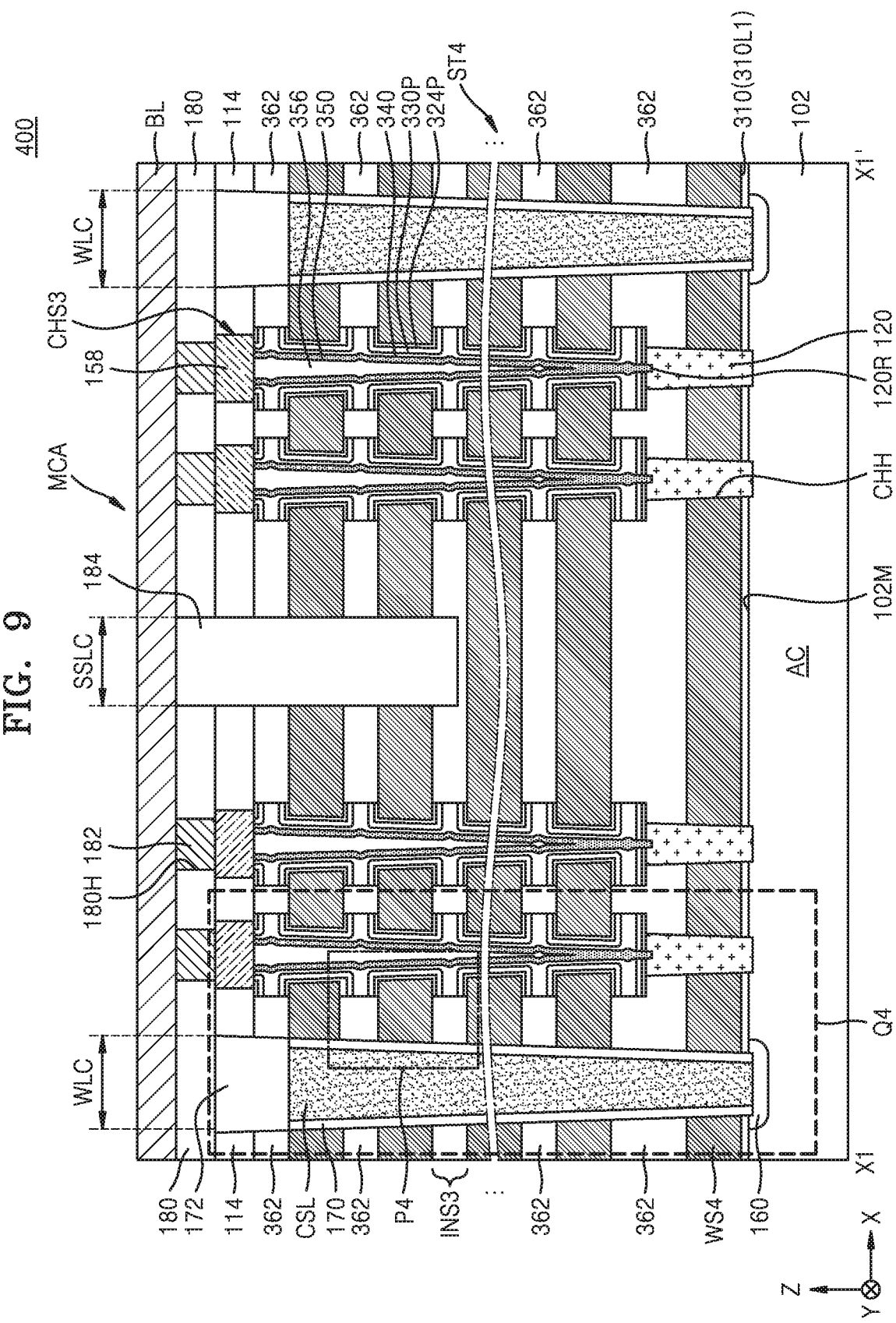
FIG. 9 is a cross-sectional view of an integrated circuit device according to other embodiments.
Figure 10:
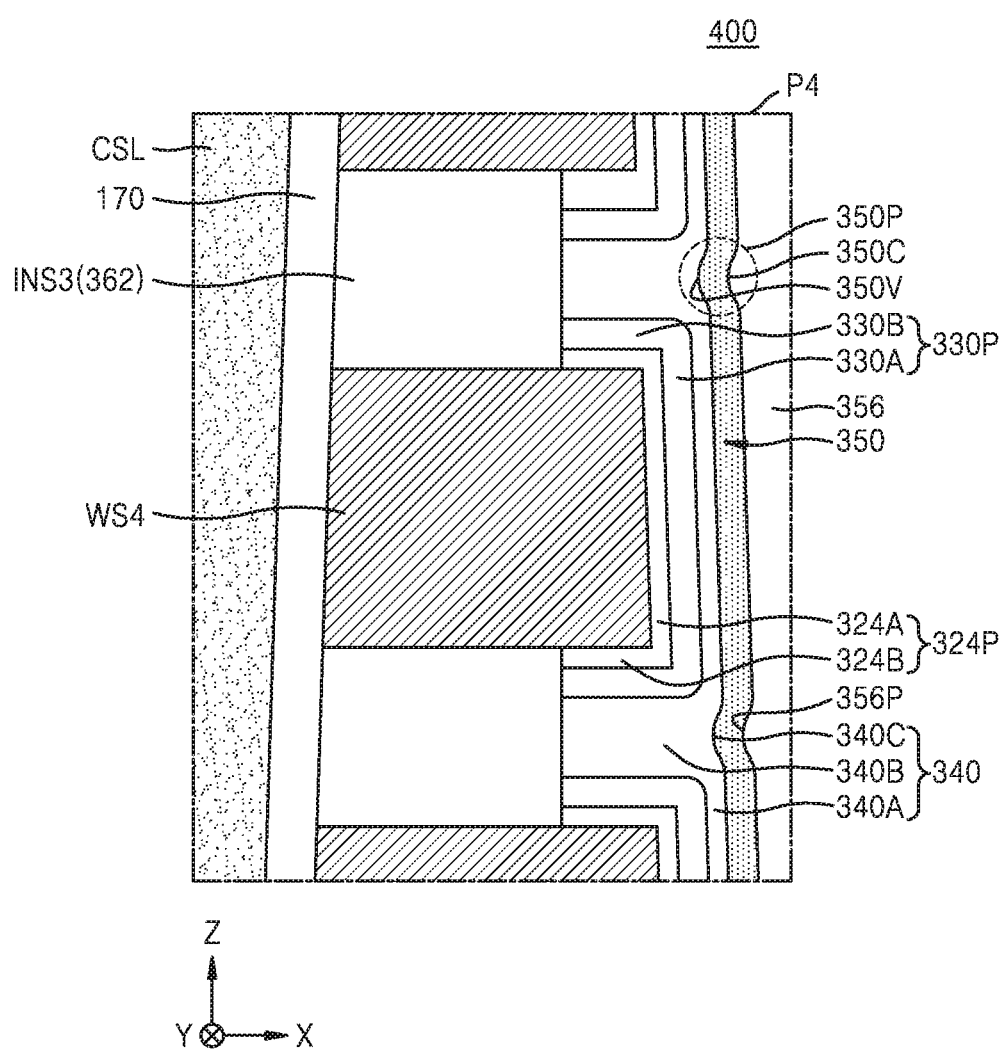
FIG. 10 is an enlarged cross-sectional view illustrating a portion P4 indicated by a dashed line in FIG. 9.

FIG. 9 is a cross-sectional view of an integrated circuit device according to other embodiments. FIG. 10 is an enlarged cross-sectional view illustrating a portion P4 indicated by a dashed line in FIG. 9. FIG. 9 illustrates elements, taken along line X1-X1' of FIG. 2.

Referring to FIGS. 9 and 10, an integrated circuit device 400 has substantially the same configuration as that of the integrated circuit device 300 of FIGS. 7 and 8. However, the integrated circuit device 400 includes a plurality of word line structures WS4 instead of the plurality of word line structures WS3.

The plurality of word line structures WS4 may have a uniform thickness. In some embodiments, each of the plurality of word line structures WS4 may be formed of a doped polysilicon film. In other embodiments, each of the plurality of word line structures WS4 may be formed of a combination of a doped polysilicon film and a metal silicide film. The metal silicide film may be a cobalt silicide film, a nickel silicide film, or a tungsten silicide film.

The plurality of word line structures WS4 and the plurality of insulating structures INS3 may constitute a stack structure ST4.

The integrated circuit device 400 of FIGS. 9 and 10 may be easily highly scaled, and may provide a structure for improving reliability by suppressing cell interference due to charge diffusion between adjacent cells even when an interval between vertically adjacent cells is relatively small in a vertical memory device.

FIGS. 11A through 11J are cross-sectional views illustrating a method of manufacturing an integrated circuit device according to a process order according to embodiments. In the present embodiment, a method of manufacturing the integrated circuit device 100 of FIGS. 2 through 4 will be described. FIGS. 11A through 11J are enlarged cross-sectional views illustrating a portion Q1 indicated by a dashed line in FIG. 3 according to a process of manufacturing the integrated circuit device 100.

Figure 11A:
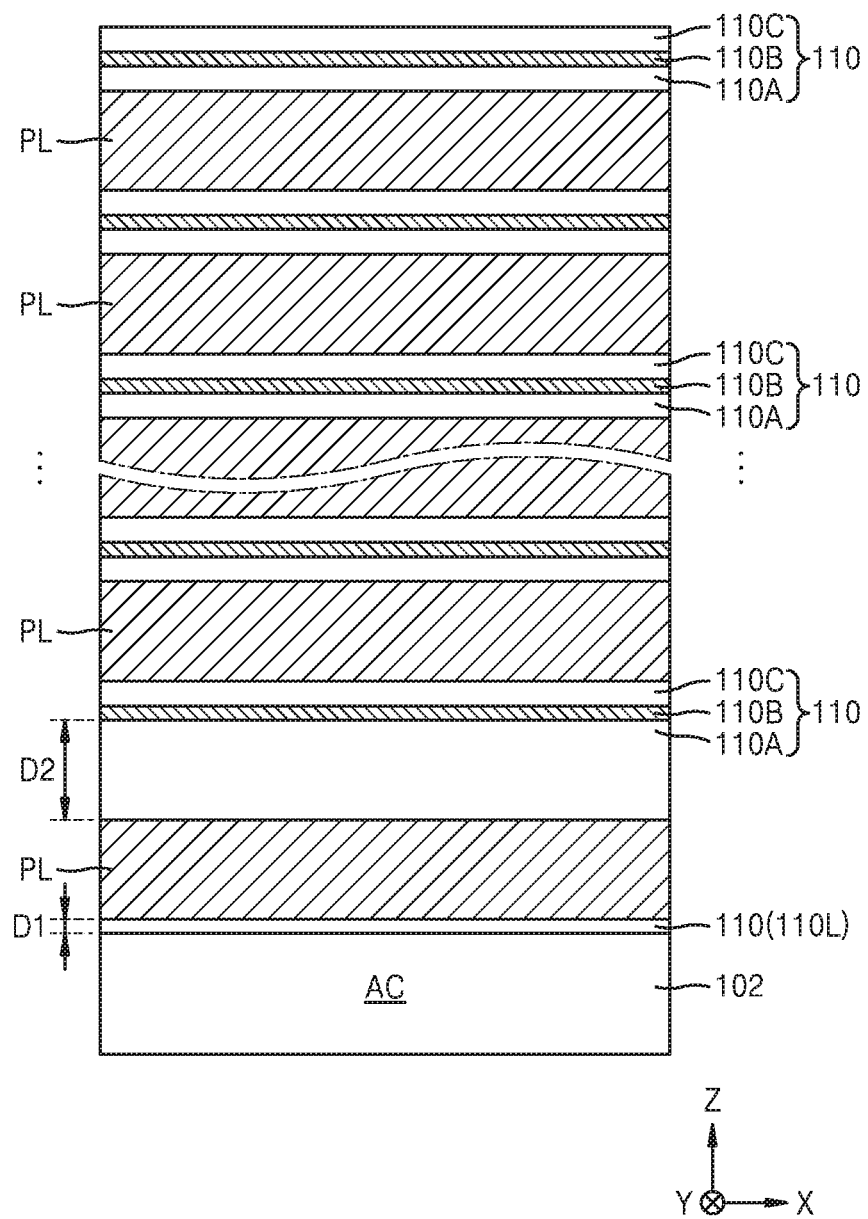
FIGS. 11A through 11J are cross-sectional views illustrating a method of manufacturing an integrated circuit device according to a process order according to embodiments.

Referring to FIG. 11A, after a device isolation film (not shown) for defining the active region AC is formed on the substrate 102, a plurality of insulating films 110 and a plurality of sacrificial films PL are alternately stacked on the substrate 102 one by one.

A lowermost insulating film 110L of the plurality of insulating films 110 contacting the substrate 102 may be a single layer formed of a silicon oxide film. The lowermost insulating film 110L may have a thickness D1 less than that of each of the other insulating films 110.

Each of the insulating films 110 located between the plurality of sacrificial films PL and the insulating film 110 that is an uppermost insulating film from among the plurality of insulating films 110 may have a three-layer structure including the first insulating film 110A, a second insulating film 110B, and the third insulating film 110C. The second insulating film 110B may be formed of a material having an etch selectivity different from that of the first insulating film 110A and the third insulating film 110C. The first insulating film 110A and the third insulating film 110C may be formed of the same material. Each of the first insulating film 110A, the second insulating film 110B, and the third insulating film 110C may be formed of a material different from that of each of the sacrificial films PL.

In some embodiments, each of the plurality of sacrificial films PL may be formed of a silicon nitride film, each of the first insulating film 110A and the third insulating film 110C may be formed of a silicon oxide film, and the second insulating film 110B may be formed of SiGe, a Si-rich silicon nitride film, or an N-rich silicon nitride film. The term "Si-rich silicon nitride film" used herein denotes a silicon nitride film having an Si/N composition ratio higher than an Si/N composition ratio of a stoichiometric silicon nitride film ($Si_3N_4$ film).

Each of the plurality of sacrificial films PL may provide a space for forming at least one ground selection line GSL, the plurality of word lines WL, and at least one string selection line SSL. In the insulating film 110 formed on the sacrificial film PL for providing a space for forming the ground selection line GSL, that is, directly formed on the sacrificial film PL that is a first sacrificial film from the substrate 102 from among the plurality of sacrificial films PL, the first insulating film 110A contacting a top surface of the first sacrificial film may have a thickness D2 greater than that of each of the first insulating films 110A formed at other positions.

Each of the plurality of insulating films 110 and the plurality of sacrificial films PL may be formed by using chemical vapor deposition (CVD), plasma enhanced CVD (PECVD), or atomic layer deposition (ALD).

Figure 11B:
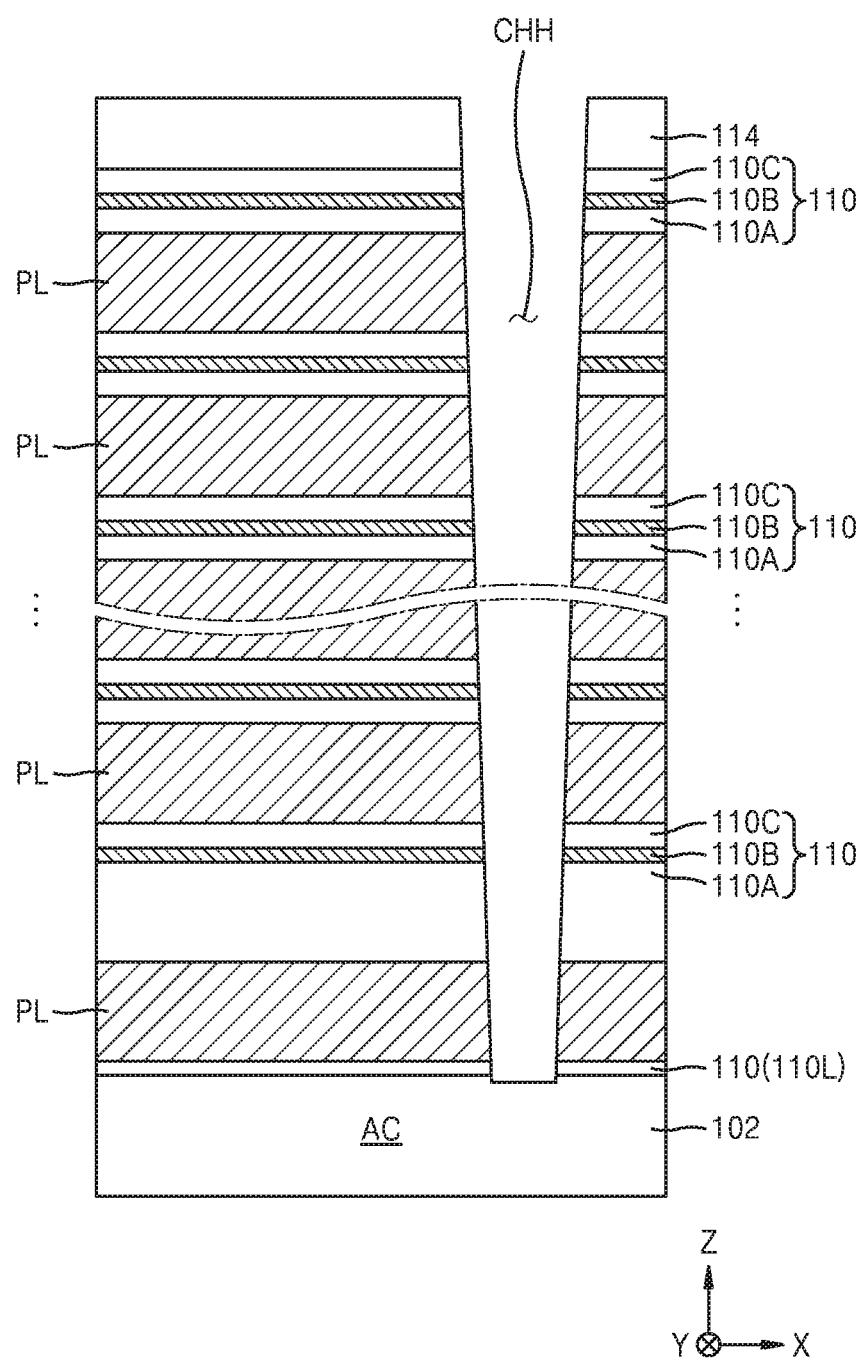

Referring to FIG. 11B, after the insulating pattern 114 is formed on the insulating film 110 that is the uppermost insulating film from among the plurality of insulating films 110, the channel hole CHH exposing the substrate 102 is formed by anisotropically etching the plurality of insulating films 110 and the plurality of sacrificial films PL by using the insulating pattern 114 as an etch mask.

A horizontal width (i.e., the diameter) of the channel hole CHH may decrease toward the substrate 102. That is, the wall of the channel hole CM may be sloped with the diameter of the channel hole CM at the substrate 102 being less than the diameter of the channel hole CHH at the insulating pattern 114, as shown in FIG. 11B. The insulating pattern 114 may have a single-layer or multi-layer structure formed of an oxide film, a nitride film, or a combination thereof.

Figure 11C:
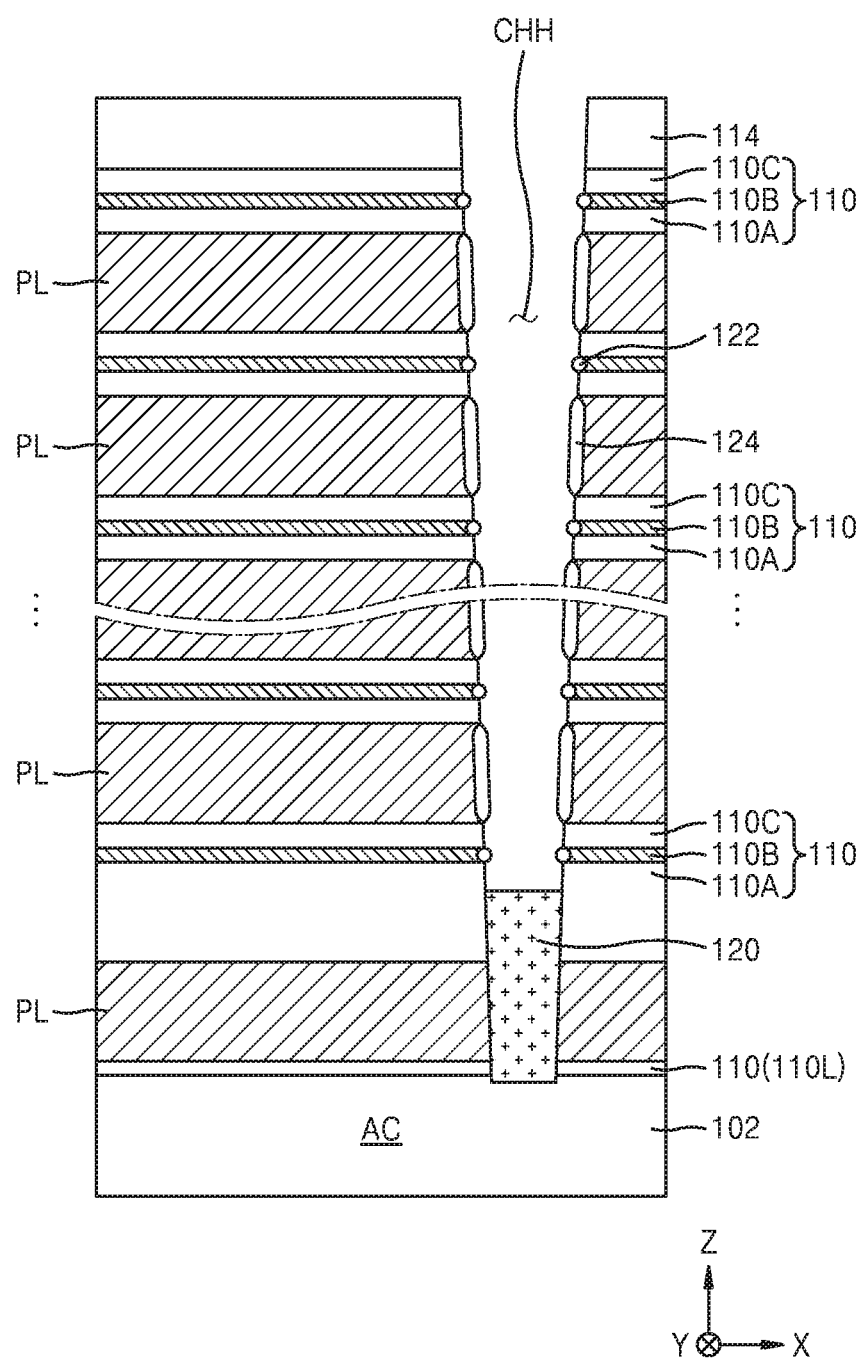

Referring to FIG. 11C, the semiconductor pattern 120 partially filling the channel hole CHH is formed by performing selective epitaxial growth using the substrate 102 exposed at the bottom of the channel hole CHH as a seed. A top surface of the semiconductor pattern 120 may be located at a level between a top surface of the sacrificial film PL closest to the substrate 102 from among the plurality of sacrificial films PL and a bottom surface of the second insulating film 110B closest to the substrate 102 from among the plurality of second insulating films 110B. The semiconductor pattern 120 may function as a channel, like the channel film 150 formed by using a process described below with reference to FIG. 11D. The semiconductor pattern 120 may be formed of Si or Ge. In some embodiments, the semiconductor pattern 120 may be formed of a semiconductor doped with impurities.

Next, exposed surfaces of the plurality of second insulating films 110B and the plurality of sacrificial films PL are oxidized by performing an oxidation process in an oxidation atmosphere on a resultant structure including the semiconductor pattern 120. As a result, a sacrificial oxide film 122 may be formed on a surface of each of the plurality of second insulating films 110B exposed in the channel hole CHH, and the blocking dielectric pattern 124 may be formed on a surface of each of the plurality of sacrificial films PL exposed in the channel hole CM.

In some embodiments, an exposed surface of the semiconductor pattern 120 may also be oxidized while the sacrificial oxide films 122 and the blocking dielectric patterns 124 are formed, and the top surface of the semiconductor pattern 120 may be covered by an oxide film (not shown). However, before the channel film 150 is formed in a process described below with reference to FIG. 11D, at least a part of the oxide film covering the top surface of the semiconductor pattern 120 may be removed and the channel film 150 may directly contact the semiconductor pattern 120.

Figure 11D:
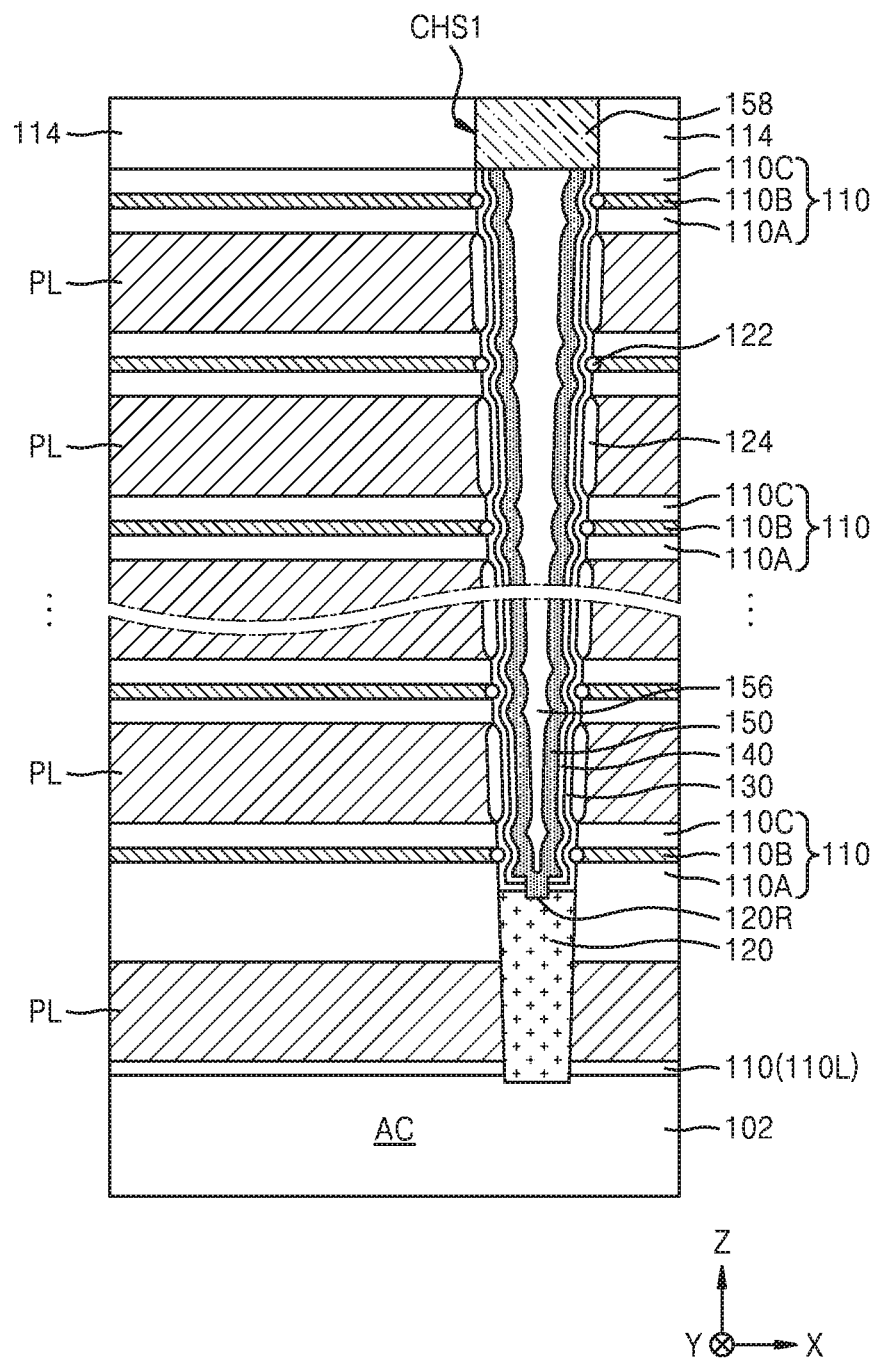

Referring to FIG. 11D, the charge trap film 130, the tunneling dielectric film 140, the channel film 150, and the buried insulating film 156 may be sequentially formed in the channel CHH on a resultant structure of FIG. 11C, and the drain region 158 filling an upper entrance portion of the channel hole CM is formed.

In the channel hole CHH (see FIG. 11C), each of the charge trap film 130, the tunneling dielectric film 140, and the channel film 150 may have a cylindrical shape. Each of the charge trap film 130, the tunneling dielectric film 140, and the channel film 150 may include a plurality of curved portions covering the plurality of sacrificial oxide films 122 and the plurality of blocking dielectric patterns 124.

In a process of forming the charge trap film 130, the tunneling dielectric film 140, and the channel film 150, a portion of the top surface of the semiconductor pattern 120 may be removed and a recess surface 120R may be formed on the top surface of the semiconductor pattern 120. The channel film 150 may contact the recess surface 120R of the semiconductor pattern 120.

A deposition process and an etch-back process may be performed multiple times to form the charge trap film 130, the tunneling dielectric film 140, the channel film 150, and the buried insulating film 156. The deposition process may be selected from among, but not limited to, CVD, LPCVD, and ALD.

Although the insulating pattern 114 remains around the drain region 158 in FIG. 11D, the inventive concept is not limited thereto. For example, after a top surface of the insulating film 110 that is the uppermost insulating film is exposed by removing the insulating pattern 114 while the charge trap film 1320, the tunneling dielectric film 140, the channel film 150, and the buried insulating film 156 are formed, a new insulating film (not shown) covering the top surface of the insulating film 110 that is the uppermost insulating film may be formed, a plurality of contact holes may be formed by etching portions of the insulating film corresponding to the channel hole CM, and then the drain region 158 filling the plurality of contact holes may be formed. The drain region 158 may be formed of polysilicon doped with impurities, a metal, a conductive metal nitride, or a combination thereof. Examples of the metal included in the drain region 158 may include, but are not limited to, tungsten, nickel, cobalt, and tantalum.

Figure 11E:
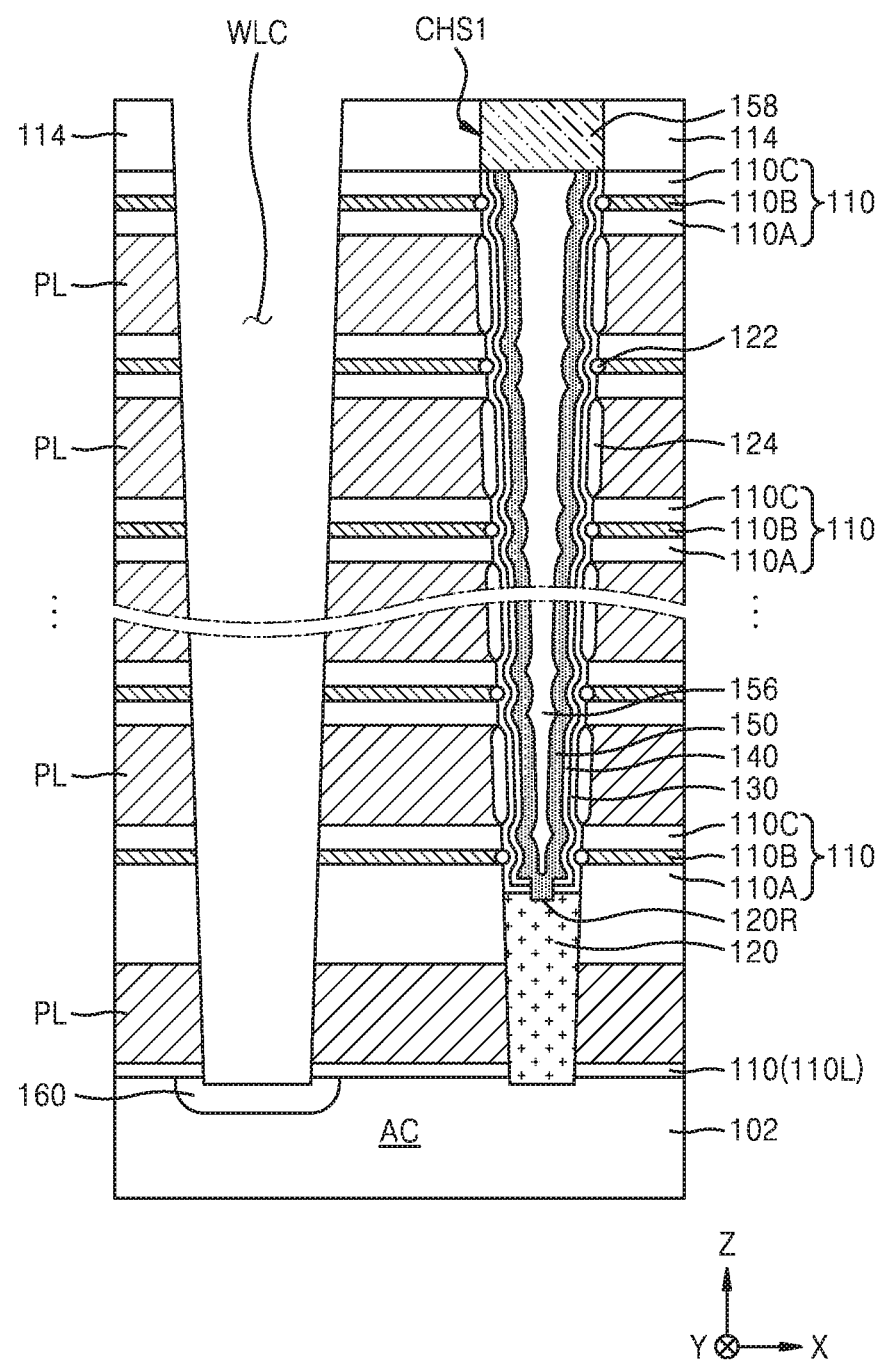

Referring to FIG. 11E, after the word line cut region WLC passing through the insulating pattern 114, the plurality of insulating films 110, and the plurality of sacrificial films PL and exposing the substrate 102 is formed by anisotropically etching the insulating pattern 114, the plurality of insulating films 110, and the plurality of sacrificial films PL, the common source region 160 is formed by implanting impurity ions into the substrate 102 through the word line cut region WLC.

Figure 11F:
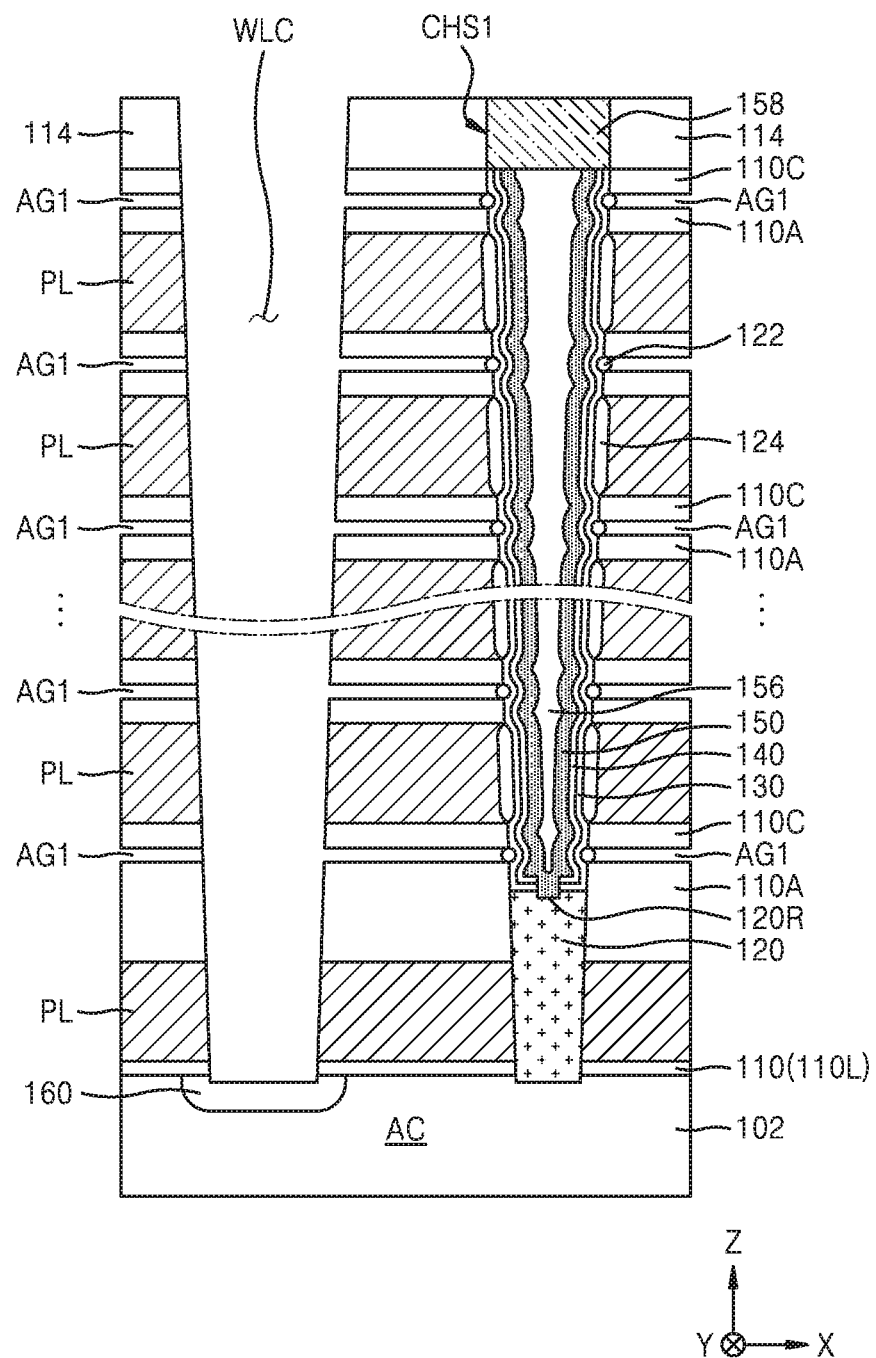

Referring to FIG. 11F, each of the plurality of first air-gap portions AG1 exposing the sacrificial oxide film 122 is formed between the first insulating film 110A and the third insulating film 110C from among the plurality of insulating films 110 by removing the plurality of second insulating films 110B (see FIG. 11E) through the word line cut region WLC. Isotropic etching may be performed to remove the plurality of second insulating films 110B.

Figure 11G:
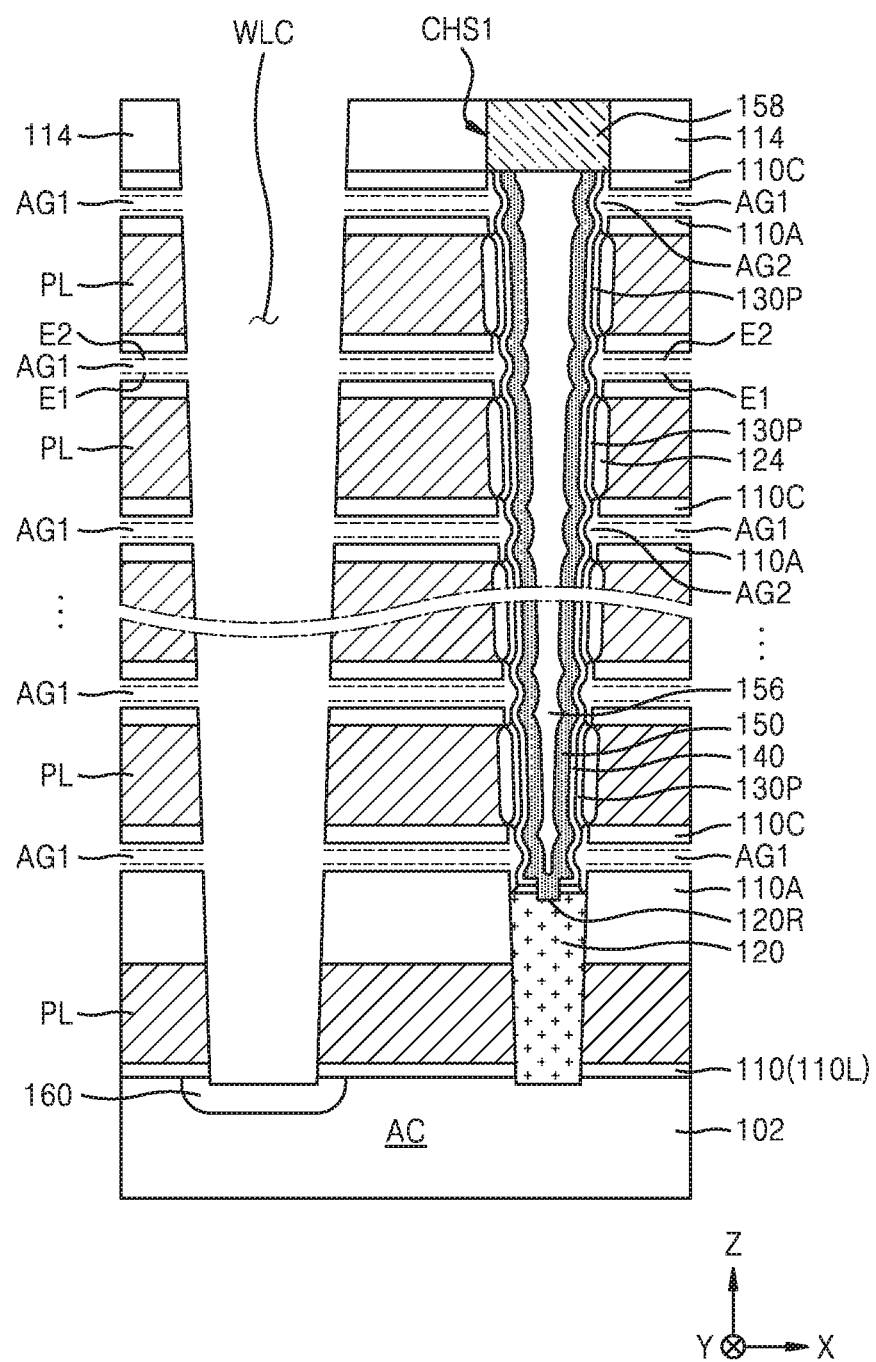

Referring to FIG. 11G, the plurality of sacrificial oxide films 122 are removed by using isotropic etching through the word line cut region WLC and the plurality of first air-gap portions AG1, the charge trap film 130 are divided into the plurality of charge trap patterns 130P by isotropically etching the charge trap film 130 that is exposed, and the plurality of second air-gap portions AG2 located between the plurality of charge trap patterns 130P are formed.

While the plurality of sacrificial oxide films 122 are removed by using isotropic etching, parts of portions of the first insulating film 110A and the third insulating film 110C that are exposed during the isotropic etching may be removed, thicknesses of the first insulating film 110A and the third insulating film 110C may be reduced, and thus a height of each of the plurality of first air-gap portions AG1 may be increased. The term "height" used herein denotes a dimension in the Z-direction. For better understanding, a level E1 of a top surface of the first insulating film 110A and a level E2 of a bottom surface of the third insulating film 110C before the plurality of sacrificial oxide films 122 are isotropically etched are indicated by dashed lines in FIG. 11G.

Two adjacent charge trap patterns 130P of the plurality of charge trap patterns 130P may be spaced apart from each other in the channel hole CM with the second air-gap portion AG2 therebetween. The plurality of second air-gap portions AG2 may be located in the channel hole CHH and may communicate with the first air-gap portions AG1.

Figure 11H:
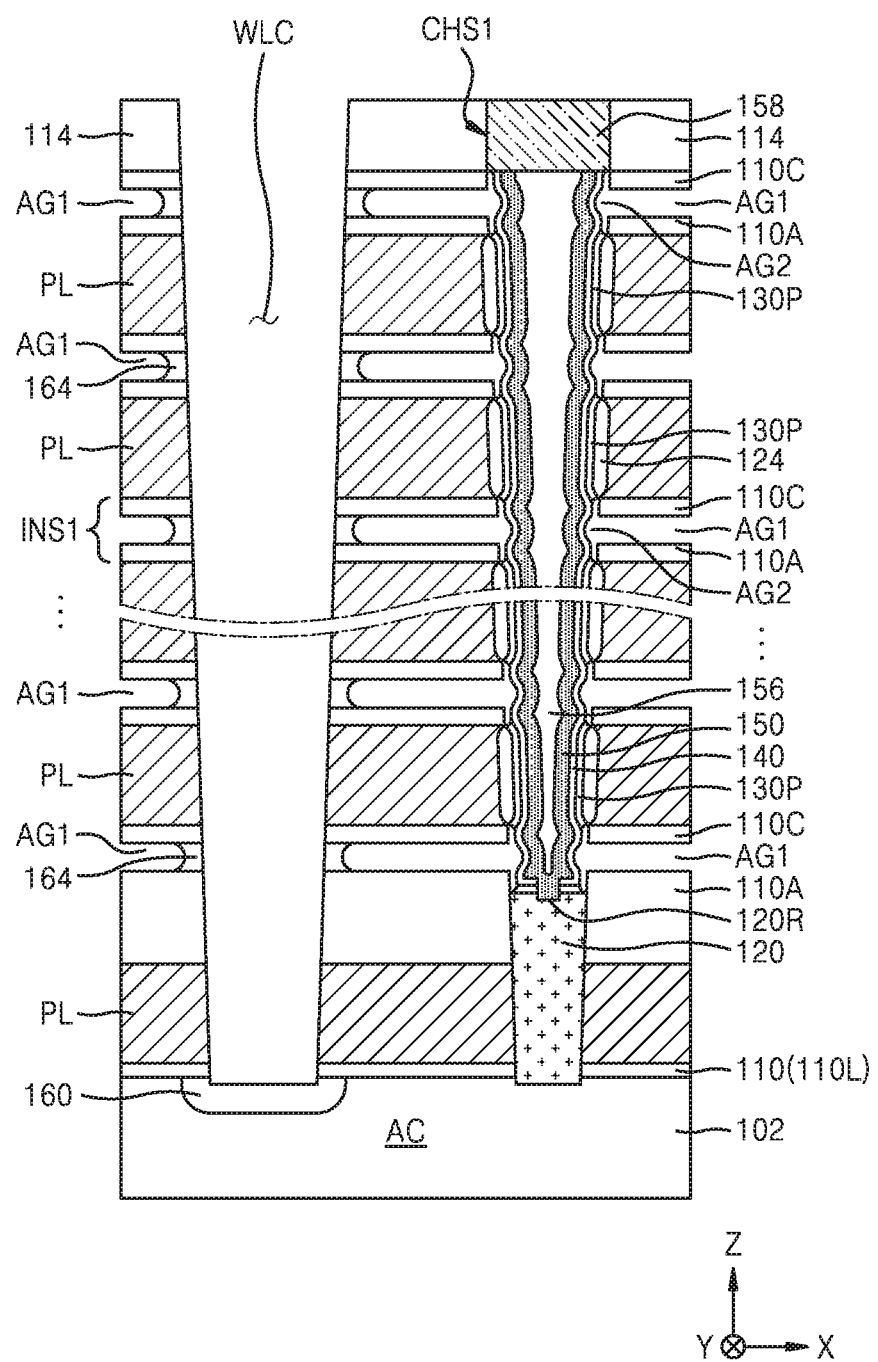

Referring to FIG. 11H, the plurality of insulating plugs 164 closing entrances of the plurality of first air-gap portions AG1 close to the word line cut region WLC are formed.

In a process for forming the insulating plugs 164, an insulating material may be deposited on an inner side wall of the word line cut region WLC under a process condition for obtaining an insulating film having a relatively low step coverage, and then side walls of the plurality of sacrificial films PL may be exposed in the word line cut region WLC by removing a part of the insulating film so that the insulating film remains only in the plurality of first air-gap portions AG1. Each of the plurality of insulating plugs 164 may be formed of a silicon oxide film.

The insulating structure INS1 including the first air-gap portion AG1, the first insulating film 110A and the third insulating film 110C that define a height of the first air-gap portion AG1, and the insulating plug 164 may be located between two adjacent sacrificial films PL of the plurality of sacrificial films PL that vertically overlap each other.

Figure 11I:
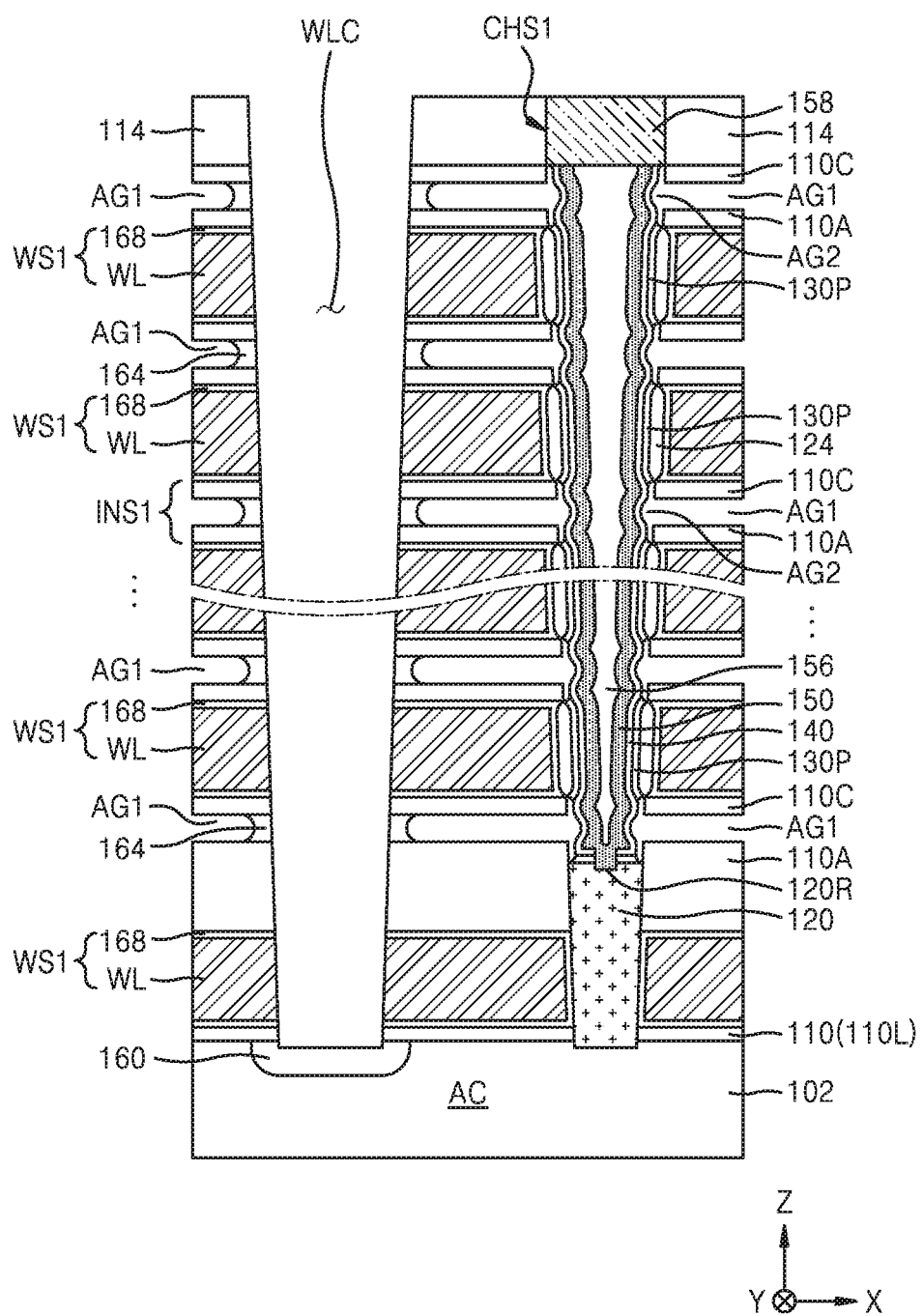

Referring to FIG. 11I, the plurality of sacrificial films PL are replaced with the plurality of word line structures WS1. To this end, after a plurality of word line spaces exposing the blocking dielectric patterns 124 are prepared by removing the plurality of sacrificial films PL through the plurality of word line cut region WLC, the plurality of dielectric thin films 168 may be formed in the plurality of word line spaces and the plurality of word lines WL filling spaces defined by the plurality of dielectric thin films 168 from among the plurality of word line spaces may be formed.

Each of the plurality of word line structures WS1 may include the word line WL extending in the horizontal direction parallel to the main surface of the substrate 102 and the dielectric thin film 168 located between the blocking dielectric pattern 124 and the word line WL. The dielectric thin film 168 may be conformably formed on an inner wall of each of the plurality of word line spaces to cover a side wall, a bottom surface, and a top surface of the word line WL.

Each of the plurality of word line structures WS1 may include the bottom protrusion WP1 and the top protrusion WP2 locally protruding toward the channel film 150 as described with reference to FIG. 14. The insulating structure INS1 including the first air-gap portion AG1, the first insulating film 110A and the third insulating film 110C for defining a height of the first air-gap portion AG1, and the insulating plug 164 may be located between the plurality of word line structures WLS1.

Figure 11J:
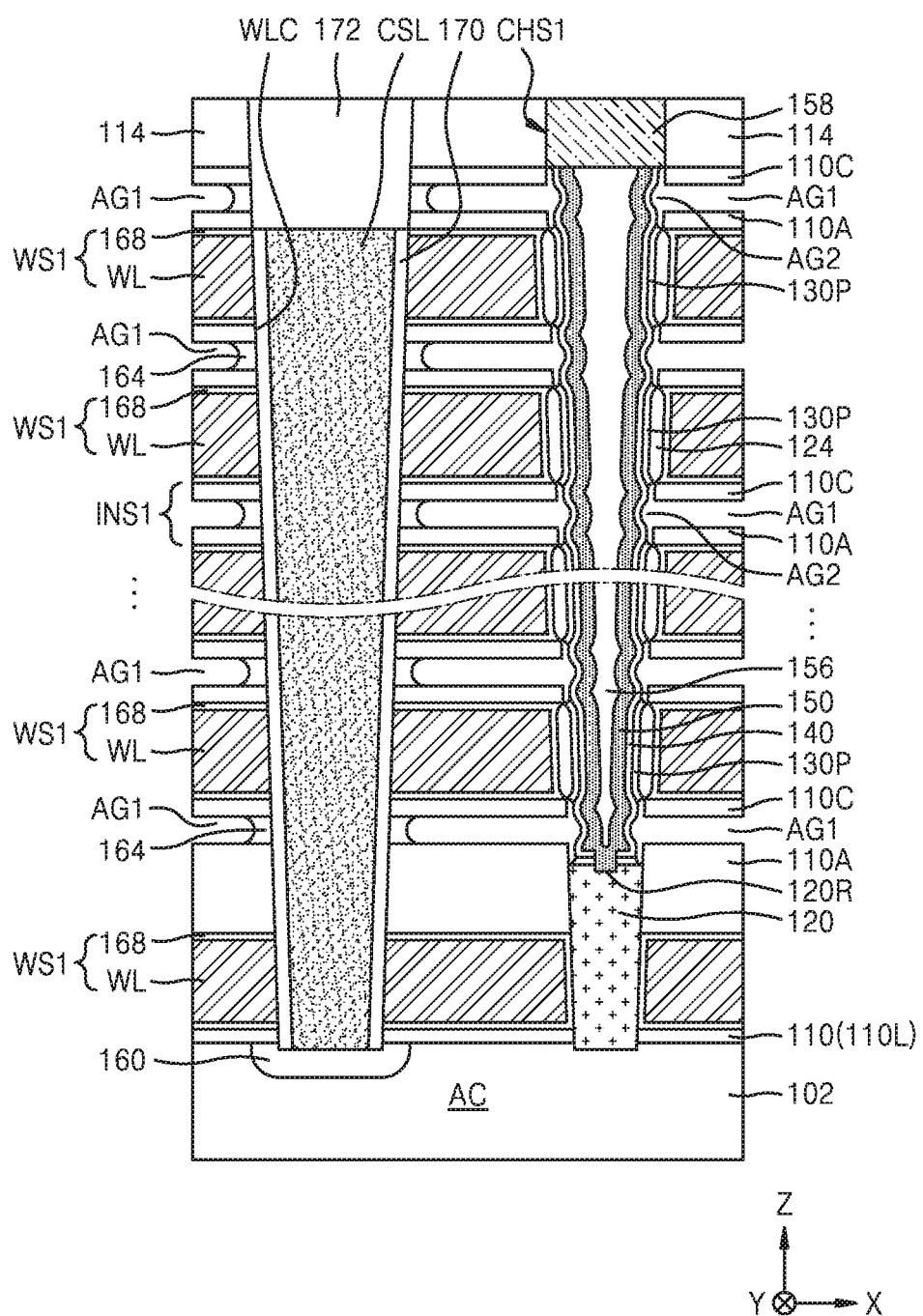

Referring to FIG. 11J, the insulating spacer 170 and the common source line CSL are formed in the word line cut region WLC, and the capping insulating film 172 covering top surfaces of the insulating spacer 170 and the common source line CSL is formed in the word line cut region WLC.

Each of the insulating spacer 170 and the capping insulating film 172 may be formed of a silicon oxide film, a silicon nitride film, a silicon oxynitride film, or a combination thereof. The common source line CSL may be formed of a metal such as tungsten, copper, or aluminum, a conductive metal nitride such as titanium nitride or tantalum nitride, a transition metal such as titanium or tantalum, or a combination thereof. In some embodiments, a metal silicide film (not shown) for reducing contact resistance may be located between the common source region 160 and the common source line CSL. For example, the meal silicide film may be formed of cobalt silicide, tungsten silicide, or nickel silicide.

In some embodiments, in order to form the insulating spacer 170 in the word line cut region WLC, an insulating film covering an inner wall of the word line cut region WLC may be first formed. Next, etch-back may be performed on the insulating film so that the common source region 160 is exposed at a bottom surface of the word line cut region WLC and the insulating spacer 170 formed of a remaining portion of the insulating film may be formed on an inner side wall of the word line cut region WLC.

In order to form the common source line CSL, a conductive layer may be formed inside and outside the word line cut region WLC so that a space defined by the insulating spacer 170 in the word line cut region WLC is filled with a conductive material, and then unnecessary portions of the conductive layer may be removed by using chemical mechanical polishing (CMP) or etch-back.

In order to form the capping insulating film 172, an insulating film filling a remaining space of the word line cut region WLC may be formed on a resultant structure including the insulating spacer 170 and the common source line CSL, and then a top surface of the insulating pattern 114 and a top surface of the drain region 158 may be exposed by removing a part of the insulating film by using CMP or etch-back.

Next, as shown in FIG. 3, after the insulating film 180 covering the insulating pattern 114, the drain region 158, and the capping insulating film 172 is formed, the string selection line cut region SSLC (see FIG. 3) may be defined by removing a part of the insulating film 180, a part of the insulating pattern 114, a part of the insulating structure INS1, and parts of two upper word line structures from among the plurality of word line structures WS1, and the string selection line cut region SSLC may be filled with the insulating film 184.

Next, the integrated circuit device 100 of FIG. 3 may be manufactured by forming a plurality of bit line contact holes 180H passing through some portions of the insulating film 180, forming the plurality of bit line contact pads 182 by filling a conductive material in the plurality of bit line contact holes 180H, and forming the plurality of bit lines BL connected to the plurality of bit line contact pads 182 on the insulating film 180.

Figure 12A:
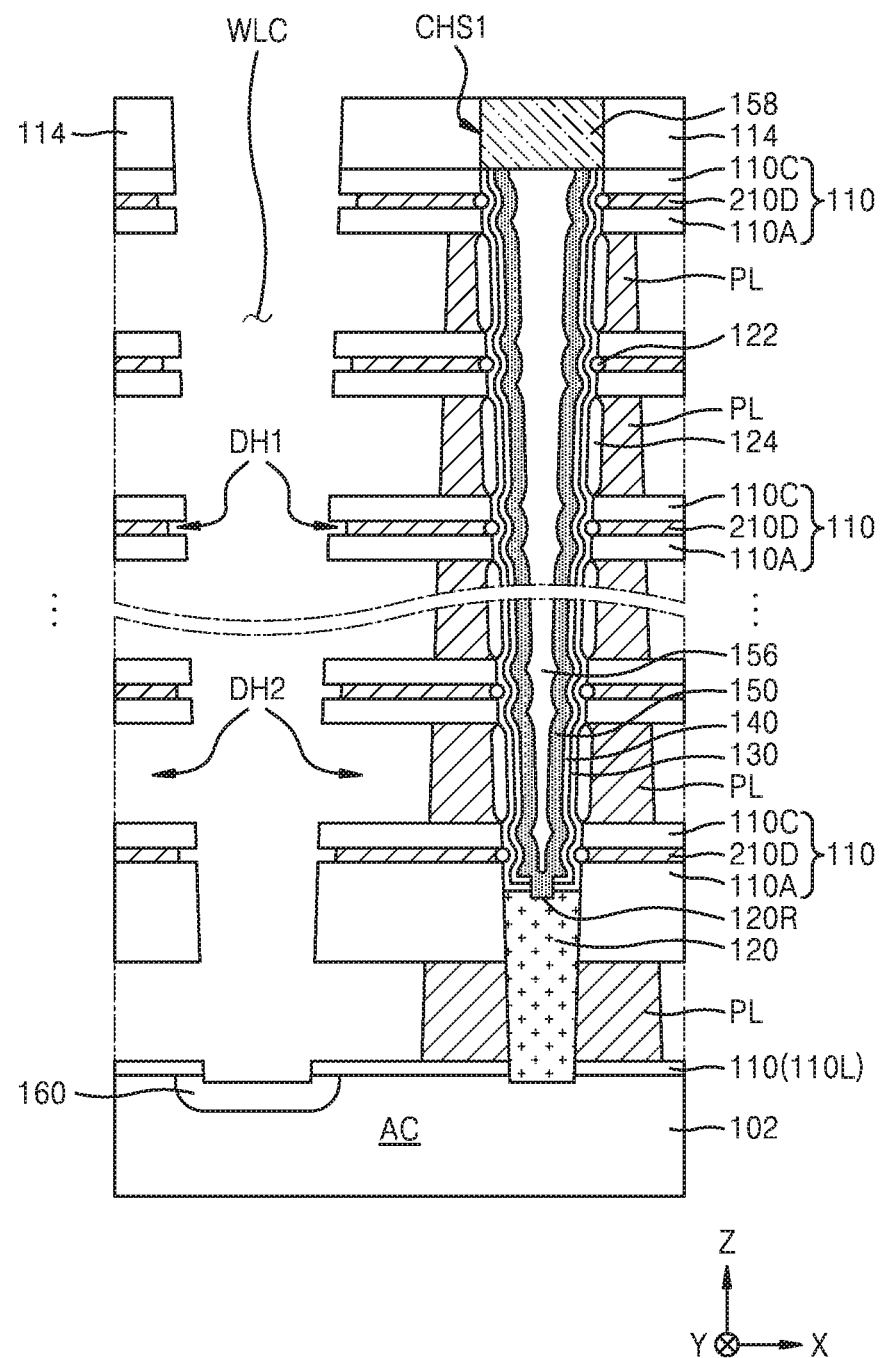
FIGS. 12A through 12C are cross-sectional views illustrating a method of manufacturing an integrated circuit device according to a process order according to other embodiments.
Figure 12B:
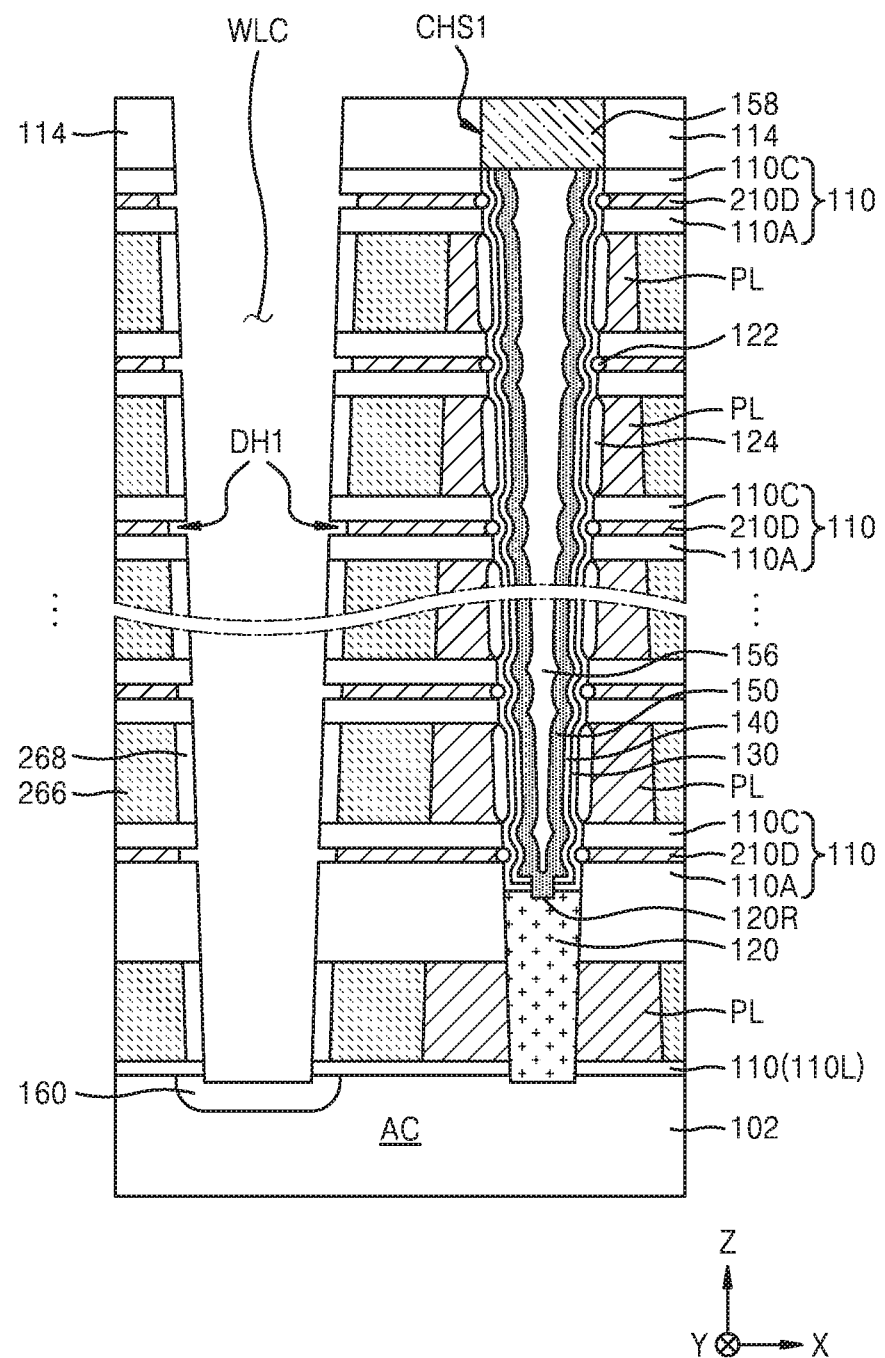
Figure 12C:
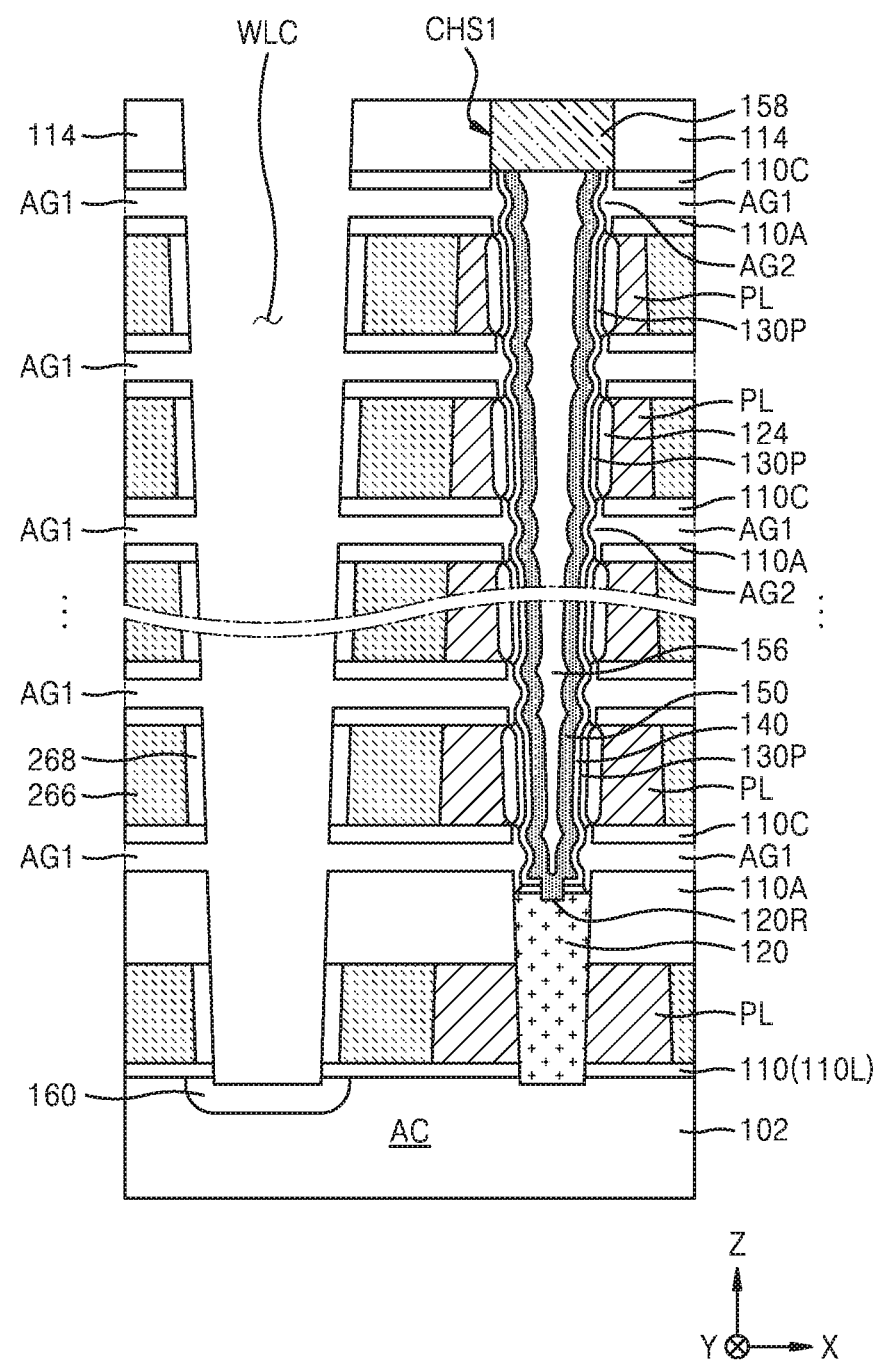

FIGS. 12A through 12C are cross-sectional views illustrating a method of manufacturing an integrated circuit device according to a process order according to other embodiments. In the present embodiment, another method of manufacturing the integrated circuit device 100 of FIGS. 2 through 4 will be described. FIGS. 12A through 12C are enlarged cross-sectional views illustrating the portion Q1 indicated by a dashed line in FIG. 3, like FIGS. 11A through 11J. In FIGS. 12A through 12C, the same elements as those in FIGS. 11A through 11J are denoted by the same reference numerals, and a detailed explanation thereof will not be given.

Referring to FIG. 12A, the word line cut region WLC and the common source region 160 are formed by using the same method as that described with reference to FIGS. 11A through 11E. However, in the present embodiment, a second insulating film 210D formed of the same material as a material of the sacrificial film PL, instead of the second insulating film 110B of the insulating film 110, is used. In some embodiments, the second insulating film 210D may be formed of a silicon nitride film.

The sacrificial film PL and the second insulating film 210D are isotropically etched through the word line cut region WLC. The amount (referred to as horizontal removal amount) of the second insulating film 210D that is horizontally removed due to the isotropic etching may be less than that of the sacrificial film PL. As a result, after the isotropic etching, a first horizontal space DH1 having a relatively small width may be formed around the word line cut region WLC at the same level as that of the second insulating film 210D, and a second horizontal space DH2 having a relatively large width may be formed around the word line cut region WLC at the same level as that of the sacrificial film PL.

Referring to FIG. 12B, a protective film 266 covering the sacrificial film PL is formed in the second horizontal space DH2, and a protective oxide film 268 is formed by oxidizing a surface of the protective film 266 exposed through the word line cut region WLC.

In some embodiments, the protective film 266 may be formed of a polysilicon film, and the protective oxide film 268 may be formed of a silicon oxide film.

Referring to FIG. 12C, after the plurality of first air-gap portions AG1 are formed by removing the plurality of second insulating films 210D through the word line cut region WLC by using a method similar to that described with reference to FIGS. 11F and 11G, the plurality of second air-gap portions AG2 that are located between the plurality of charge trap patterns 130P are formed by removing the plurality of sacrificial oxide films 122 through the word line cut region WLC and the plurality of first air-gap portions AG1 by using isotropic etching and dividing the charge trap film 130 into the plurality of charge trap patterns 130P by isotropically etching the charge trap film 130 that is exposed.

While isotropic etching for forming the plurality of first air-gap portions AG1 and the plurality of second air-gap portions AG2 is performed multiple times, the protective film 266 and the protective oxide film 268 may prevent undesired etching or removal of adjacent elements through the second horizontal space DH2 (see FIG. 12A).

Next, after the plurality of insulating plugs 164 closing entrances of the plurality of first air-gap portions AG1 close to the word line cut region WLC are formed by using the same method as that described with reference to FIG. 11H, the protective film 266 and the protective oxide film 268 filling the second horizontal space DH2 (see FIG. 12A) and the sacrificial film PL are replaced with the word line structure WS1 by using a method similar to that described with reference to FIG. 11I. Next, the integrated circuit device 100 of FIG. 3 may be manufactured by performing processes of FIG. 11J.

Although a method of dividing the charge trap film 130 into the plurality of charge trap patterns 130P by forming the plurality of first air-gap portions AG1 and the plurality of second air-gap portions AG2 and then forming the plurality of word line structures WS1 has been described with reference to FIGS. 11A through 11J and FIGS. 12A through 12C, the inventive concept is not limited thereto. For example, a process of forming the plurality of word line structures WS1 and then dividing the charge trap film 130 into the plurality of charge trap patterns 130P by forming the plurality of first air-gap portions AG1 and the plurality of second air-gap portions AG2 may be performed.

Figure 13A:
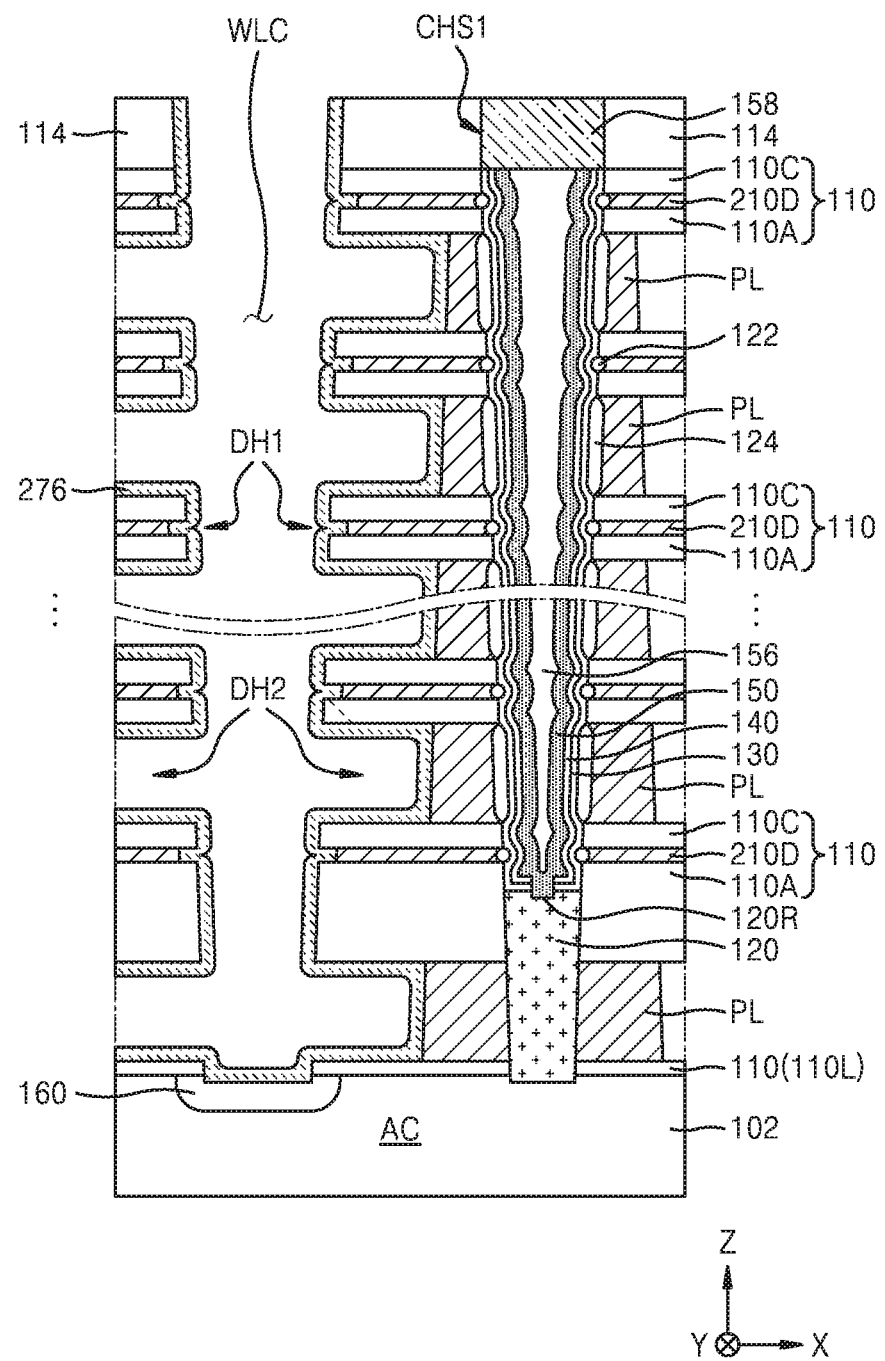
FIGS. 13A and 13B are cross-sectional views illustrating a method of manufacturing an integrated circuit device according to a process order according to other embodiments.
Figure 13B:
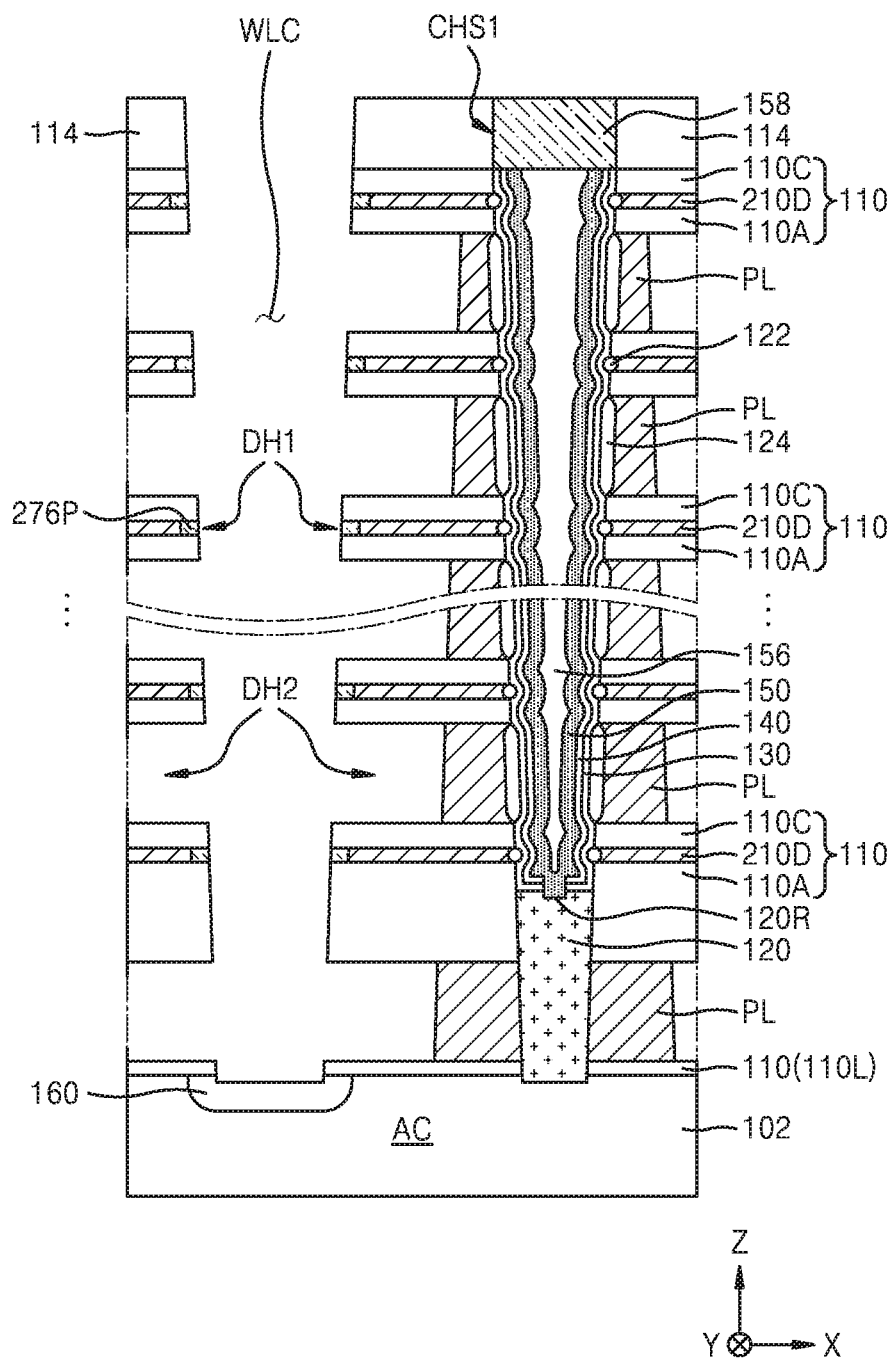

FIGS. 13A and 13B are cross-sectional views illustrating a method of manufacturing an integrated circuit device according to a process order according to other embodiments. In the present embodiment, a method of forming the plurality of word line structures WS1 and then dividing the charge trap film 130 into the plurality of charge trap patterns 130P will be described as another method of manufacturing the integrated circuit device 100 of FIGS. 2 through 4. FIGS. 13A and 13B are enlarged cross-sectional views illustrating the portion Q1 indicated by a dashed line in FIG. 3, like FIGS. 11A through 11J. In FIGS. 13A and 13B, the same elements as those in FIGS. 11A through 11J and FIGS. 12A through 12C are denoted by the same reference numerals, and a detailed explanation thereof will not be given.

Referring to FIG. 13A, after the first horizontal space DH1 is formed at the same level as that of the second insulating film 210D and the second horizontal space DH2 is formed at the same level as that of the sacrificial film PL by isotropically etching the sacrificial film PL and the second insulating film 210D through the word line cut region WLC by using the same method as that described with reference to FIG. 12A, a protective liner 276 conformably covering exposed elements in the first horizontal space DH1, the second horizontal space DH2, and the word line cut region WLC is formed.

The protective liner 276 may be formed to completely fill the first horizontal space DH1 and to partially fill the second horizontal space DH2. The protective liner 276 may be formed of polysilicon. CVD or ALD may be used to form the protective liner 276.

Referring to FIG. 13B, exposed portions of the protective liner 276 in the word line cut region WLC and the second horizontal space DH2 that are relatively large spaces are removed by isotropically etching the protective liner 276 on a resultant structure of FIG. 13A. In this case, by using an etch rate difference between a portion of the protective liner 276 that is first exposed in an isotropic etching atmosphere in a relatively large area and a portion of the protective liner 276 that is buried in a relatively narrow area and is exposed relatively late to the isotropic etching atmosphere, a portion of the protective liner 276 that fills the first horizontal space DH1 having a relatively small width may remain as a protective pattern 276P.

Next, the plurality of word line structures WS1 may be formed by removing the plurality of sacrificial films PL through the plurality of second horizontal spaces DH2 in a state where the second insulating film 210D is covered by the protective pattern 276P. Next, the plurality of first air-gap portions AG1 may be formed by removing the protective pattern 276P from the plurality of first horizontal spaces DH1 and removing the plurality of second insulating films 210D by using the same method as that described with reference to FIG. 12C, the plurality of second air-gap portions AG2 that are located between the plurality of charge trap patterns 130P may be formed by removing the plurality of sacrificial oxide films 122 through the word line cut region WLC and the plurality of first air-gap portions AG1 by using isotropic etching and dividing the charge trap film 130 into the plurality of charge trap patterns 130P by isotropically etching the charge trap film 130 that is exposed, the plurality of insulating plugs 164 closing entrances of the plurality of first air-gap portions AG1 close to the word line cut region WLC may be formed, and then the integrated circuit device 100 of FIG. 3 may be manufactured by performing processes of FIG. 11J.

Figure 14A:
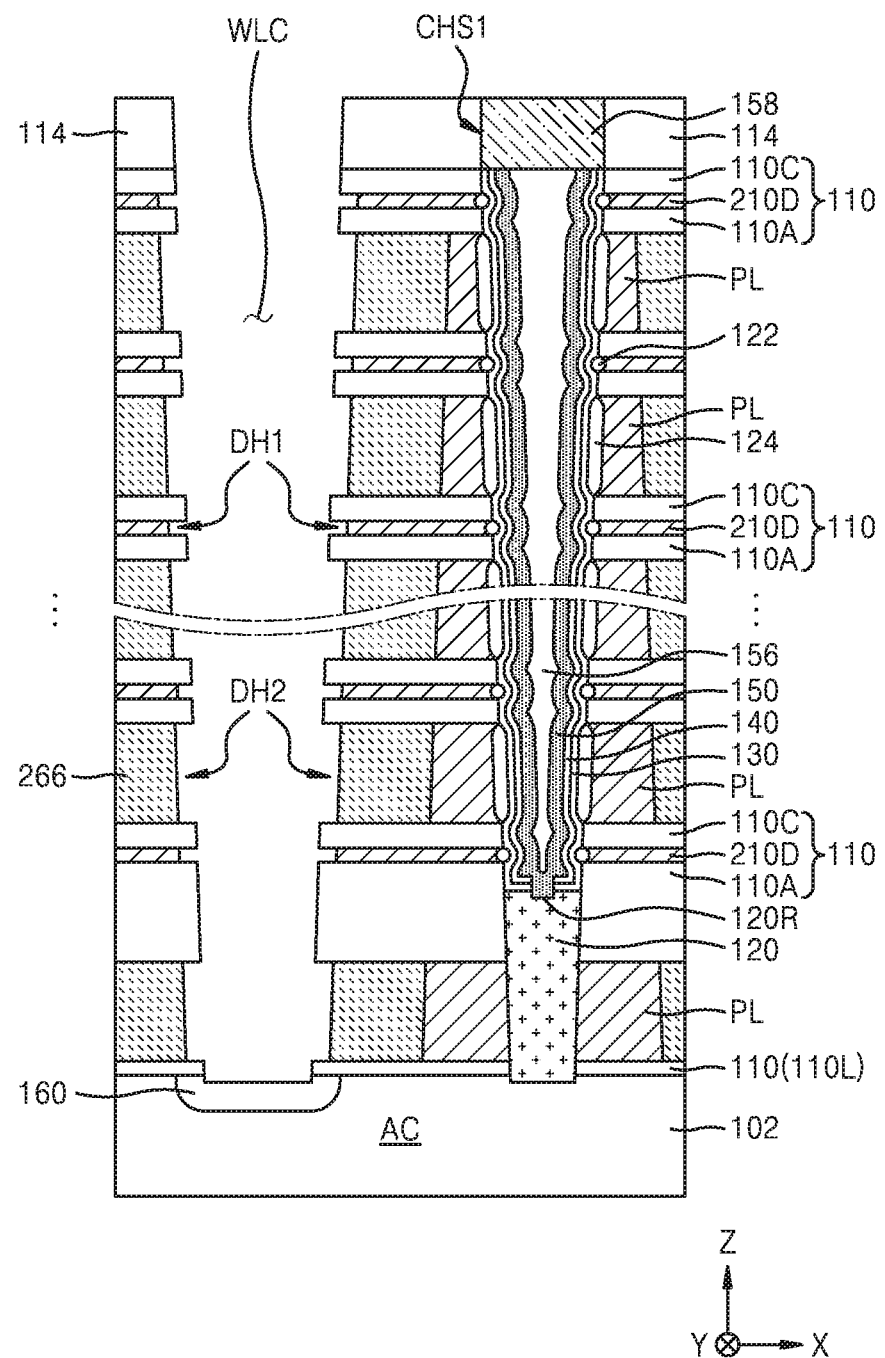
FIGS. 14A through 14C are cross-sectional views illustrating a method of manufacturing an integrated circuit device according to a process order according to other embodiments.
Figure 14B:
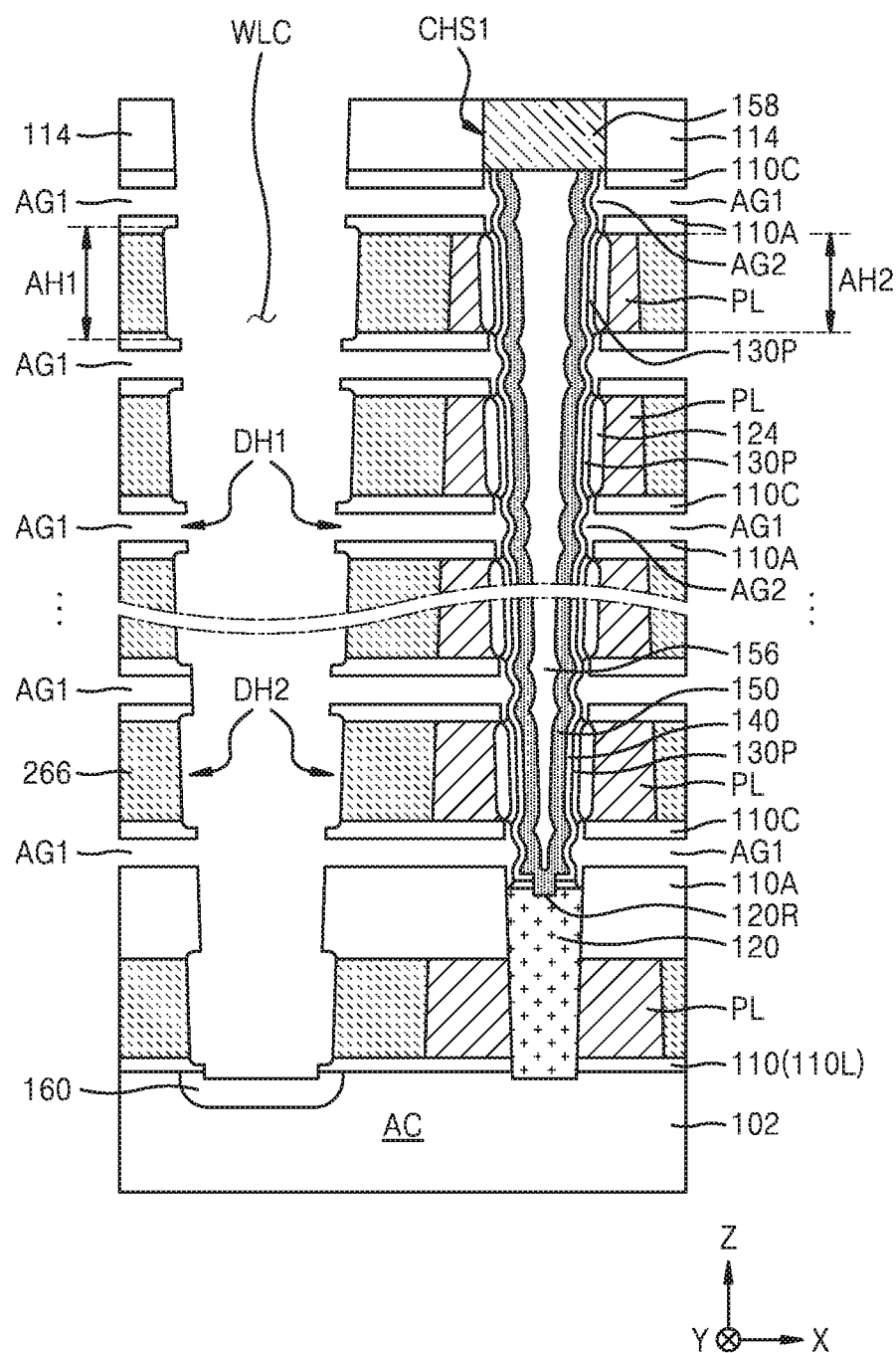
Figure 14C:
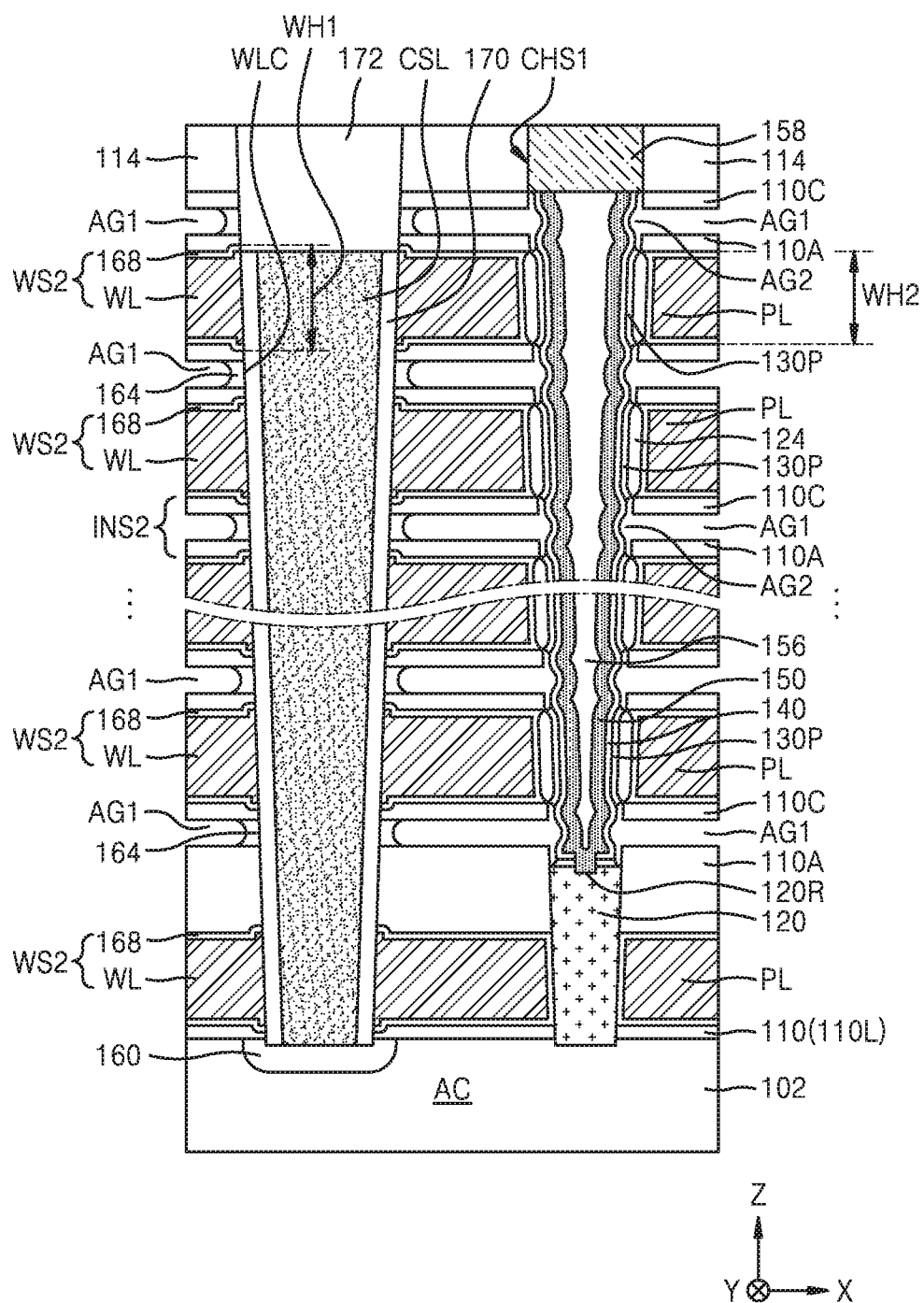

FIGS. 14A through 14C are cross-sectional views illustrating a method of manufacturing an integrated circuit device according to a process order according to other embodiments. In the present embodiment, a method of manufacturing the integrated circuit device 200 of FIGS. 5 and 6 will be described. FIGS. 14A through 14C are enlarged cross-sectional views illustrating a portion Q2 indicated by a dashed line in FIG. 5. In FIGS. 14A through 14C, the same elements as those of FIGS. 11A through 13B are denoted by the same reference numerals, and a detailed explanation thereof will not be given.

Referring to FIG. 14A, the word line cut region WLC and the common source region 160 may be formed by using the same method as that described with reference to FIGS. 11A through 11E. However, in the present embodiment, the second insulating film 210D formed of the same material as that of the sacrificial film PL, instead of the second insulating film 110B of the insulating film 110, is used, like in FIG. 12A.

After the plurality of first horizontal spaces DH1 and the plurality of second horizontal spaces DH2 are formed by isotropically etching the sacrificial film PL and the second insulating film 210D through the word line cut region WLC by using the same method as that described with reference to FIG. 12A, the protective film 266 covering the sacrificial film PL is formed in the plurality of second horizontal spaces DH2 by using the same method as that described with reference to FIG. 12B. However, in the present embodiment, a process of forming the protective oxide film 268 is omitted, unlike in FIG. 12B.

Referring to FIG. 14B, after the plurality of first air-gap portions AG1 are formed by removing the plurality of second insulating films 210D through the word line cut region WLC by using the same method as that described with reference to FIG. 12C, the plurality of second air-gap portions AG2 are formed by removing the plurality of sacrificial oxide films 122 and dividing the charge trap film 130 into the plurality of charge trap patterns 130P by isotropically etching the charge trap film 130.

While isotropic etching for forming the plurality of first air-gap portions AG1 and the plurality of second air-gap portions AG2 is performed multiple times, the protective film 266 may prevent removal of the sacrificial film PL. In contrast, portions of the first insulating film 110A and the third insulating film 110C exposed in the plurality of second air-gap portions AG2 and the word line cut region WLC may be partially removed while isotropic etching for forming the plurality of first air-gap portions AG1 and the plurality of second air-gap portions AG2 is performed multiple times. As a result, a horizontal width of the word line cut region WLC may be increased, and a height AH1 of an entrance portion of each of the plurality of second air-gap portions AG2 communicating with the word line cut region WLC may be greater than a height AH2 of an inner portion close to the blocking dielectric pattern 124.

Referring to FIG. 14C, after the plurality of insulating plugs 164 closing entrances of the plurality of first air-gap portions AG1 close to the word line cut region WLC are formed by using the same method as that described with reference to FIG. 11H on a resultant structure of FIG. 14B, the protective film 266 and the sacrificial film PL filling the plurality of second horizontal spaces DH2 are replaced with the word line structure WLS2 by using a method similar to that described with reference to FIG. 11I. As described with reference to FIG. 6, in each of the plurality of word line structures WLS2, the height WH1 of a side wall facing the common source line CSL may be greater than the height WH2 of a side wall facing the channel film 150.

The insulating structure INS2 including the first air-gap portion AG1, the first insulating film 110A and the third insulating film 110C for defining a height of the first air-gap portion AG1, and the insulating plug 164 may be located between the plurality of word line structures WLS2. A height of a side wall of the insulating structure INS2 facing the common source line CSL may be less than a portion closer to the channel film 150.

Next, the integrated circuit device 200 of FIG. 5 may be manufactured by performing processes of FIG. 11J

Figure 15:
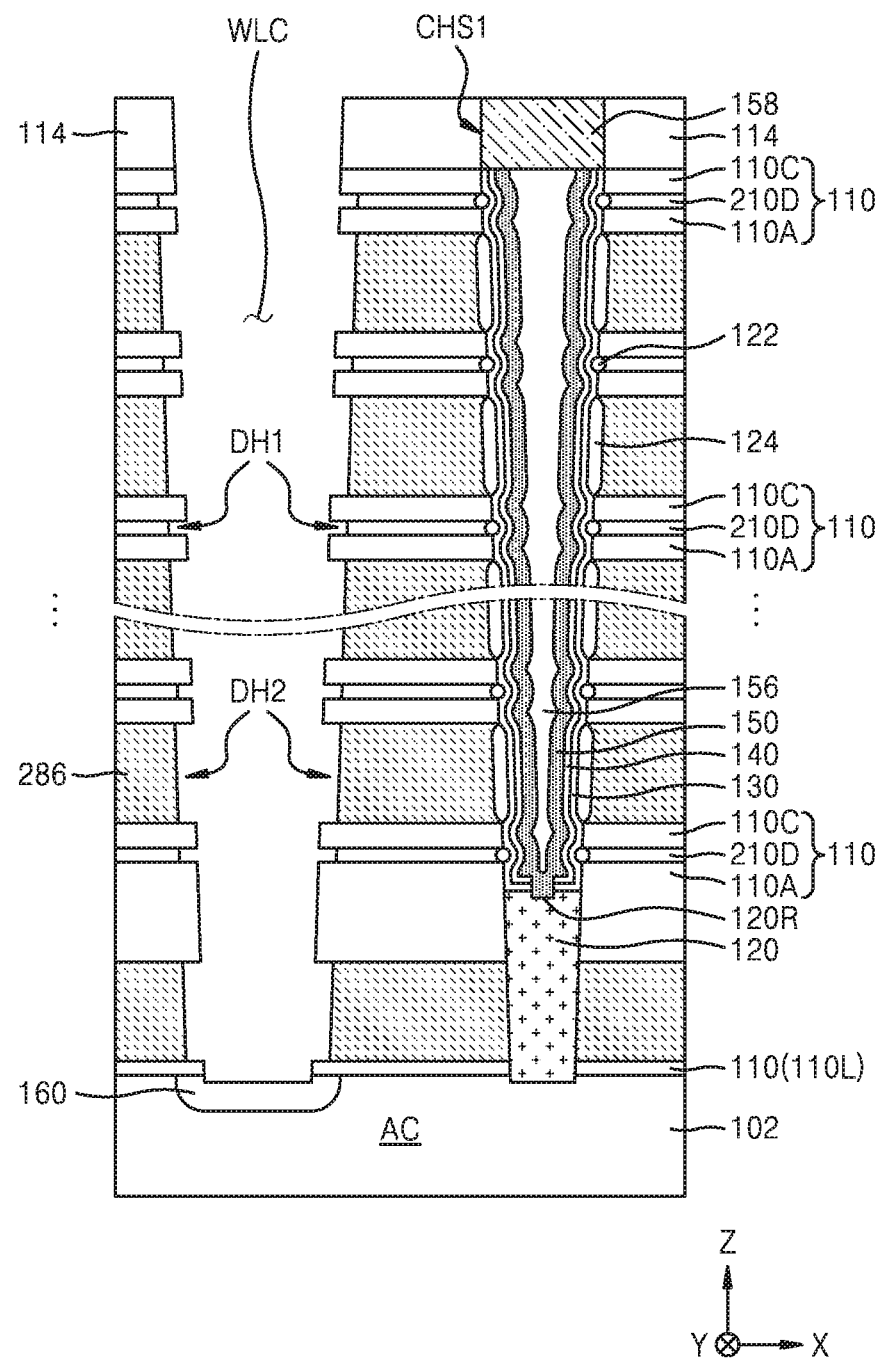
FIG. 15 is a cross-sectional view illustrating a method of manufacturing an integrated circuit device according to other embodiments.

FIG. 15 is a cross-sectional view illustrating a method of manufacturing an integrated circuit device according to other embodiments. In the present embodiment, another method of manufacturing the integrated circuit device 200 of FIGS. 5 and 6 will be described. FIG. 15 is an enlarged cross-sectional view illustrating the portion Q2 indicated by a dashed line in FIG. 5, like FIGS. 14A through 14C. In FIG. 15, the same elements as those of FIGS. 14A through 14C are denoted by the same reference numerals, and a detailed explanation thereof will not be given.

Referring to FIG. 15, a protective film 286 is formed in the plurality of horizontal spaces DH2 by using the same method as that used to form the protective film 266 of FIG. 14A. However, in the present embodiment, after the blocking dielectric pattern 124 is exposed in the plurality of second horizontal spaces DH2 by completely removing the sacrificial film PL, unlike in FIG. 14A, the protective film 286 may be formed in the plurality of second horizontal spaces DH2 to contact the blocking dielectric pattern 124. The protective film 286 may be formed of polysilicon.

Next, the integrated circuit device 200 of FIG. 4 may be manufactured by using the same method as that described with reference to FIGS. 14A and 14B.

FIGS. 16A through 16L are cross-sectional views illustrating a method of manufacturing an integrated circuit device according to a process order according to other embodiments. In the present embodiment, a method of manufacturing the integrated circuit device 300 of FIGS. 7 and 8 will be described. FIGS. 16A through 16I are enlarged cross-sectional views illustrating a portion Q3 indicated by a dashed line in FIG. 7 according to a process of manufacturing the integrated circuit device 300. In FIGS. 16A through 16L, the same elements as those of FIGS. 11A through 11J are denoted by the same reference numerals, and a repeated explanation thereof will not be given.

Figure 16A:
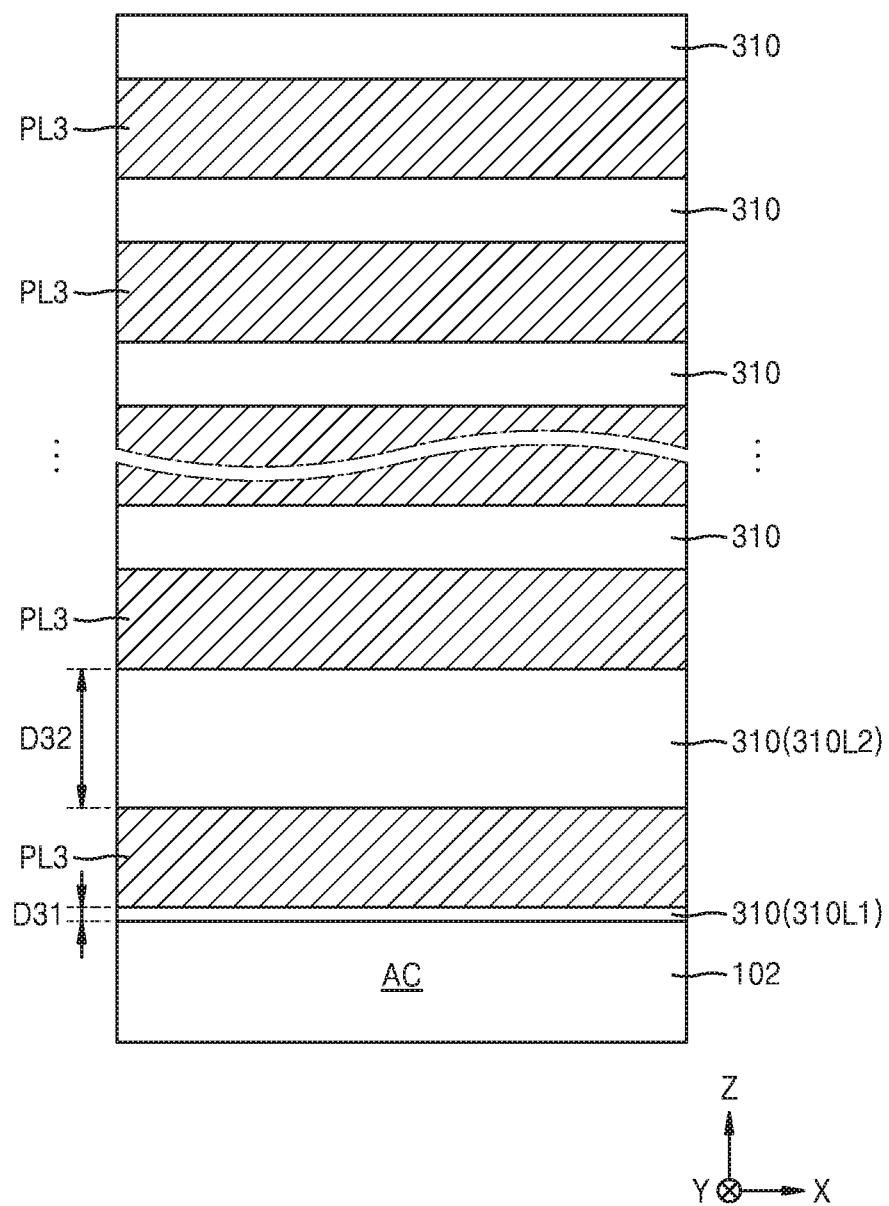
FIGS. 16A through 16L are cross-sectional views illustrating a method of manufacturing an integrated circuit device according to a process order according to other embodiments.

Referring to FIG. 16A, a device isolation film (not shown) for defining the active region AC is formed on the substrate 102, a plurality of first sacrificial films 310 and a plurality of second sacrificial films PL3 are alternately stacked on the substrate 102 one by one.

A first sacrificial film 310L1 that is a lowermost sacrificial film contacting the substrate 102 from among the plurality of first sacrificial films 310 may have a thickness D31 less than that of each of the other first sacrificial films 310. A first sacrificial film 310L2 that is a second film from the substrate 102 from among the plurality of first sacrificial films 310 may have a thickness D32 greater than that of each of the other first sacrificial films 310. The plurality of first sacrificial films 310 and the plurality of second sacrificial films PL3 may be formed of materials having different etch selectivities. In some embodiments, each of the plurality of first sacrificial films 310 may be formed of a silicon oxide film, and each of the plurality of second sacrificial films PL3 may be formed of a silicon nitride film.

Each of the plurality of second sacrificial films PL3 may provide a space for forming at least one ground selection line GSL, the plurality of word lines WL, and at least one string selection line SSL in a subsequent process.

Figure 16B:
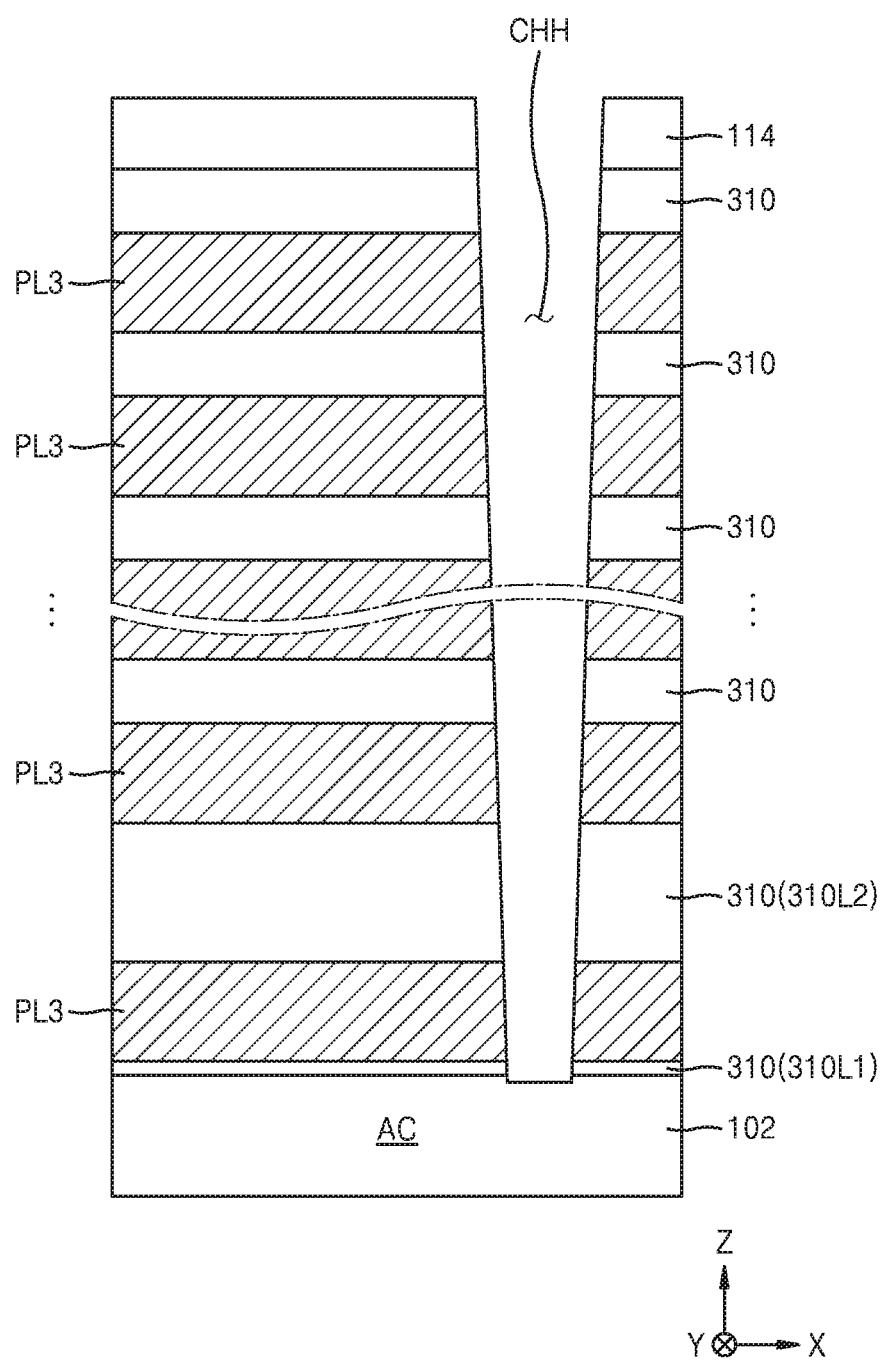

Referring to FIG. 16B, after the insulating pattern 114 is formed on the first sacrificial film 310 that is an uppermost layer from among the plurality of first sacrificial films 310, the channel hole CHH exposing the substrate 102 is formed by anisotropically etching the plurality of first sacrificial films 310 and the plurality of second sacrificial films PL3 by using the insulating pattern 1144 as an etch mask.

Figure 16C:
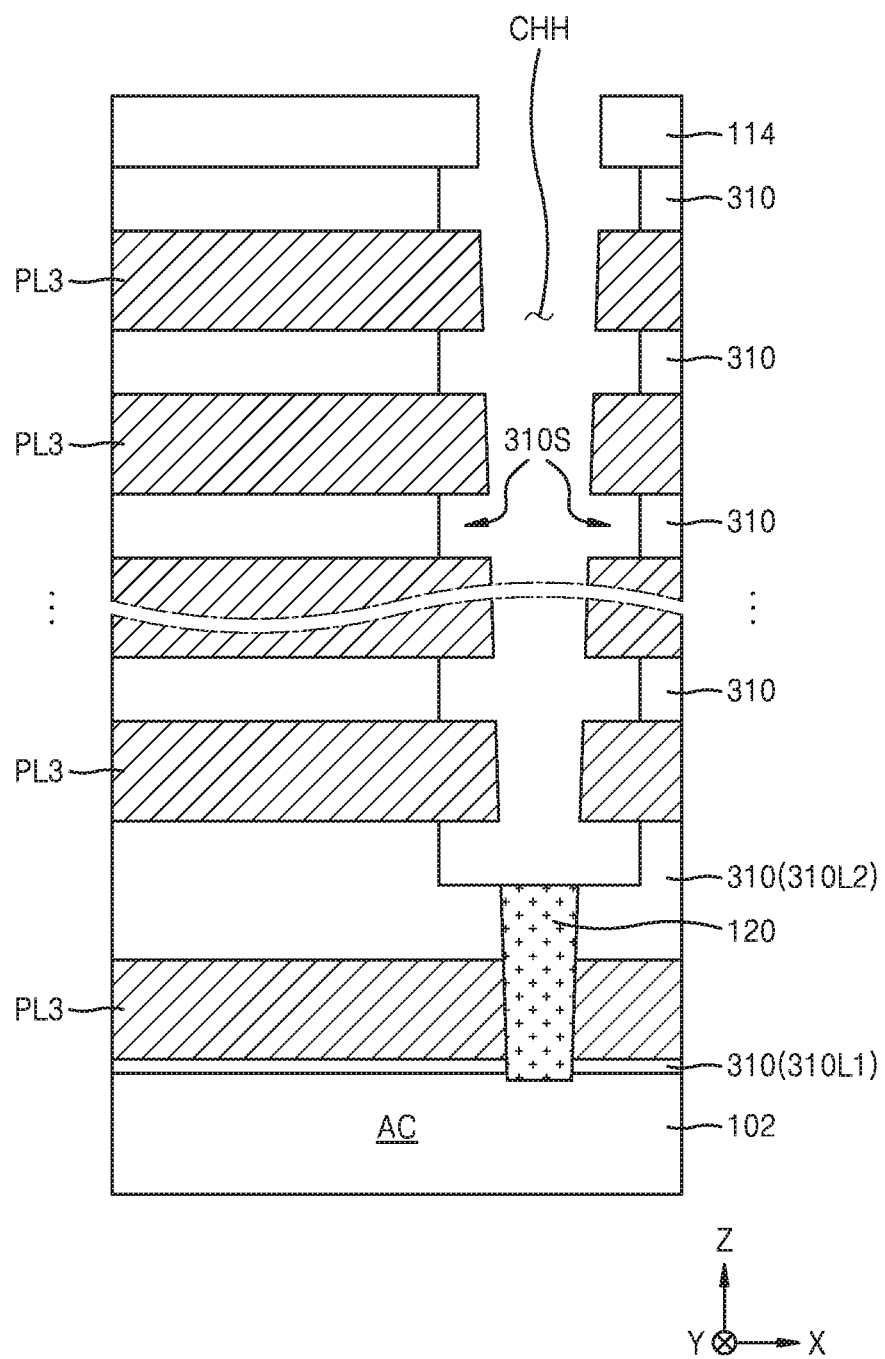

Referring to FIG. 16C, the semiconductor pattern 120 is formed at the bottom of the channel hole CHH (see FIG. 16B) by using a method similar to that described with reference to FIG. 11C.

Next, a plurality of indent spaces 310S communicating with the channel hole CHH are formed at the same level as those of the plurality of first sacrificial films 310 by selectively isotropically etching parts of the plurality of first sacrificial films 310 from the channel hole CHH.

Figure 16D:
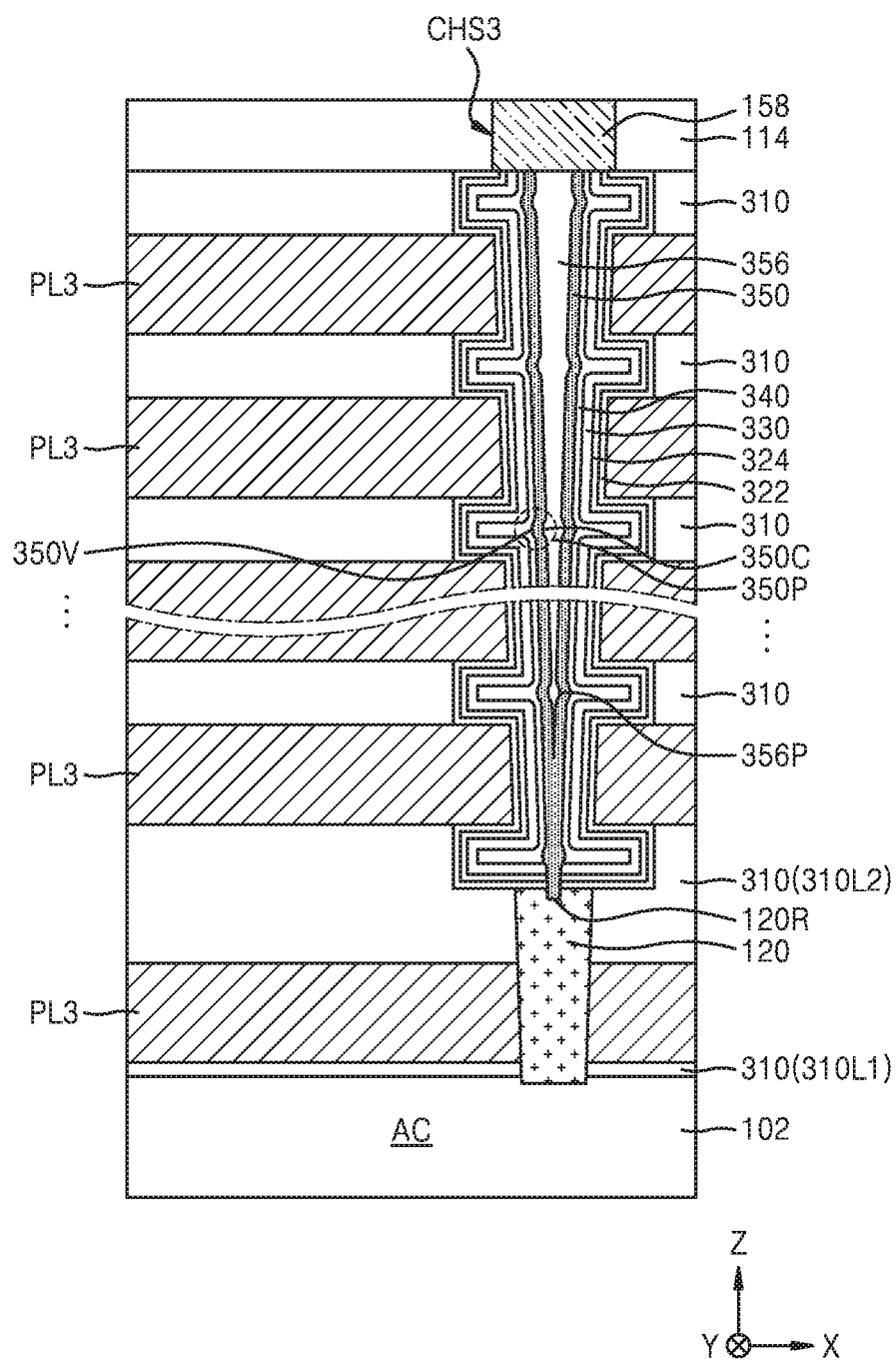

Referring to FIG. 16D, a stopper insulating film 322, the blocking dielectric film 324, a charge trap film 330, the tunneling dielectric film 340, the channel film 350, and the buried insulating film 356 conformably sequentially covering surfaces of the plurality of second sacrificial films PL3 exposed in the channel hole CHH and the plurality of indent spaces 310S are sequentially formed, and the drain region 158 filling an upper entrance portion of the channel hole CHH is formed.

In the channel hole CHH (see FIG. 16C), each of the stopper insulating film 322, the blocking dielectric film 324, the charge trap film 330, the tunneling dielectric film 340, and the channel film 350 may have a cylindrical shape, and may include portions protruding toward the plurality of indent spaces 310S (see FIG. 16C).

In a portion indicated by a dashed circle in FIG. 16D, the channel film 350 includes the plurality of curved portions 350P located at the same levels as those at which the plurality of first sacrificial films 310 are located. Each of the plurality of curved portions 350P may include the convex outer circumferential portion 350V facing the first sacrificial film 310 and the concave inner circumferential portion 350C extending toward the center of the channel hole CHH. An outer surface of the buried insulating film 356 may include the protrusion 356P facing the concave inner circumferential portion 350C of the channel film 350.

In a process of forming the stopper insulating film 322, the blocking dielectric film 324, the charge trap film 330, the tunneling dielectric film 340, and the channel film 350, a portion of a top surface of the semiconductor pattern 120 may be removed and the recess surface 120R may be formed on the top surface of the semiconductor pattern 120. The channel film 350 may contact the recess surface 120R of the semiconductor pattern 120.

Each of the stopper insulating film 322 and the charge trap film 330 may be formed of a silicon nitride film. The blocking dielectric film 324 may be formed of a silicon oxide film. The channel film 350 may be formed of polysilicon doped with impurities or polysilicon not doped with impurities. The buried insulating film 356 may be formed of a silicon oxide film.

A deposition process and an etch-back process may be performed multiple times to form the stopper insulating film 322, the blocking dielectric film 324, the charge trap film 330, the tunneling dielectric film 340, the channel film 350, and the buried insulating film 356. The deposition process may be selected from among, but not limited to, CVD, LPCVD, and ALD.

Figure 16E:
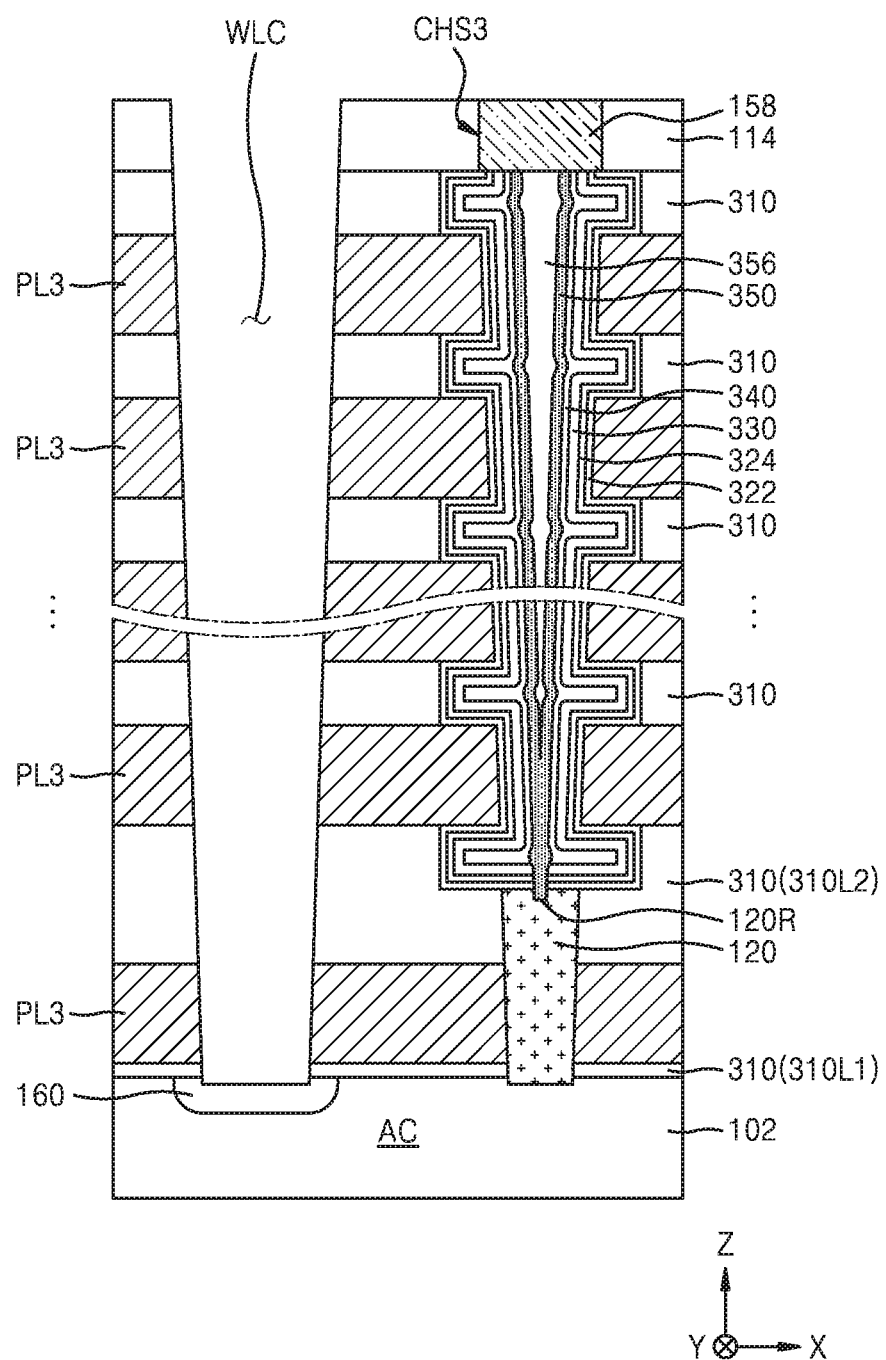

Referring to FIG. 16E, after the word line cut region WLC exposing the substrate 102 is formed by anisotropically etching the insulating pattern 114, the plurality of first sacrificial films 310, and the plurality of second sacrificial films PL3, the common source region 160 is formed by implanting impurity ions into the substrate 102 through the word line cut region WLC.

Figure 16F:
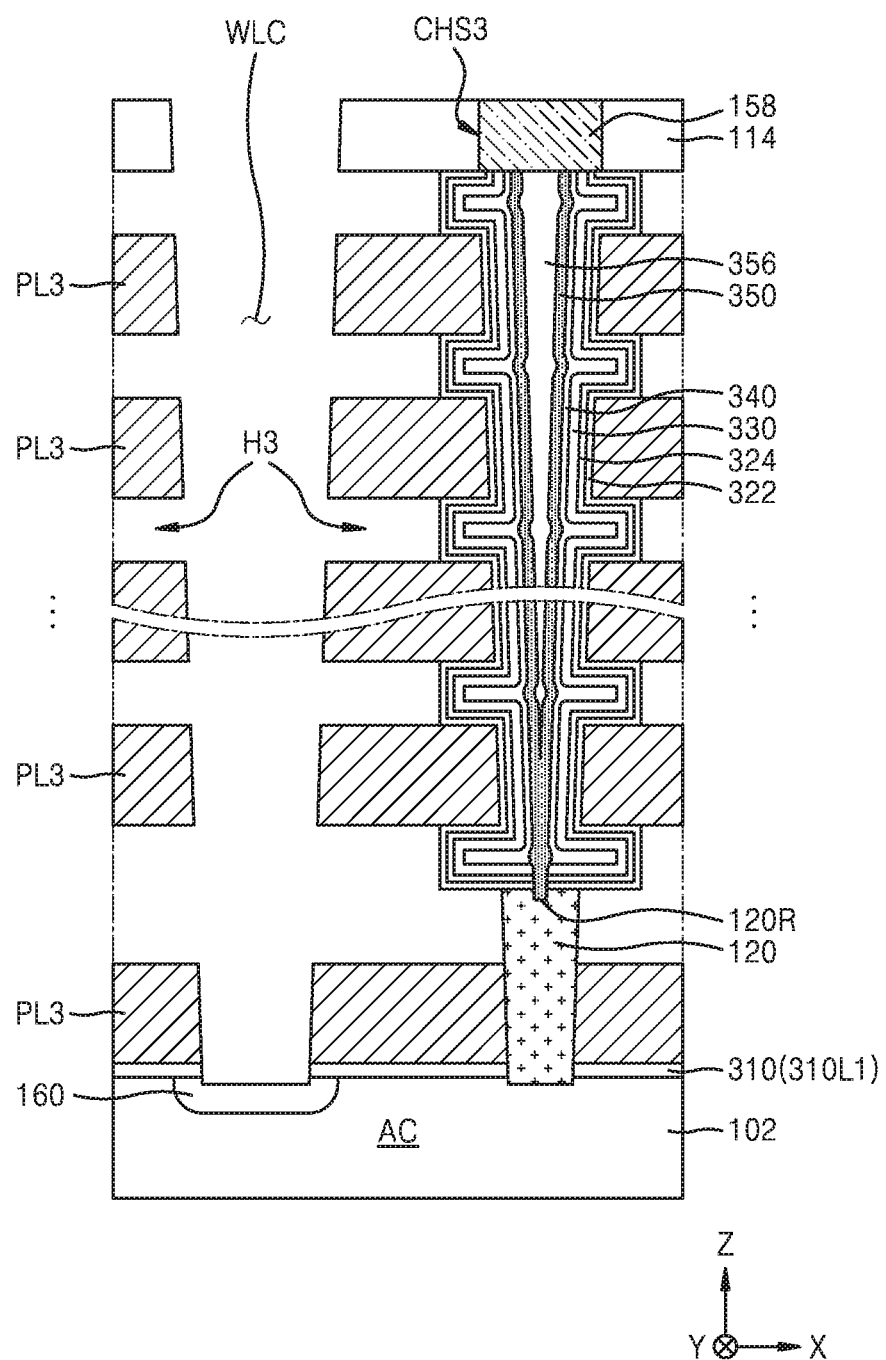

Referring to FIG. 16F, the plurality of first sacrificial films 310 are removed by using isotropic etching through the word line cut region WLC. In this case, the stopper insulating film 322 may be used as an etch stop film. After the plurality of first sacrificial films 310 are removed, a plurality of insulating spaces H3 located between the plurality of second sacrificial films PL3 and between the second sacrificial film PL3 that is an uppermost second sacrificial film and the insulating pattern 114 and communicating with the word line cut region WLC may be formed.

Figure 16G:
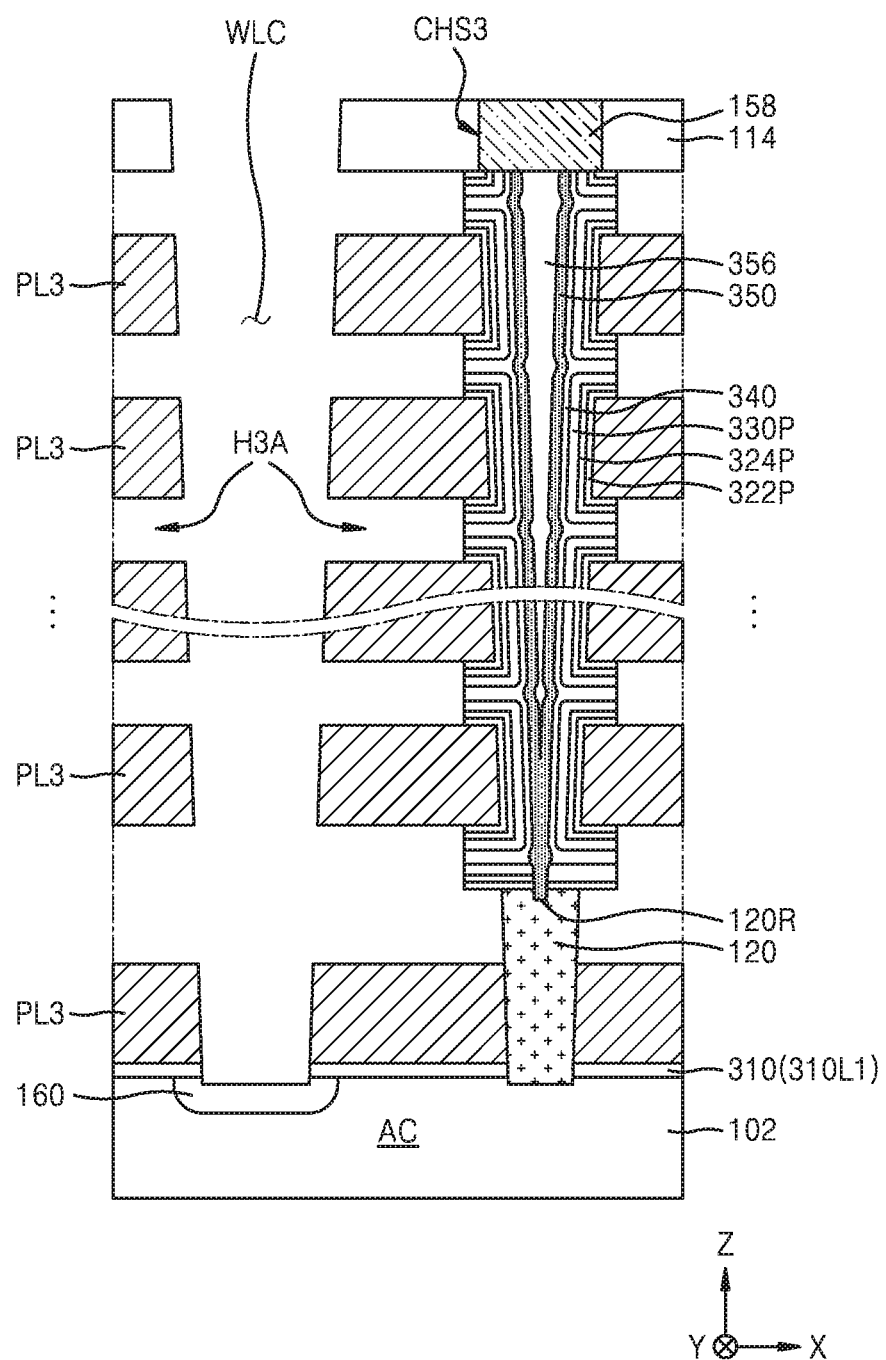

Referring to FIG. 16G, a plurality of expanded insulating spaces H3A each having a horizontal length greater than that of each of the plurality of insulating spaces H3 are formed by partially removing portions of the stopper insulating film 322, the blocking dielectric film 324, the charge trap film 330, and the tunneling dielectric film 340 that fill the plurality of indent spaces 310S (see FIG. 16C). As a result, the stopper insulating film 322 may be divided into the plurality of stopper insulating patterns 322P, the blocking dielectric film 324 may be divided into the plurality of blocking dielectric patterns 324P, and the charge trap film 330 may be divided into the plurality of charge trap patterns 330P.

Isotropic etching may be used to form the expanded insulating spaces H3A. Etching gas or etching solution for the isotropic etching may be supplied through the word line cut region WLC. The amount (referred to as etched amount) of each of the stopper insulating film 322, the blocking dielectric film 324, the charge trap film 330, and the tunneling dielectric film 340 etched during the isotropic etching may be controlled in various ways according to a distance from the substrate 102, a type of the etching gas or the etching solution, a size of the channel hole CHH, an inclination angle of an inner wall of the channel hole CHH, etc. In some embodiments, as a distance from the substrate 102 increases, the etched amount of at least one of the stopper insulating film 322, the blocking dielectric film 324, the charge trap film 330, and the tunneling dielectric film 340 may increase. In other embodiments, as a distance from the substrate 102 increases, the etched amount of at least one of the stopper insulating film 322, the blocking dielectric film 324, the charge trap film 330, and the tunneling dielectric film 340 may decrease. In other embodiments, the etched amounts of the stopper insulating film 322, the blocking dielectric film 324, the charge trap film 330, and the tunneling dielectric film 340 may be constant irrespective of distances from the substrate 102.

According to the etched amount of each of the stopper insulating film 322, the blocking dielectric film 324, the charge trap film 330, and the tunneling dielectric film 340 during the isotropic etching, a length of portions of each element extending in the X-direction may decrease away from the substrate 102, may increase away from the substrate 102, or may be constant irrespective of a distance from the substrate 102.

Figure 16H:
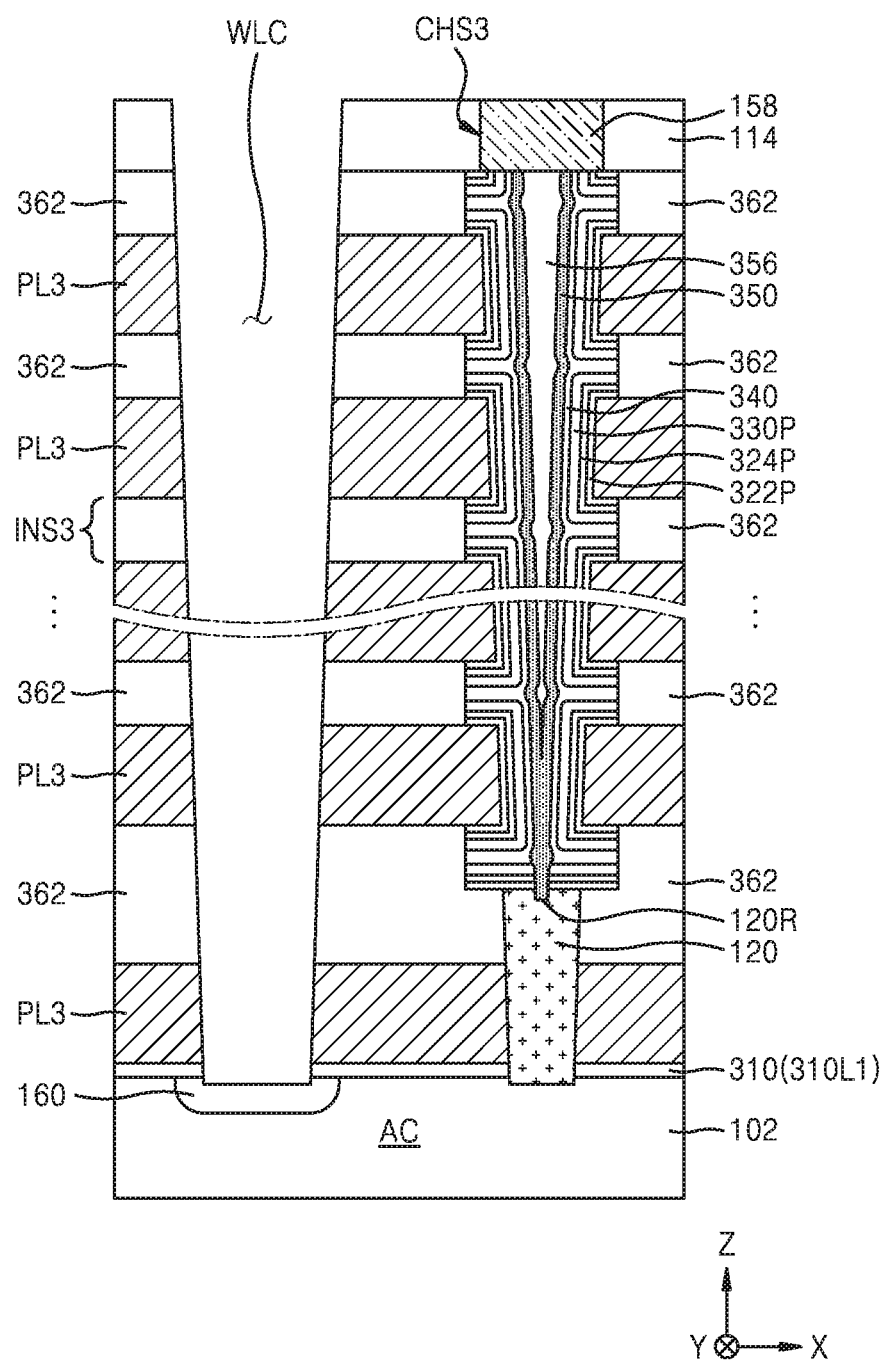

Referring to FIG. 16H, the inter-gate insulating pattern 362 filling the plurality of expanded insulating spaces H3A is formed. The inter-gate insulating pattern 362 may be formed of a silicon oxide film, an air-gap, or a combination thereof.

The insulating structure INS3 including the inter-gate insulating pattern 362, a part of the blocking dielectric pattern 324P, a part of the charge trap pattern 330P, and a part of the tunneling dielectric film 340 may be located between two adjacent second sacrificial films PL3 of the plurality of second sacrificial films PL3 that vertically overlap each other.

Figure 16I:
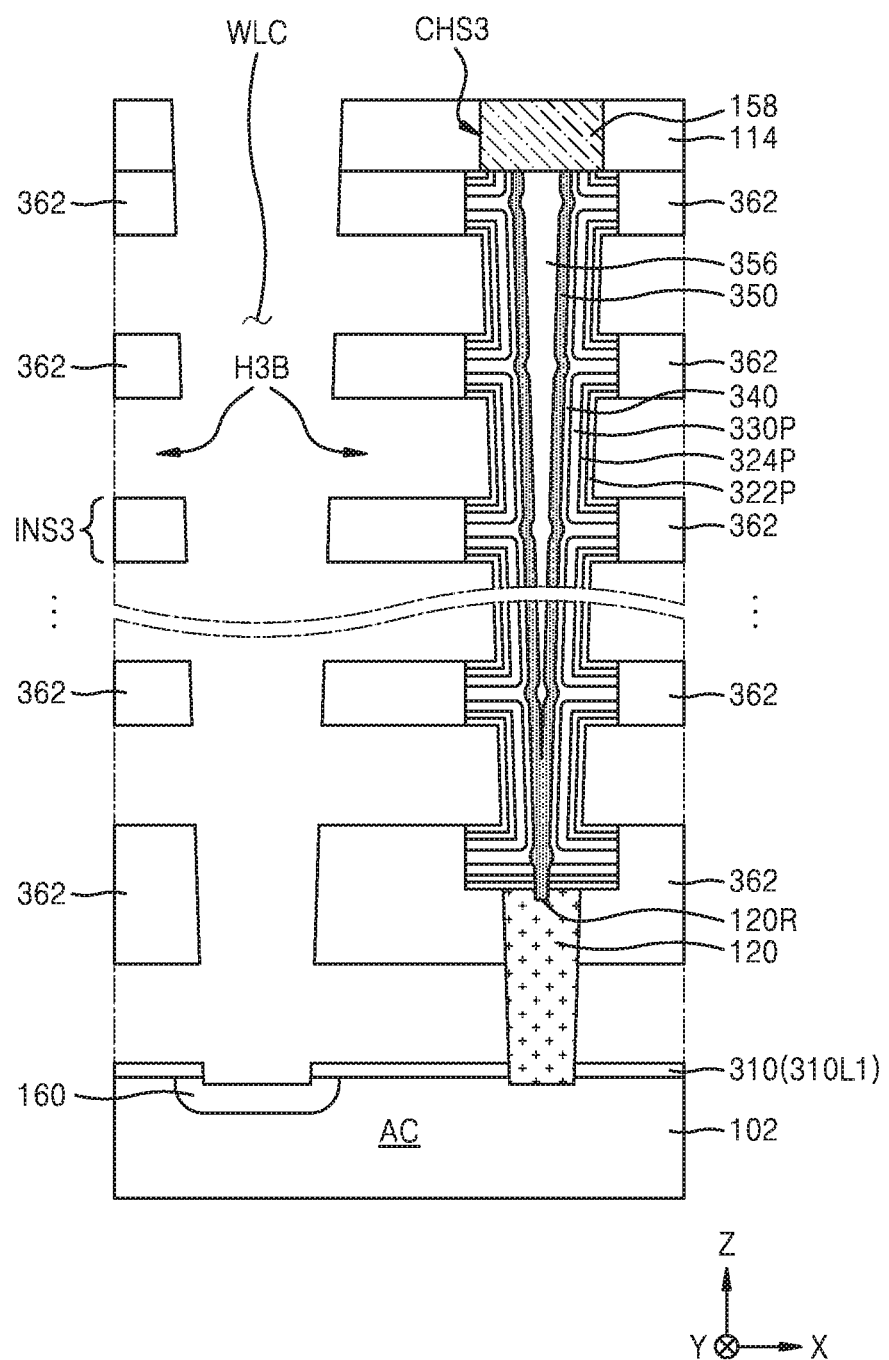

Referring to FIG. 16I, a word line space H3B exposing the stopper insulating pattern 322P is formed by removing the plurality of second sacrificial films PL3 from a resultant structure of FIG. 16H. When the plurality of second sacrificial films PL3 are removed, the stopper insulating pattern 322P may be used as an etch stop film. After the word line space H3B is formed, the stopper insulating pattern 322P may be exposed in the word line space H3B.

Figure 16J:
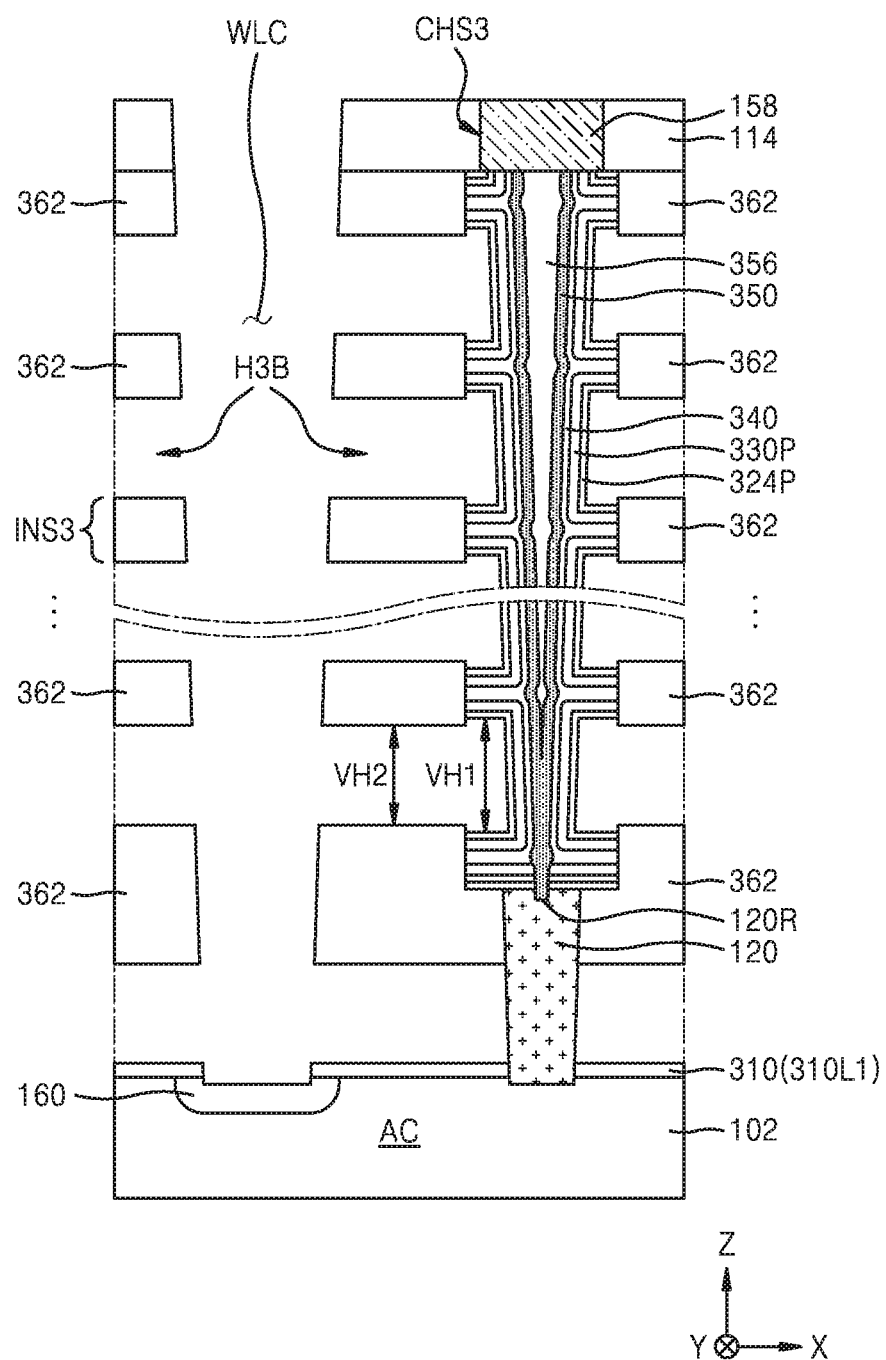

Referring to FIG. 16J, the blocking dielectric pattern 324P is exposed in the word line space H3B by removing the stopper insulating pattern 322P exposed through the word line cut region WLC and the plurality of word line spaces H3B.

After the stopper insulating pattern 322P exposed through the plurality of word line spaces H3B is removed, a vertical height VH1 of a portion of each of the plurality of word line spaces H3B close to the channel film 350 may be greater than a vertical height VH2 of a portion of each of the plurality of word line spaces H3B close to the word line cut region WLC.

Figure 16K:
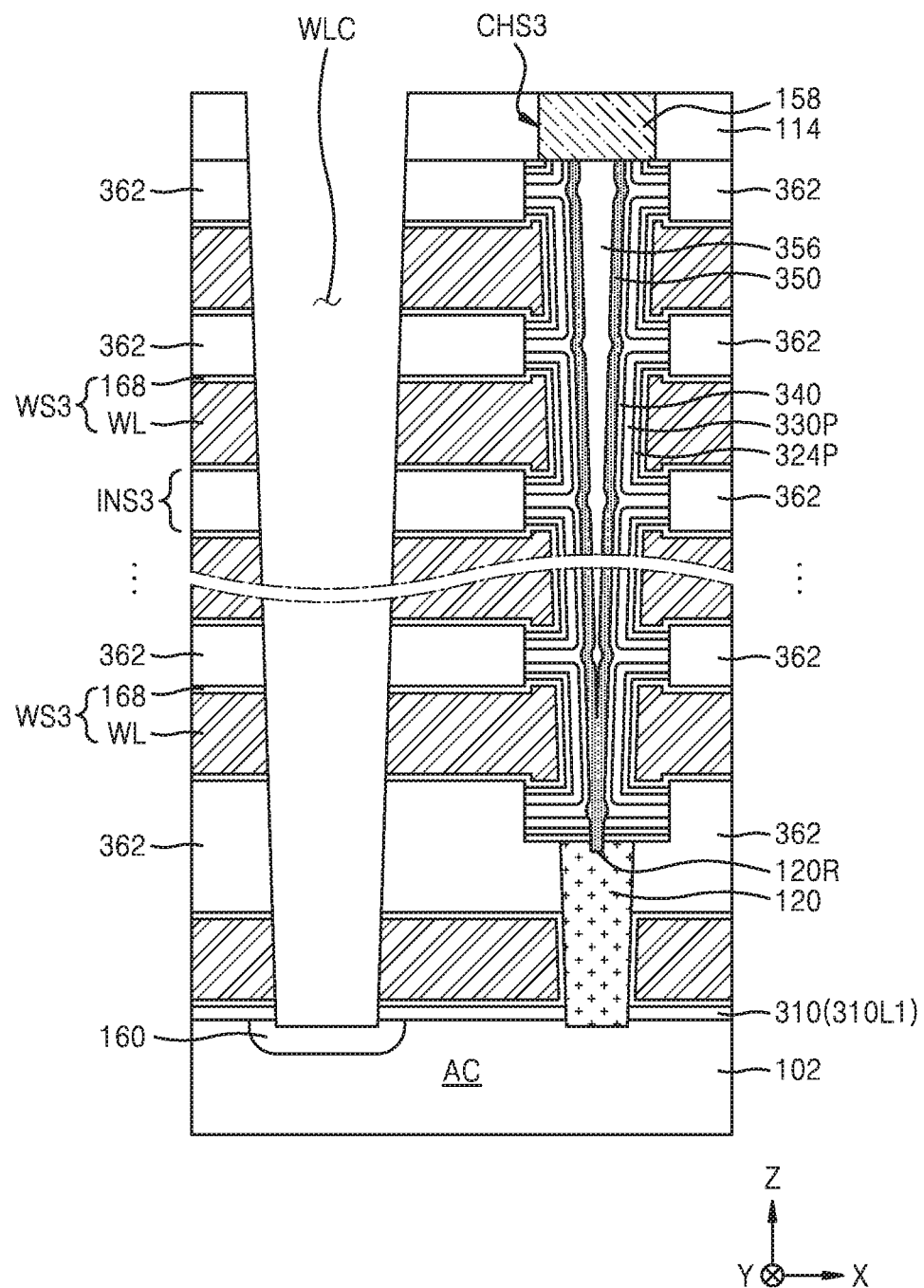

Referring to FIG. 16K, the plurality of word line structures WS3 filling the plurality of word line spaces H3B are formed. Each of the plurality of word line structures WS3 may include the word line WL and the dielectric thin film 168. As described with reference to FIG. 8, the height WH3 of the side wall S3 facing the channel film 350 may be greater than the height WH4 of the side wall S4 facing the word line cut region WLC.

Figure 16L:
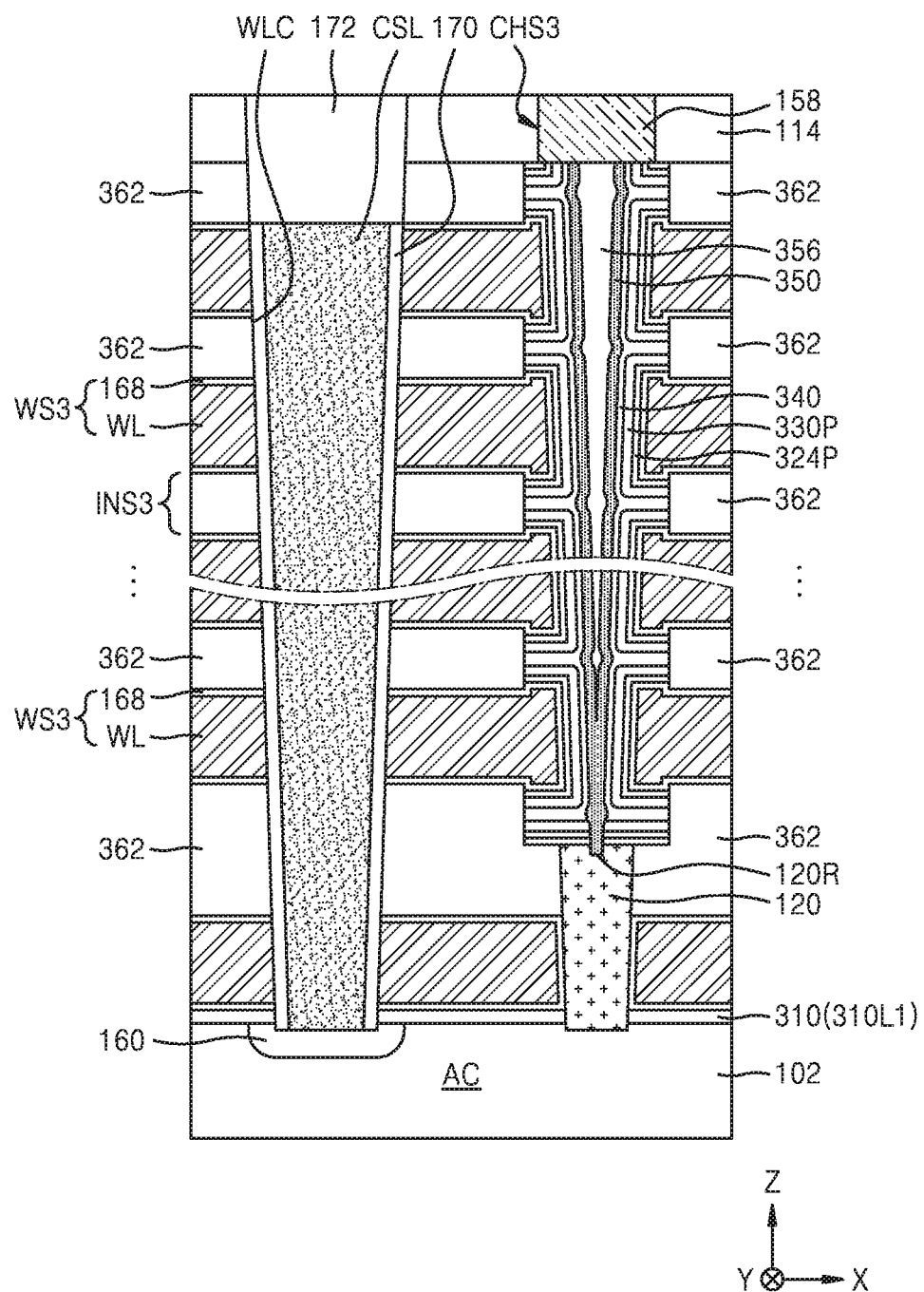

Referring to FIG. 16L, the insulating spacer 170, the common source line CSL, and the capping insulating film 172 are formed in the word line cut region WLC by using a method similar to that described with reference to FIG. 11J.

Next, the integrated circuit device 300 of FIG. 7 may be manufactured by forming the insulating film 180, the insulating film 184 filling the string selection line cut region SSLC, the plurality of bit line contact pads 182, and the plurality of bit lines BL.

FIGS. 17A through 17D are cross-sectional views illustrating a method of manufacturing an integrated circuit device according to a process order according to other embodiments. In the present embodiment, a method of manufacturing the integrated circuit device 400 of FIGS. 9 and 10 will be described. FIGS. 17A through 17D are enlarged cross-sectional views illustrating a portion Q4 indicated by a dashed line in FIG. 9. In FIGS. 17A through 17D, the same elements as those of FIGS. 11A through 16L are denoted by the same reference numerals, and a detailed explanation thereof will not be given.

Figure 17A:
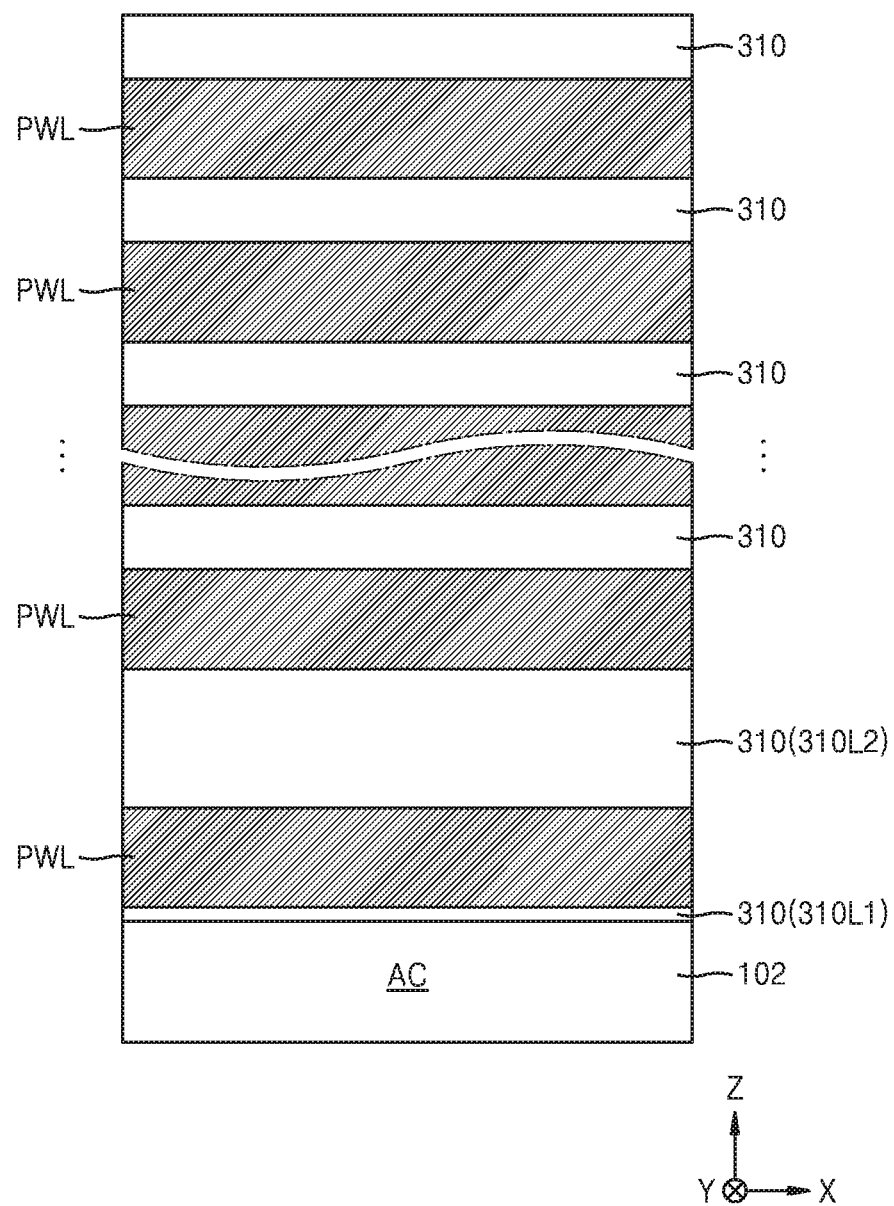
FIGS. 17A through 17D are cross-sectional views illustrating a method of manufacturing an integrated circuit device according to a process order according to other embodiments.

Referring to FIG. 17A, the active region AC is defined on the substrate 102, and the plurality of first sacrificial films 310 and a plurality of pre-word line layers PWL are alternately stacked on the substrate 102 one by one. Each of the plurality of first sacrificial films 310 may be formed of a silicon oxide film, and each of the plurality of pre-word line layers PWL may be formed of doped polysilicon.

Figure 17B:
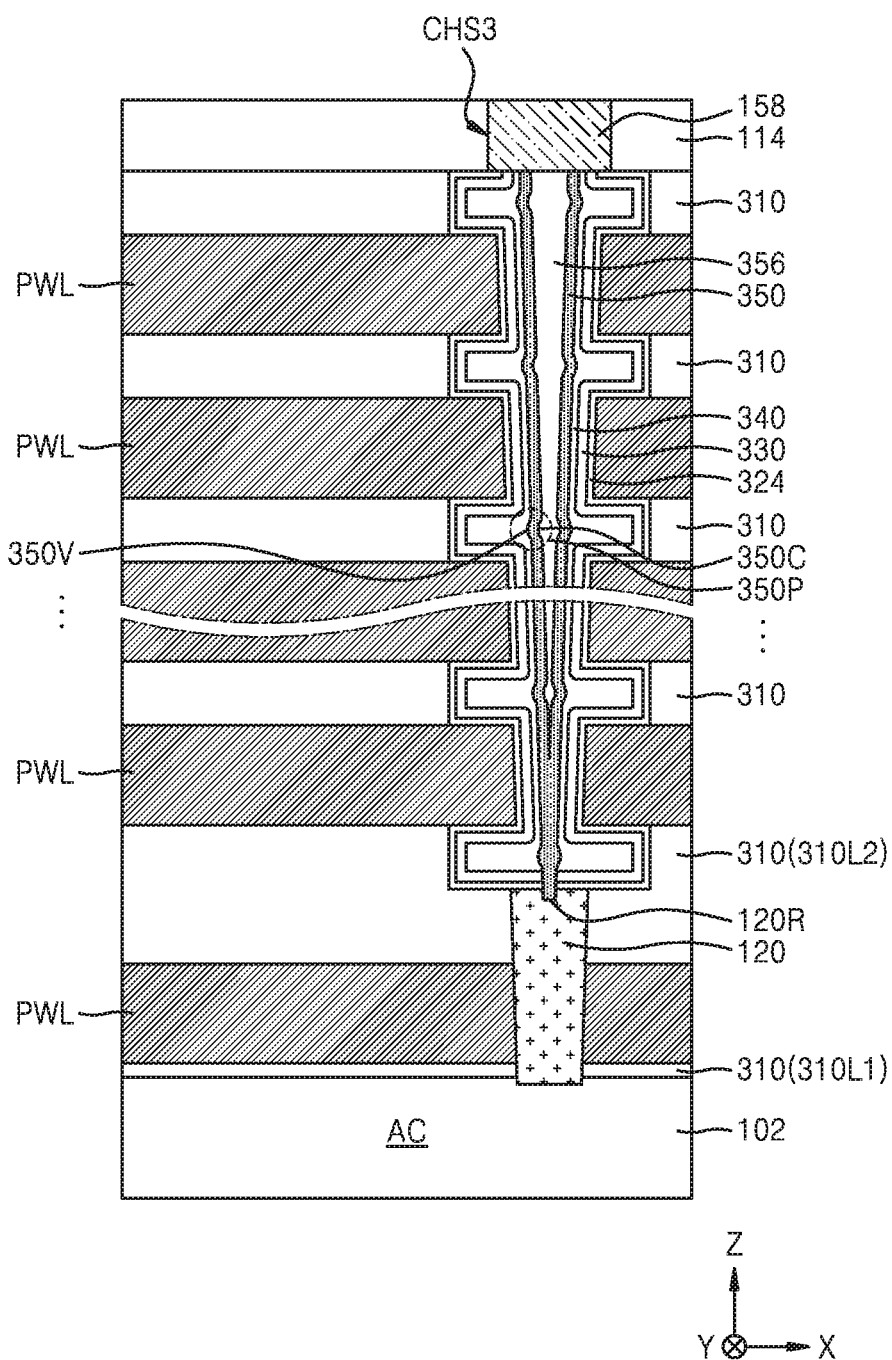

Referring to FIG. 17B, processes similar to those described with reference to FIGS. 16B through 16D are performed on a resultant structure of FIG. 17A. However, unlike in FIG. 16D in which the stopper insulating film 322, the blocking dielectric film 324, the charge trap film 330, the tunneling dielectric film 340, the channel film 350, and the buried insulating film 356 conformably sequentially covering surfaces of the plurality of second sacrificial films PL3 are sequentially formed, the blocking dielectric film 324, the charge trap film 330, the tunneling dielectric film 340, the channel film 350, and the buried insulating film 356 conformably sequentially covering surfaces of the plurality of pre-word line layers PWL are sequentially formed in the present embodiment. In the present embodiment, a process of forming the stopper insulating film 322 is omitted.

Figure 17C:
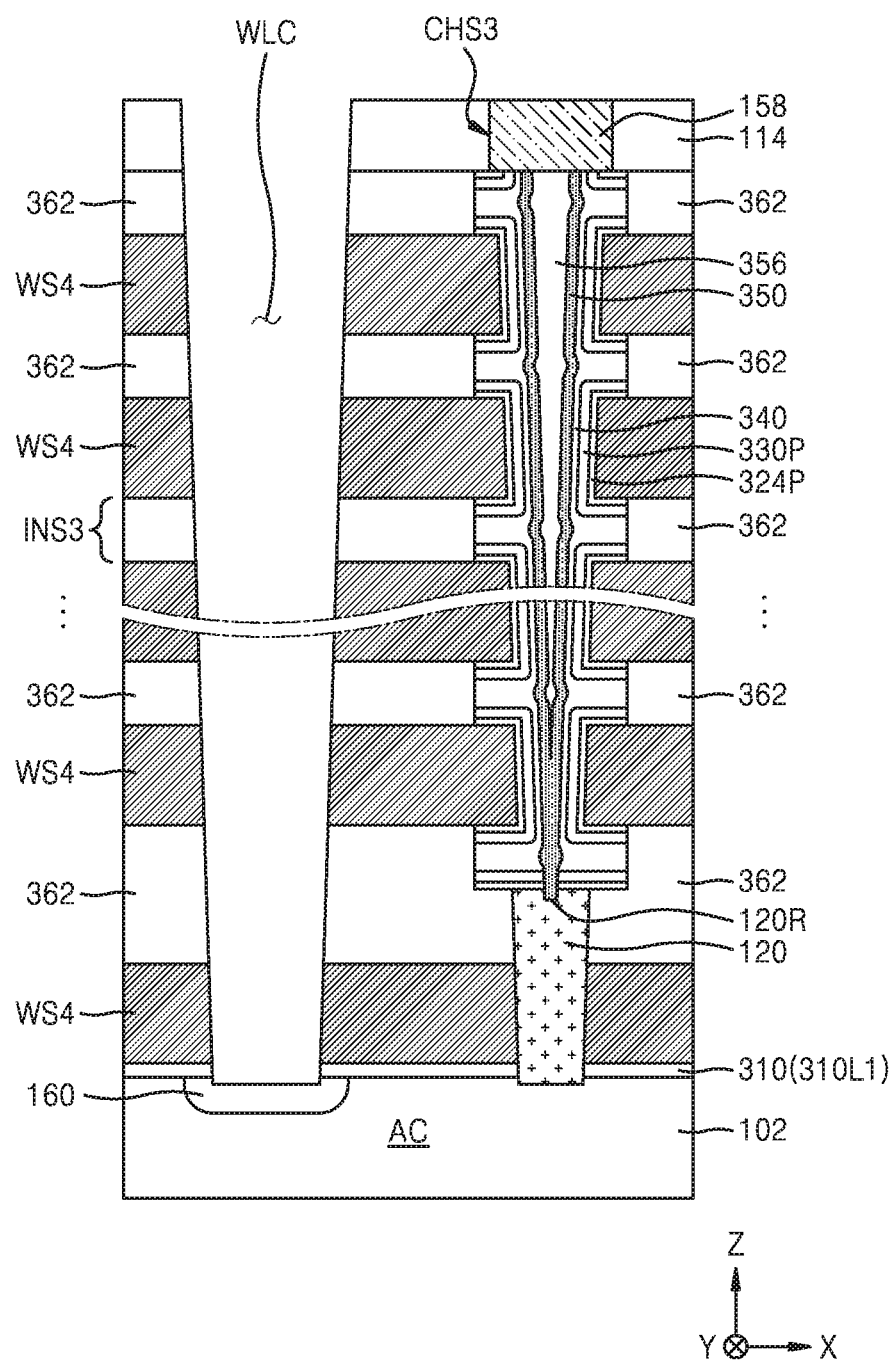

Referring to FIG. 17C, processes similar to those described with reference to FIGS. 16F through 16H are performed on a resultant structure of FIG. 17B. As a result, the blocking dielectric film 324 may be divided into the plurality of blocking dielectric patterns 324P, the charge trap film 330 may be divided into the plurality of charge trap patterns 330P, and the plurality of pre-word line layers PWL may be divided into the plurality of word line structures WS4 by the word line cut region WLC.

Figure 17D:
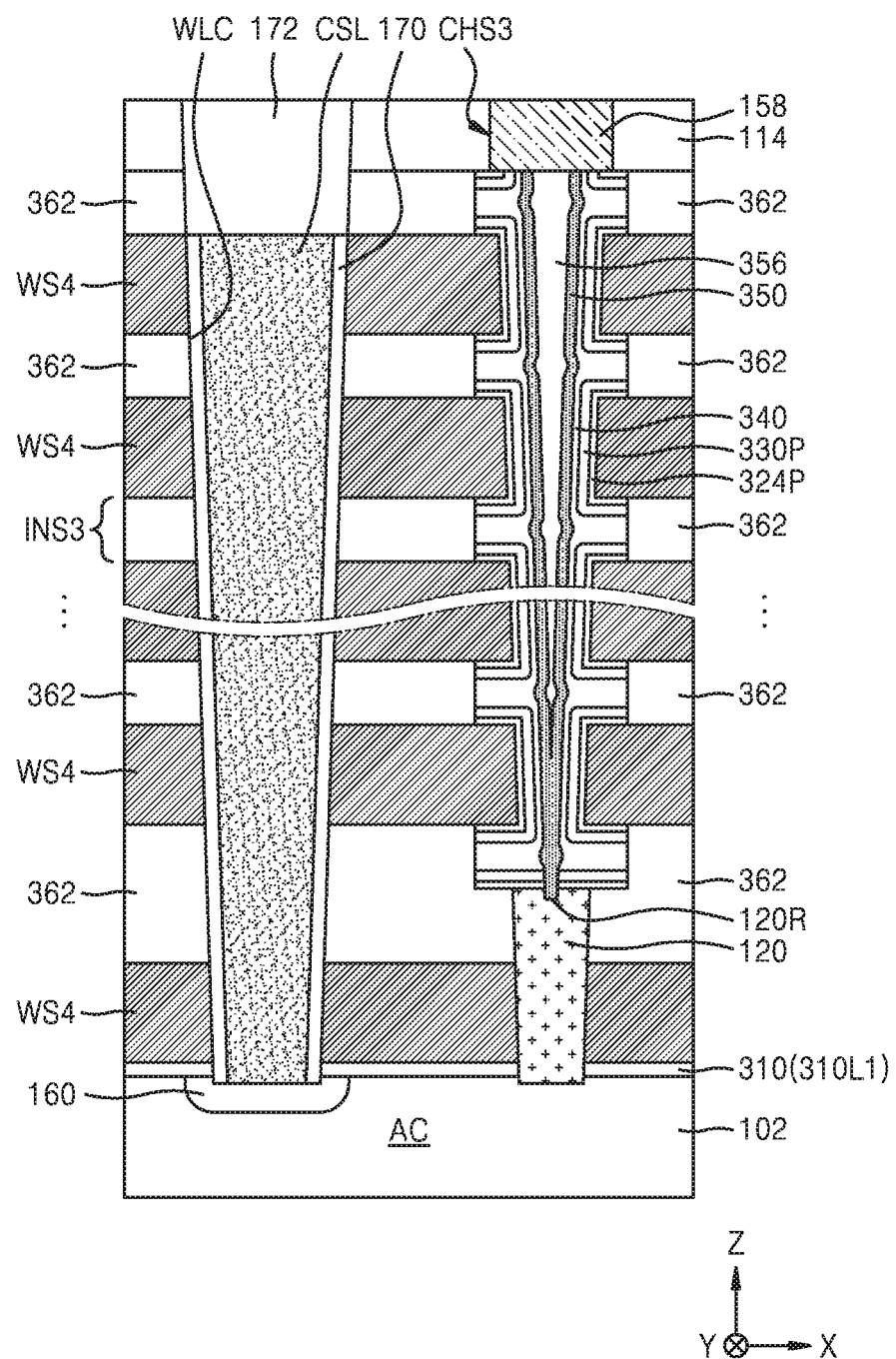

Referring to FIG. 17D, the insulating spacer 170, the common source line CSL, and the insulating film 184 are formed in the word line cut region WLC by using a method similar to that described with reference to FIG. 11J.

Next, the integrated circuit device 400 of FIG. 6 may be manufactured by forming the insulating film 180, the insulating film 184 filling the string selection line cut region SSLC, the plurality of bit line contact pads 182, and the plurality of bit lines BL.

Figure 18:
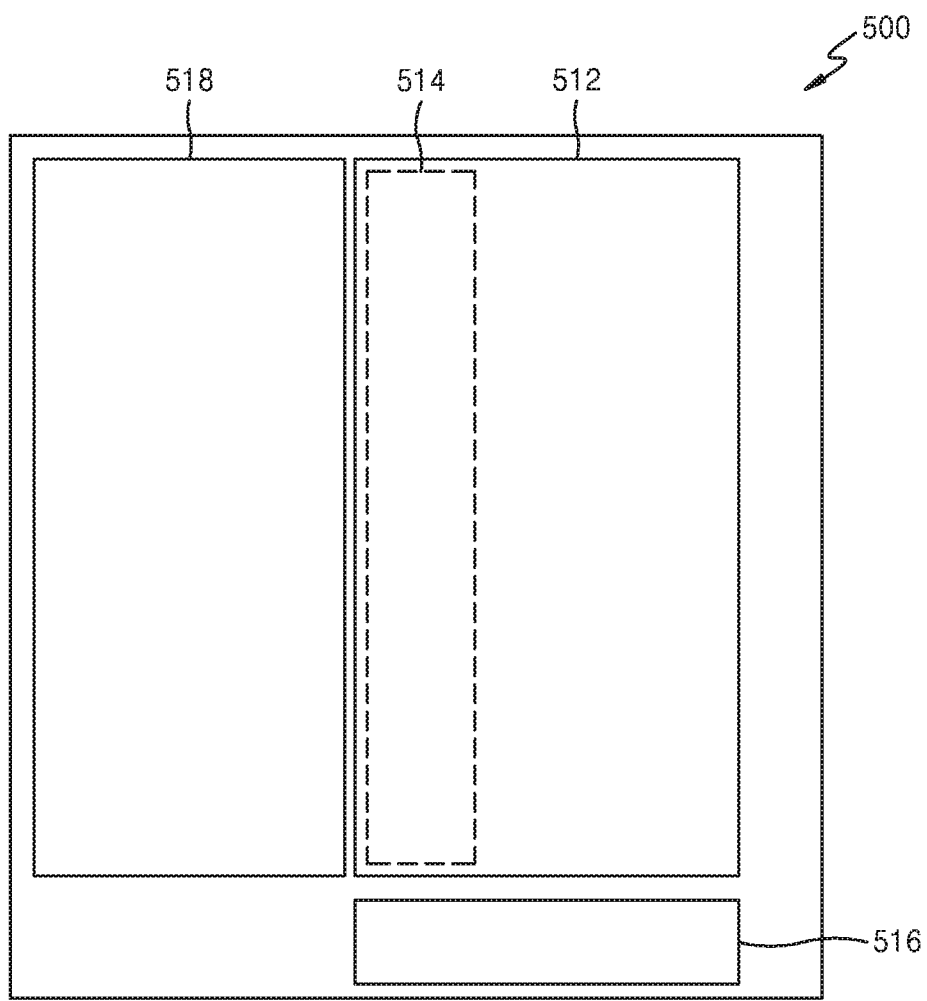
FIG. 18 is a plan layout diagram illustrating main regions of an integrated circuit device according to other embodiments.

FIG. 18 is a plan layout diagram illustrating main regions of an integrated circuit device according to other embodiments.

Referring to FIG. 18, an integrated circuit device 500 may include a memory cell array region 512, a first peripheral circuit region 514, a second peripheral circuit region 516, and a bonding pad region 518.

The memory cell array region 512 may include the plurality of memory cell arrays MCA constructed as described with reference to FIG. 1.

Each of the first peripheral circuit region 514 and the second peripheral circuit region 516 may include a controller that controls data input to or output from the memory cell array region 512. Peripheral circuits for driving vertical memory cells included in the memory cell array region 512 may be located in the first peripheral circuit region 514 and the second peripheral circuit region 516.

A planar size of a chip including the integrated circuit device 500 may be reduced by locating the first peripheral circuit region 514 to vertically overlap the memory cell array region 512.

In some embodiments, the peripheral circuits located in the first peripheral circuit region 514 may be circuits that may process at a high speed data input/output to/from the memory cell array region 512. For example, the peripheral circuits located in the first peripheral circuit region 514 may include a page buffer, a latch circuit, a cache circuit, a column decoder, a sense amplifier, or a data in/out circuit.

The second peripheral circuit region 516 may be located at a side of the memory cell array region 512 not to overlap the memory cell array region 512 and the first peripheral circuit region 514. The peripheral circuits formed in the second peripheral circuit region 516 may include, for example, a row decoder. In some embodiments, unlike in FIG. 18, at least a part of the second peripheral circuit region 516 may be located under the memory cell array region 512.

The bonding pad region 518 may be formed at another side of the memory cell array region 512. Wirings connected from word lines of vertical memory cells of the memory cell array region 512 may be formed in the bonding pad region 518.

Figure 19A:
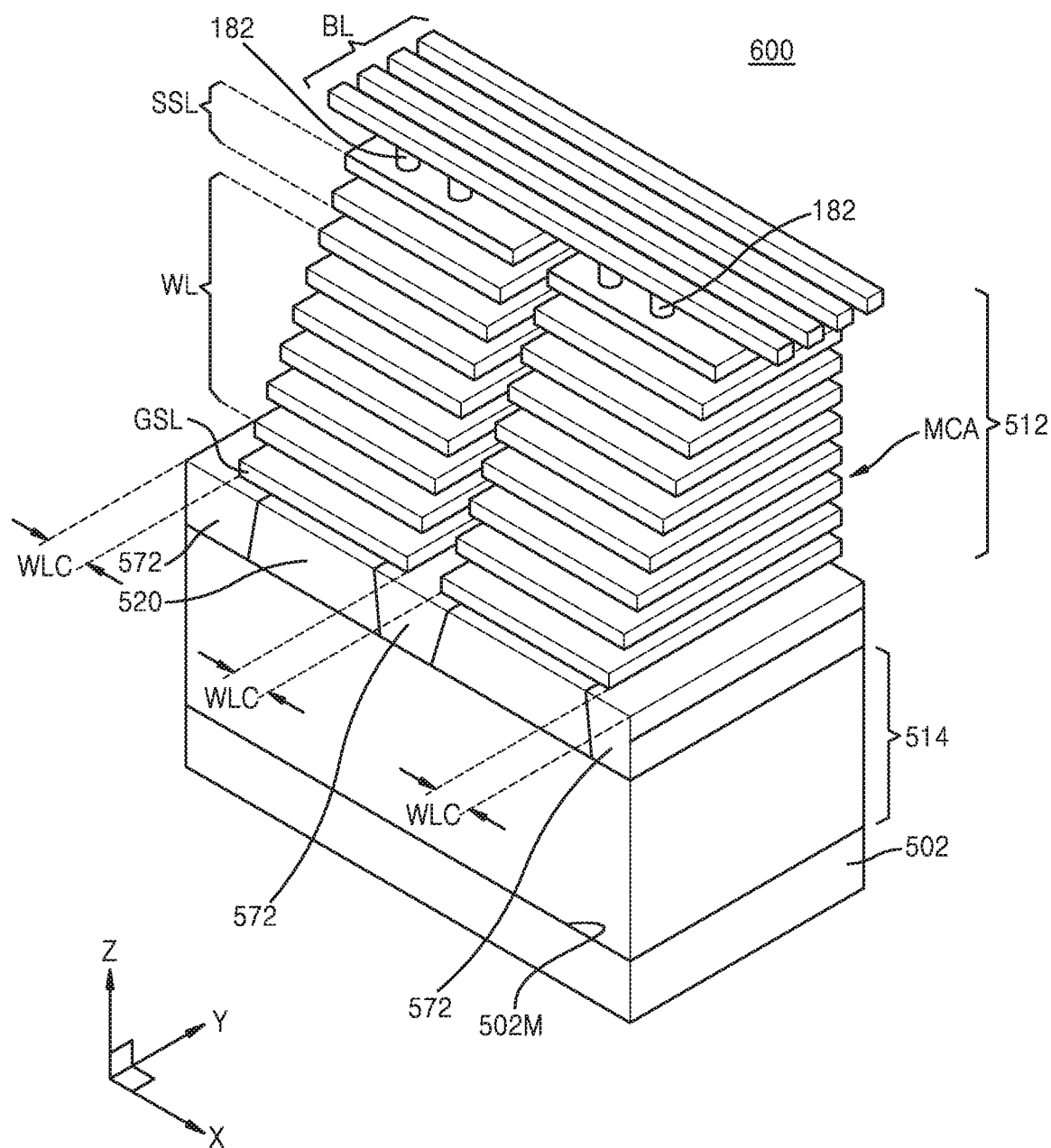
FIG. 19A is a perspective view of an integrated circuit device according to other embodiments.
Figure 19B:
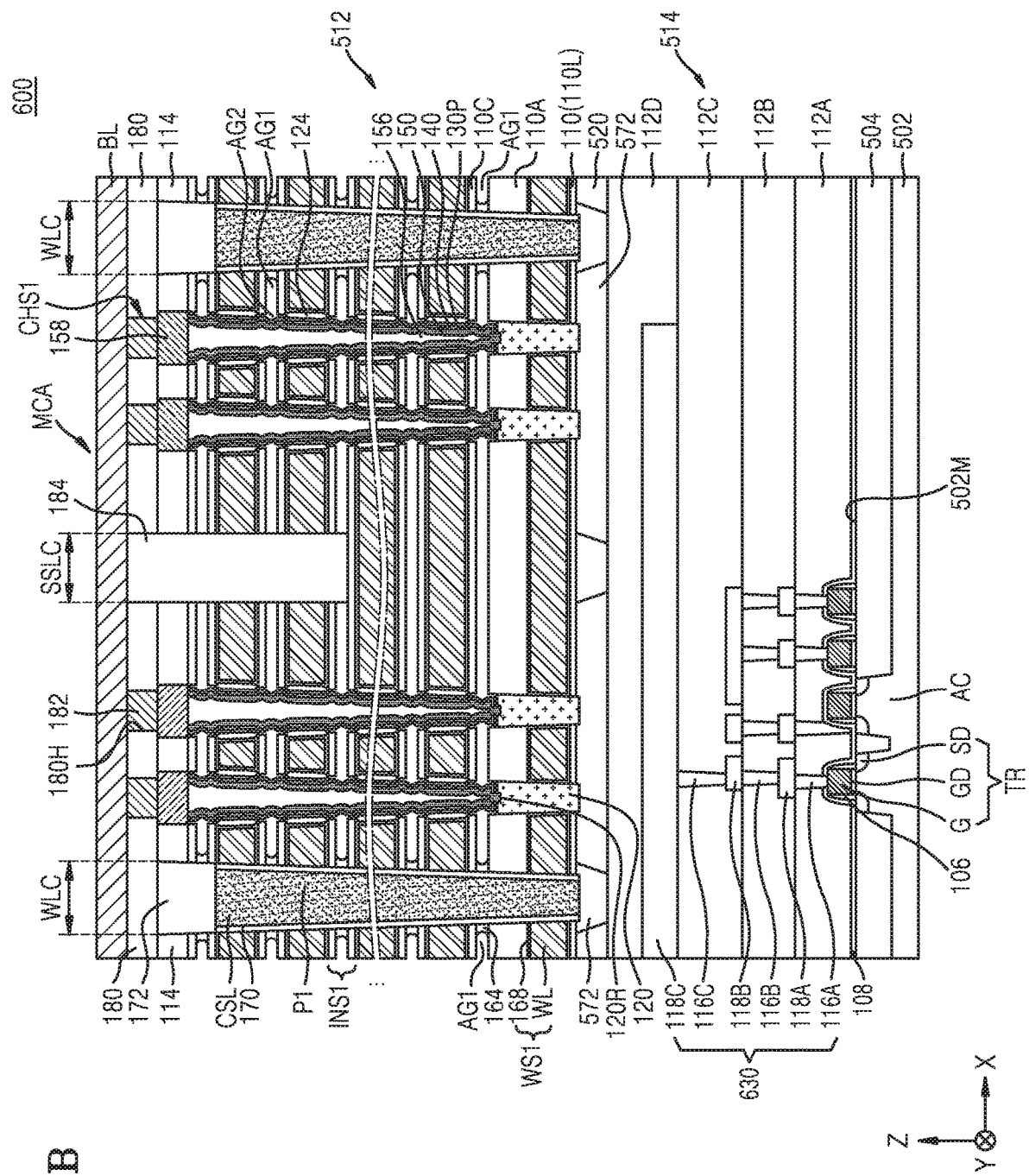
FIG. 19B is a cross-sectional view of the integrated circuit device of FIG. 19A.

FIG. 19A is a perspective view of an integrated circuit device according to other embodiments. FIG. 19B is a cross-sectional view of the integrated circuit device of FIG. 19A. The integrated circuit device of FIGS. 19A and 19B may have the same plan layout as that of the integrated circuit device 500 of FIG. 18. In FIGS. 19A and 19B, the same elements as those of FIGS. 1 through 4 are denoted by the same reference numerals, and a detailed explanation thereof will not be given.

Referring to FIGS. 19A and 19B, an integrated circuit device 600 includes the first peripheral circuit region 514 formed at a first level on a substrate 502, and the memory cell array region 512 formed at a second level higher than the first level on the substrate 502. The term "level" used herein denotes a height in the vertical direction (e.g., the Z-direction of FIGS. 19A and 19B) from the substrate 502. The first level is closer to the substrate 502 than the second level.

In some embodiments, the substrate 502 may have a main surface 502M extending in the X-direction and the Y-direction. A detailed structure of the substrate 502 is substantially the same as that of the substrate 102 described with reference to FIG. 3.

The active region AC for peripheral circuits may be defined by a device isolation film 504 on the substrate 502. A plurality of transistors TR constituting the first peripheral circuit region 514 may be formed on the active region AC of the substrate 502. Each of the plurality of transistors TR may include a gate G, a gate dielectric film GD, and source/drain regions SD. Both side walls of the gate G may be covered by an insulating spacer 106, and an etch stop film 108 may be formed on the gate G and the insulating spacer 106. The etch stop film 108 may include an insulating material such as silicon nitride or silicon oxynitride.

A plurality of interlayer insulating films 112A, 112B, 112C, and 112D may be sequentially stacked on the etch stop film 108. Each of the plurality of interlayer insulating films 112A, 112B, 112C, and 112D may include silicon oxide, silicon nitride, or silicon oxynitride.

The first peripheral circuit region 514 includes multi-layer wiring structures 630 electrically connected to the plurality of transistors TR. The multi-layer wiring structures 630 may be insulated from one another by the plurality of interlayer insulating films 112A, 112B, 112C, and 112D.

Each of the multi-layer wiring structures 630 may include a first contact 116A, a first wiring layer 118A, a second contact 116B, a second wiring layer 118B, a third contact 116C, and a third wiring layer 118C that are sequentially stacked on the substrate 502 and are electrically connected to one another. In some embodiments, each of the first wiring layer 118A, the second wiring layer 118B, and the third wiring layer 118C may be formed of a metal, a conductive metal nitride, a metal silicide, or a combination thereof. For example, each of the first wiring layer 118A, the second wiring layer 118B, and the third wiring layer 118C may include a conductive material such as tungsten, molybdenum, titanium, cobalt, tantalum, nickel, tungsten silicide, titanium silicide, cobalt silicide, tantalum silicide, or nickel silicide.

Although the multi-layer wiring structure 630 has a three-layer wiring structure including the first wiring layer 118A, the second wiring layer 118B, and the third wiring layer 118C in FIGS. 19A and 19B, the inventive concept is not limited thereto. For example, the multi-layer wiring structure 630 may have a two-layer wiring structure, or a four or more-layer wiring structure according to a layout of the first peripheral circuit region 514 and a type and an arrangement of the gate G.

A semiconductor layer 520 covering the plurality of interlayer insulating films 112A, 112B, 112C, and 112D is formed on the first peripheral circuit region 514. The memory cell array region 512 is formed on the semiconductor layer 520. The memory cell array region 512 has substantially the same structure as that of the memory cell array region MCA of the integrated circuit device 100 described with reference to FIGS. 1 through 4.

The semiconductor layer 520 may be formed of Si, Ge, or a combination thereof. The semiconductor layer 520 may be formed of a semiconductor doped with impurities or a semiconductor not doped with impurities. The semiconductor layer 520 may have a single-crystalline structure, an amorphous structure, or a polycrystalline structure.

A plurality of common source regions 572 may be formed in the semiconductor layer 520. A detailed structure of the plurality of common source regions 572 is substantially similar to that of the common source region 160 described with reference to of FIG. 3.

The plurality of common source regions 572 may be formed by doping impurities into the semiconductor layer 520. As shown in FIGS. 19A and 19B, a depth of each of the plurality of common source regions 572 may be substantially the same as a thickness of the semiconductor layer 520. Accordingly, bottom surfaces of the plurality of common source regions 572 may contact an uppermost interlayer insulating film from among the plurality of interlayer insulating films 112A, 112B, 112C, and 112D of the first peripheral circuit region 514.

In the integrated circuit device 600, the memory cell array region 512 and the first peripheral circuit region 514 may be electrically connected to each other through at least one connection plug (not shown) that extends in the vertical direction (e.g., the Z-direction). The at least one connection plug may be formed by passing through the semiconductor layer 520 and at least parts of the plurality of interlayer insulating films 112A, 112B, 112C, and 112D of the first peripheral circuit region 514. Wiring structures formed in the memory cell array region 512 and wiring structures formed in the first peripheral circuit region 514 may be electrically connected to each other by the at least one connection plug.

The integrated circuit device 600 of FIGS. 19A and 19B has a multi-layer device structure in which a first-level semiconductor device and a second-level semiconductor device having different functions are stacked to vertically overlap at different levels. Accordingly, in the memory cell array region 512, the number of layers of a multi-layer wiring structure formed over the plurality of common source lines CSL and the plurality of channel structures CHS1 may be reduced. Accordingly, the density of wiring patterns of the multi-layer wiring structure in the memory cell array region 512 may be prevented from being excessively increased, and a process of manufacturing the integrated circuit device 600 may be simplified. Also, the number of metal wiring layers stacked in the multi-layer wiring structure may be reduced, and thus physical stress caused by metal wirings may be reduced and warpage of the substrate 502 may be avoided.

Figure 20:
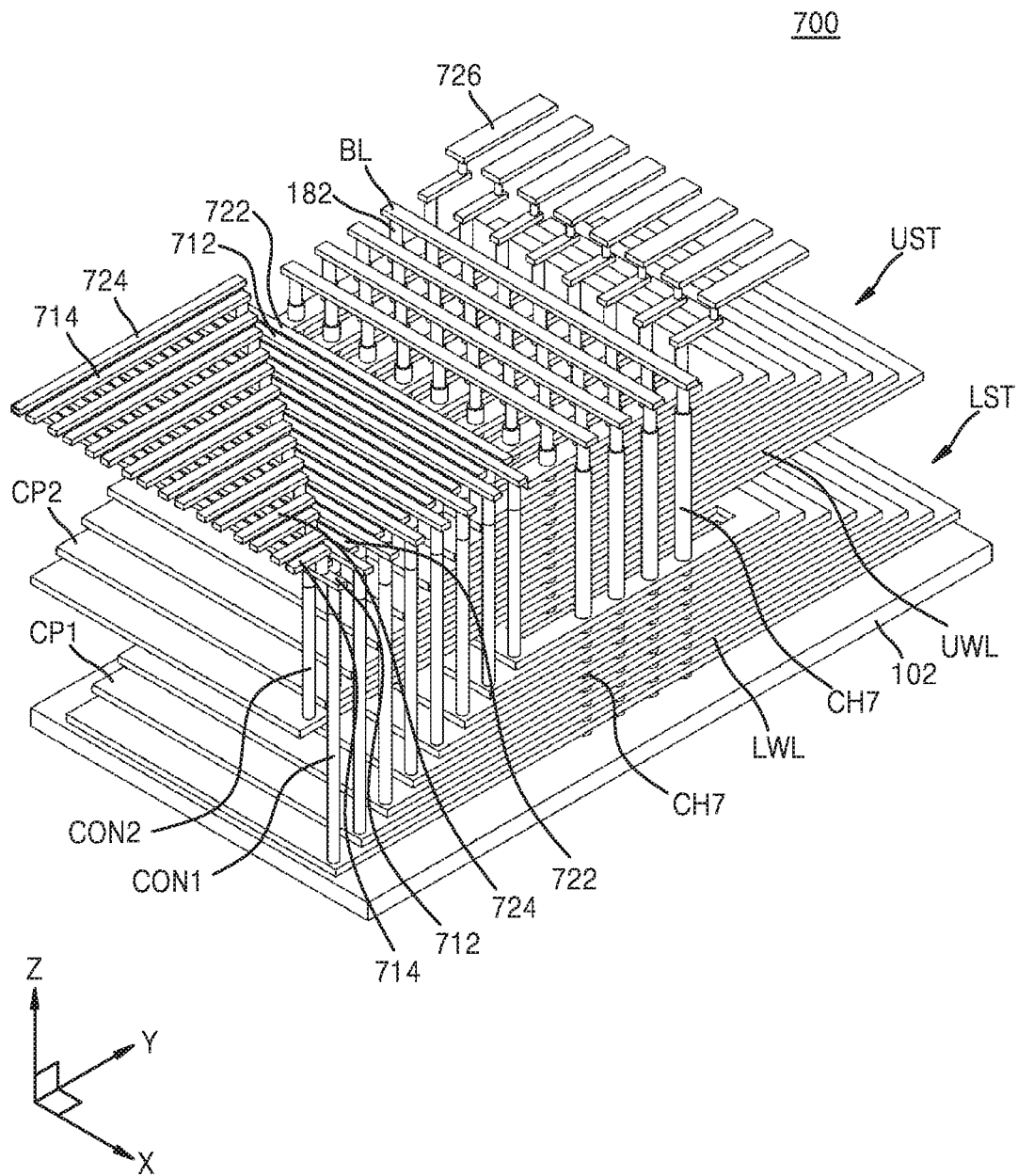
FIG. 20 is a perspective view of an integrated circuit device according to an integrated circuit device according to embodiments.

FIG. 20 is a perspective view of an integrated circuit device according to embodiments. In FIG. 20, the same elements as those in FIGS. 1 through 19B are denoted by the same reference numerals, and a detailed explanation thereof will not be given.

Referring to FIG. 20, an integrated circuit device 700 includes the substrate 102, a lower stack LST including a plurality of lower word lines LWL stacked on the substrate 102 to vertically overlap one another, and an upper stack UST including a plurality of upper word lines UWL stacked on the lower stack LST to vertically overlap one another.

A plurality of channel structures CH7 may extend on the substrate 102 to vertically pass through the lower stack LST and the upper stack UST. The plurality of channel structures CH7 may be connected to the plurality of bit lines BL through the plurality of bit line contact pads 182. Each of the lower stack LST and the upper stack UST may include one stack structure selected from among the stack structures ST1, ST2, ST3, and ST4 of FIGS. 3 through 10. Each of the plurality of channel structures CH7 may include one channel structure selected from among the channel structures CHS1 and CHS3 of FIGS. 3 through 10.

A width of each of the plurality of lower word lines LWL and the plurality of upper word lines UWL in the Y-direction may decrease away from the substrate 102. Accordingly, each of the lower stack LST and the upper stack UST may have a pyramid shape. Edge portions of the plurality of lower word lines LWL in the Y-direction may be used as a lower contact pad CP1, and edge portions of the plurality of upper word lines UWL in the Y-direction may be used as an upper contact pad CP2. Although both edges portions of each of the lower stack LST and the upper stack UST in the Y-direction have a stepped structure in FIG. 20, the inventive concept is not limited thereto and a direction in which the stepped structure is formed may be selected in various ways.

The plurality of lower word lines LWL may be electrically connected to a plurality of lower contacts CON1 contacting the lower contact pad CP1, and a word line driving circuit (not shown) through a plurality of wirings 712 and 714 connected to the plurality of lower contacts CON1. The plurality of upper word lines UWL may be electrically connected to a plurality of upper contacts CON2 contacting the upper contact pad CP2, and the word line driving circuit through a plurality of wirings 722 and 724 connected to the plurality of upper contacts CON2. At least one upper word line UWL used as the string selection line SSL from among the plurality of upper word lines UWL may be connected to a selection line driving circuit (not shown) through a plurality of wirings 726.

Since the integrated circuit device 700 includes the lower stack LST and the upper stack UST that vertically overlap each other, a degree of integration may be increased.

Since an integrated circuit device according to the embodiments described above includes a plurality of charge trap patterns that are vertically spaced apart from one another with a local insulating region therebetween in a channel hole and a channel film having a plurality of curved portions facing a plurality of insulating structures, the integrated circuit device may be easily highly scaled and may provide a structure for improving reliability by suppressing cell interference due to charge diffusion between adjacent cells even when an interval between vertically adjacent cells is relatively small in a vertical memory device.

While the inventive concept has been particularly shown and described with reference to embodiments thereof, it will be understood by one of ordinary skill in the art that various changes in form and details may be made therein without departing from the spirit and scope of the following claims.

What is claimed is:

1. An integrated circuit device comprising:
    a plurality of word line structures, extending in a horizontal direction parallel to a main surface of a substrate, and overlapping one another in a vertical direction perpendicular to the main surface of the substrate, wherein the plurality of work line structures comprises a first word line structure;
    a plurality of insulating structures located between the plurality of word line structures and extending in the horizontal direction;
    a channel film extending in the vertical direction in a channel hole that passes through the plurality of word line structures and the plurality of insulating structures; and
    a plurality of charge trap patterns located in the channel hole between the plurality of word line structures and the channel film, and spaced apart from one another in the vertical direction with a local insulating region therebetween,
    wherein the plurality of charge trap patterns comprises a first charge trap pattern adjacent to the first word line structure, and a length of the first charge trap pattern is greater than a length of the first word line structure in the vertical direction.

2. The integrated circuit device of claim 1, wherein the channel film comprises a plurality of first curved portions facing the plurality of insulating structures.

3. The integrated circuit device of claim 2, wherein each of the plurality of insulating structures comprises a first air-gap portion,
    wherein each of the plurality of first curved portions of the channel film comprises a first concave outer circumferential portion facing the first air-gap portion and a first convex inner circumferential portion protruding toward a center of the channel hole.

4. The integrated circuit device of claim 3, further comprising:
    a second air-gap portion located in the channel hole and communicating with the first air-gap portion, and
    a plurality of blocking dielectric patterns located between the plurality of word line structures and the plurality of charge trap patterns and spaced apart from one another in the vertical direction with the second air-gap portion therebetween,
    wherein a first width in the horizontal direction of each of both end portions in the vertical direction of the plurality of blocking dielectric patterns is less than a second width in the horizontal direction of a central portion between both end portions.

5. The integrated circuit device of claim 2, wherein the channel film further comprises a plurality of second curved portions facing the plurality of word line structures.

6. The integrated circuit device of claim 5, wherein each of the plurality of second curved portions of the channel film comprises a second concave outer circumferential portion facing the plurality of word line structures and a second convex inner circumferential portion protruding toward a center of the channel hole.

7. The integrated circuit device of claim 2, further comprising a tunneling dielectric film located in the channel hole to be between the plurality of charge trap patterns and the channel film and extending in the vertical direction along an outer circumferential surface of the channel film,
    wherein the tunneling dielectric film comprises a plurality of curved portions contacting the plurality of first curved portions.

8. The integrated circuit device of claim 1, wherein each of the plurality of word line structures comprises a bottom protrusion and a top protrusion each locally protruding toward the channel film.

9. The integrated circuit device of claim 1, wherein the local insulating region comprises an air-gap.

10. The integrated circuit device of claim 2, wherein each of the plurality of first curved portions of the channel film comprises a first convex outer circumferential portion facing the plurality of insulating structures and a first concave inner circumferential portion extending toward a center of the channel hole.

11. The integrated circuit device of claim 1, wherein each of the plurality of charge trap patterns comprises a first portion extending parallel to the channel film and a second portion integrally connected to the first portion, curved from the first portion, and extending in the horizontal direction away from the channel film.

12. The integrated circuit device of claim 11, further comprising a tunneling dielectric film located in the channel hole between the channel film and the plurality of charge trap patterns and extending in the vertical direction along an outer circumferential surface of the channel film,
wherein the tunneling dielectric film comprises a plurality of protrusions each filling a space between two adjacent charge trap patterns among the plurality of charge trap patterns.

13. An integrated circuit device comprising:
a channel film extending in a vertical direction perpendicular to a main surface of a substrate;
a plurality of word line structures located around the channel film, extending in a horizontal direction parallel to the main surface of the substrate, and overlapping one another in the vertical direction, wherein the plurality of word line structures comprises a first word line structure;
a plurality of insulating structures located around the channel film and each comprising an air-gap located between the plurality of word line structures;
a plurality of charge trap patterns located between the plurality of word line structures and the channel film and spaced apart from one another in the vertical direction with the air-gap therebetween, wherein the plurality of charge trap patterns comprises a first charge trap pattern adjacent to the first word line structure, and a length of the first charge trap pattern is greater than a length of the first word line structure in the vertical direction; and
a plurality of blocking dielectric patterns located between the plurality of word line structures and the plurality of charge trap patterns, and spaced apart from one another in the vertical direction with the air-gap therebetween,
wherein the channel film comprises a plurality of first curved portions facing the air-gap.

14. The integrated circuit device of claim 13, wherein the channel film further comprises a plurality of second curved portions facing the plurality of word line structures,
wherein first lengths of the plurality of first curved portions in the vertical direction are less than second lengths of the plurality of second curved portions.

15. The integrated circuit device of claim 13, wherein each of the plurality of word line structures comprises a bottom protrusion and a top protrusion locally protruding toward the channel film, and a nonlinear side wall nonlinearly extending between the bottom protrusion and the top protrusion,
wherein each of the plurality of blocking dielectric patterns has a nonlinear surface contacting the nonlinear side wall and conforming to a contour of the nonlinear side wall.

16. The integrated circuit device of claim 13, further comprising a word line cut region configured to define widths of the plurality of word line structures,
wherein a first height of a first side wall of each of the plurality of word line structures facing the word line cut region is greater than a second height of a second side wall facing the channel film.

17. An integrated circuit device comprising:
a plurality of word line structures and a plurality of insulating structures interleaved with each other and extending in a horizontal direction parallel to a main surface of a substrate, and overlapping one another in a vertical direction, wherein the plurality of word line structures comprises a first word line structure;
a channel hole that passes through the plurality of word line structures and the plurality of insulating structures in the vertical direction; and
a plurality of charge trap patterns located in the channel hole, and spaced apart from one another in the vertical direction with a local insulating region therebetween, wherein the plurality of charge trap patterns comprises a first charge trap pattern adjacent to the first word line structure, and a length of the first charge trap pattern is greater than a length of the first word line structure in the vertical direction.

18. The integrated circuit device of claim 17, further comprising a channel film extending in the vertical direction in the channel hole,
wherein the plurality of charge trap patterns are located in the channel hole between the channel film and the plurality of word line structures.

19. The integrated circuit device of claim 17, wherein each of the plurality of insulating structures comprises a first air-gap portion.

20. The integrated circuit device of claim 19, further comprising:
a second air-gap portion located in the channel hole and communicating with the first air-gap portion, and
a plurality of blocking dielectric patterns located between the plurality of word line structures and the plurality of charge trap patterns and spaced apart from one another in the vertical direction with the second air-gap portion therebetween,
wherein a first width in the horizontal direction of each of both end portions in the vertical direction of the plurality of blocking dielectric patterns is less than a second width in the horizontal direction of a central portion between both end portions.

* * * * *